United States Patent
Watanabe et al.

(10) Patent No.: US 11,445,135 B2
(45) Date of Patent: Sep. 13, 2022

(54) SOLID-STATE IMAGING DEVICE AND METHOD OF CONTROLLING SOLID-STATE IMAGING DEVICE

(71) Applicant: SONY SEMICONDUCTOR SOLUTIONS CORPORATION, Kanagawa (JP)

(72) Inventors: Taiichiro Watanabe, Kanagawa (JP); Tetsuji Yamaguchi, Kanagawa (JP); Yusuke Sato, Kanagawa (JP); Fumihiko Koga, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 270 days.

(21) Appl. No.: 16/640,479

(22) PCT Filed: Aug. 10, 2018

(86) PCT No.: PCT/JP2018/030106
§ 371 (c)(1),
(2) Date: Feb. 20, 2020

(87) PCT Pub. No.: WO2019/044464
PCT Pub. Date: Mar. 7, 2019

(65) Prior Publication Data
US 2020/0221042 A1   Jul. 9, 2020

(30) Foreign Application Priority Data

Aug. 31, 2017 (JP) .............................. JP2017-167852

(51) Int. Cl.
*H04N 5/359* (2011.01)
*H04N 5/369* (2011.01)
(Continued)

(52) U.S. Cl.
CPC ......... *H04N 5/3597* (2013.01); *H01L 27/307* (2013.01)

(58) Field of Classification Search
None
See application file for complete search history.

(56) References Cited

U.S. PATENT DOCUMENTS

2006/0232580 A1   10/2006 Koyama
2007/0262365 A1   11/2007 Saito et al.
(Continued)

FOREIGN PATENT DOCUMENTS

CN   101305261 A   11/2008
CN   102110702 A   6/2011
(Continued)

OTHER PUBLICATIONS

International Search Report and Written Opinion of PCT Application No. PCT/JP2018/030106, dated Oct. 9, 2018, 08 pages of ISRWO.

(Continued)

*Primary Examiner* — Mark T Monk
(74) *Attorney, Agent, or Firm* — Chip Law Group

(57) ABSTRACT

A solid-state imaging device according to an embodiment of the disclosure includes a first electrode, a second electrode, a photoelectric conversion layer, and a voltage applier. The first electrode includes a plurality of electrodes independent from each other. The second electrode is disposed opposite to the first electrode. The photoelectric conversion layer is disposed between the first electrode and the second electrode. The voltage applier applies different voltages to at least one of the first electrode or the second electrode during a charge accumulation period and a charge non-accumulation period.

20 Claims, 42 Drawing Sheets

(51) Int. Cl.
*H04N 5/3745* (2011.01)
*H01L 27/30* (2006.01)

(56) References Cited

U.S. PATENT DOCUMENTS

| | | | |
|---|---|---|---|
| 2010/0097506 A1 | 4/2010 | Hashimoto et al. | |
| 2011/0156104 A1 | 6/2011 | Yamaguchi | |
| 2016/0190211 A1* | 6/2016 | Joei | H01L 27/14634 257/40 |
| 2016/0301882 A1 | 10/2016 | Yamashita et al. | |
| 2017/0163917 A1* | 6/2017 | Yamada | H04N 5/232 |
| 2017/0214875 A1* | 7/2017 | Miyake | H04N 5/374 |

FOREIGN PATENT DOCUMENTS

| | | |
|---|---|---|
| CN | 102196195 A | 9/2011 |
| CN | 106803901 A | 6/2017 |
| JP | 2009-089026 A | 4/2009 |
| JP | 2010-219563 A | 9/2010 |
| JP | 2011-138927 A | 7/2011 |
| JP | 2012-080560 A | 4/2012 |
| JP | 2013-070090 A | 4/2013 |
| JP | 2016-201449 A | 12/2016 |
| JP | 2017-143158 A | 8/2017 |
| KR | 10-2011-0076769 A | 7/2011 |
| WO | 2017/138273 A1 | 8/2017 |
| WO | 2017/141727 A1 | 8/2017 |

OTHER PUBLICATIONS

Wang, et al., "The Research of the CCD Image Sensor in Photoelectric Sensor Technology", China Academic Journal Electronic Publishing House, Jul. 1, 2008, pp. 226-228.

Office Action for CN Patent Application No. 201880053632.0, dated Dec. 2, 2021, 11 pages of English Translation and 09 pages of Office Action.

* cited by examiner

[FIG. 1]
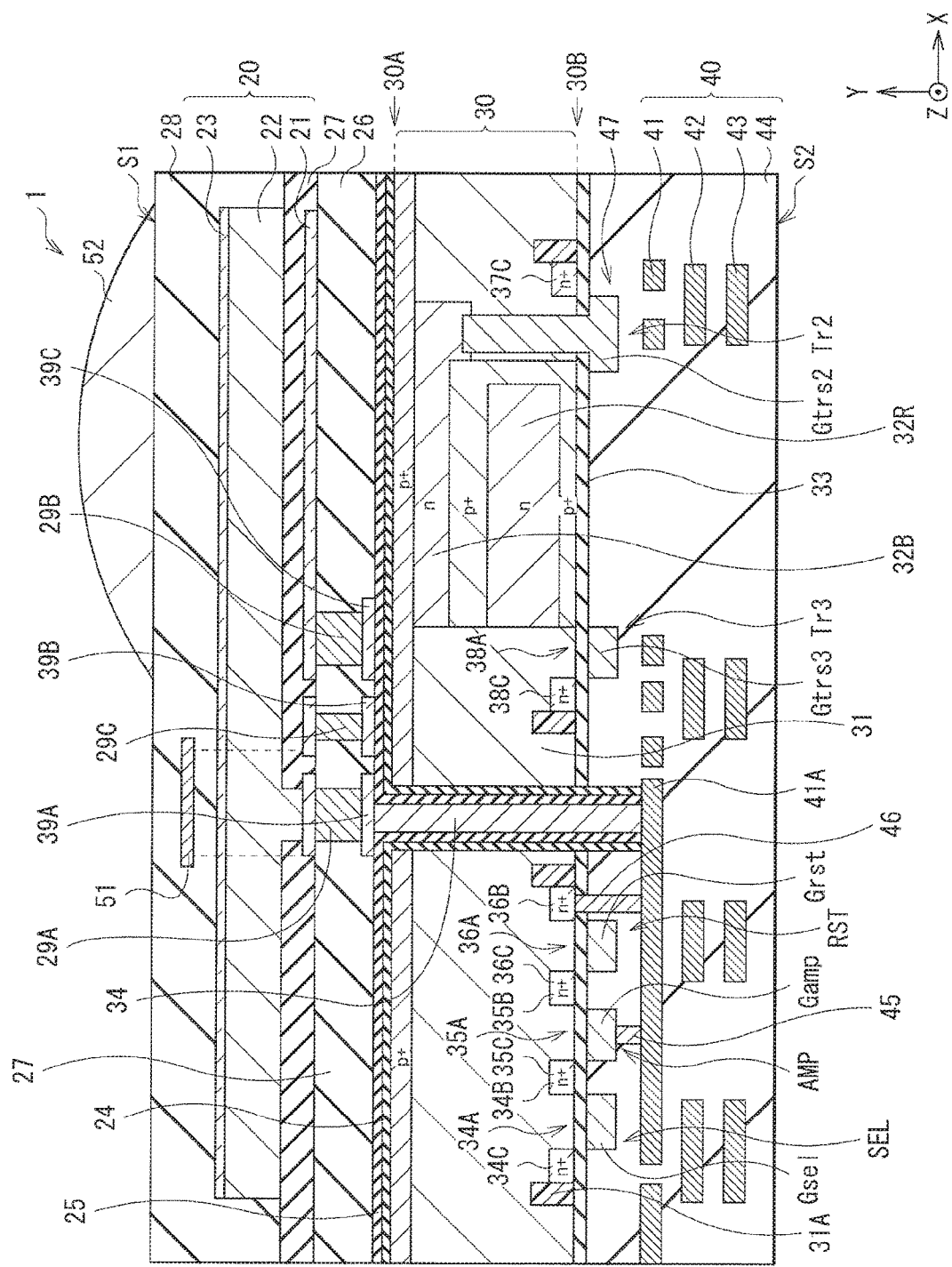

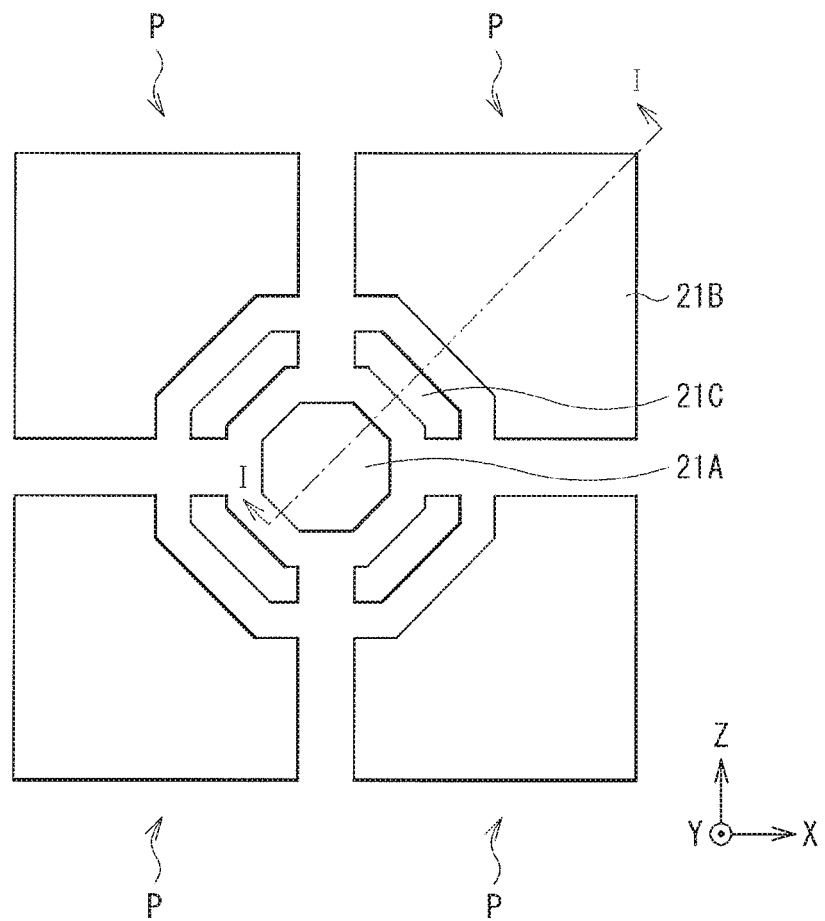
[FIG. 2]

[FIG. 3]
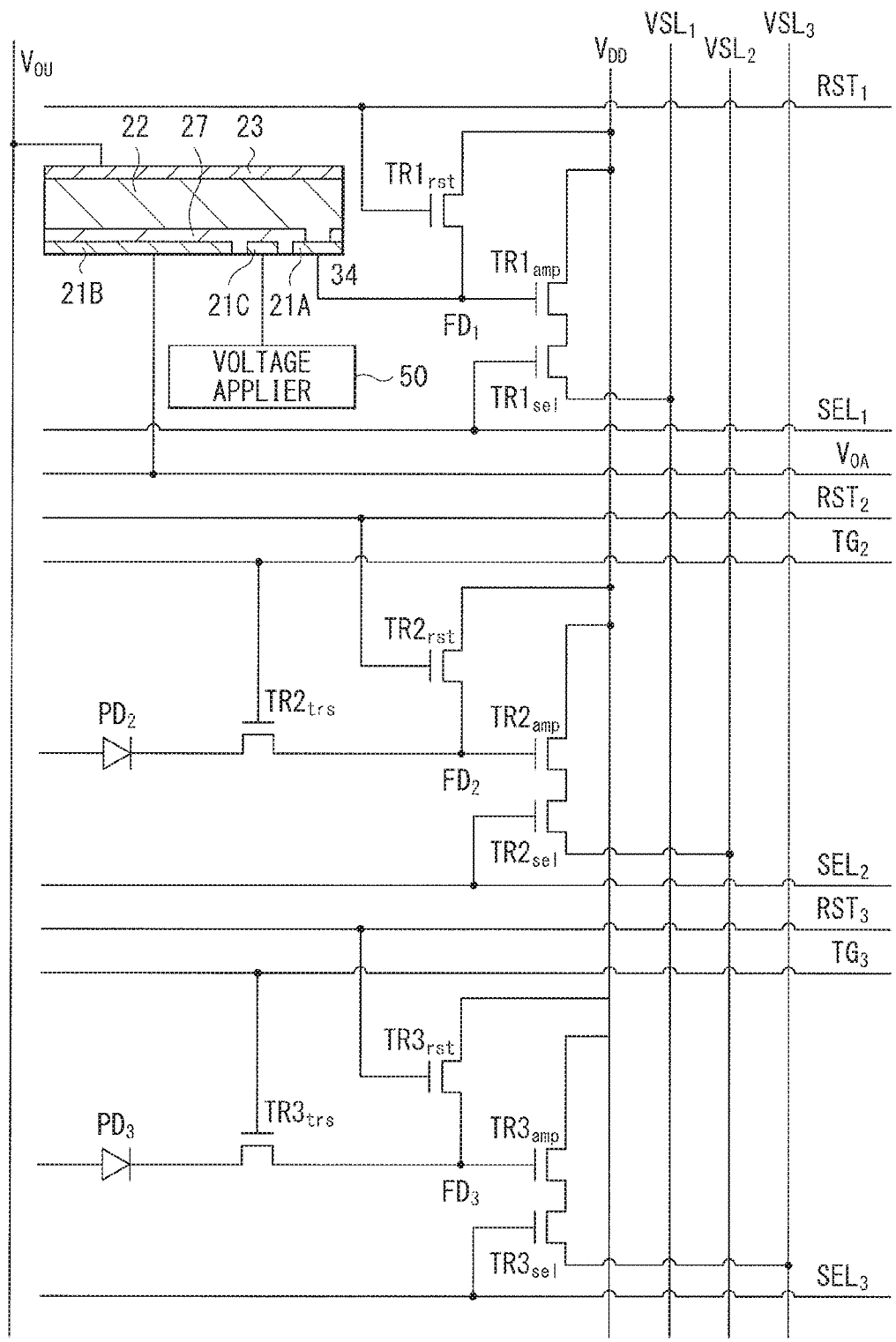

[FIG. 4]
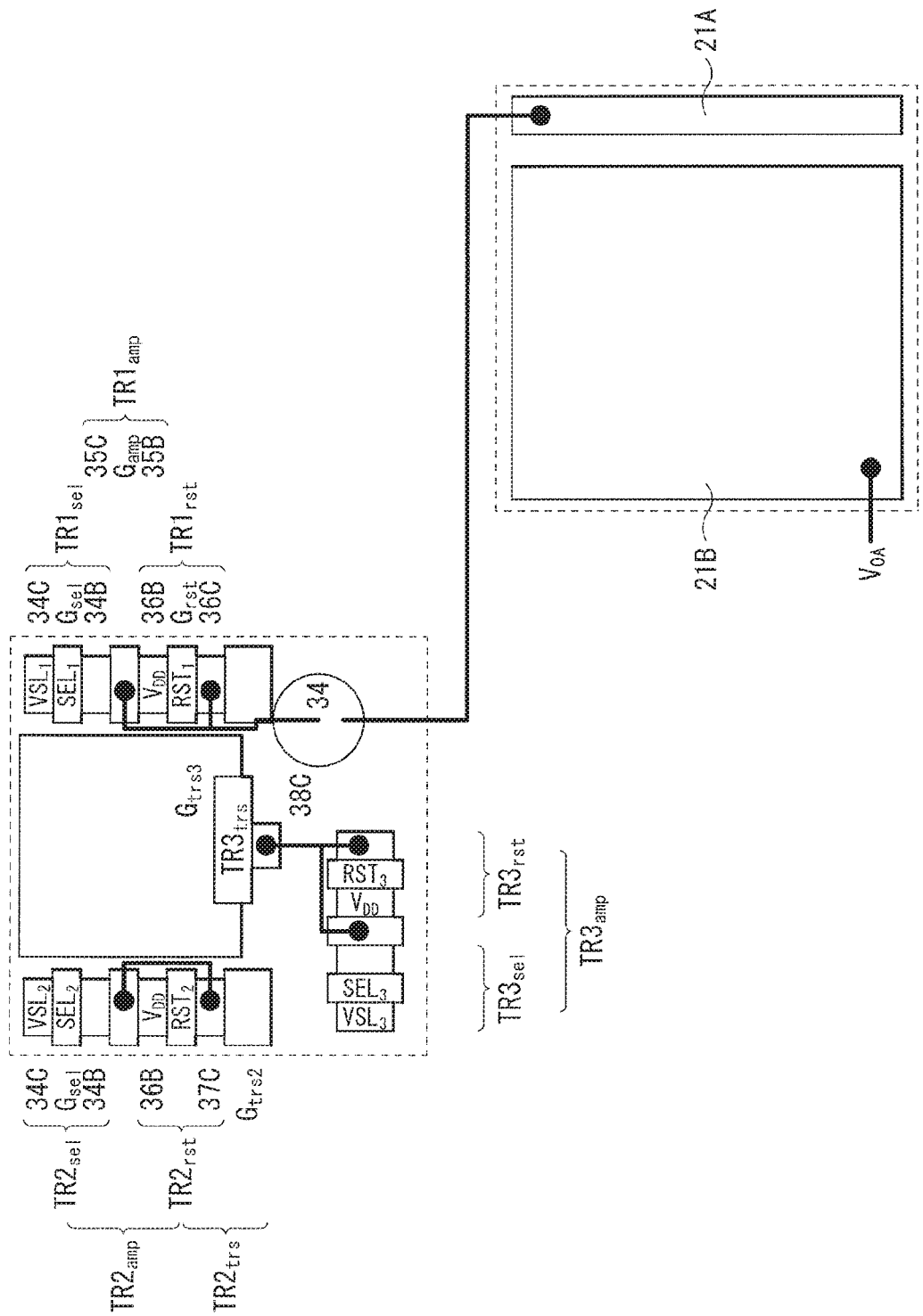

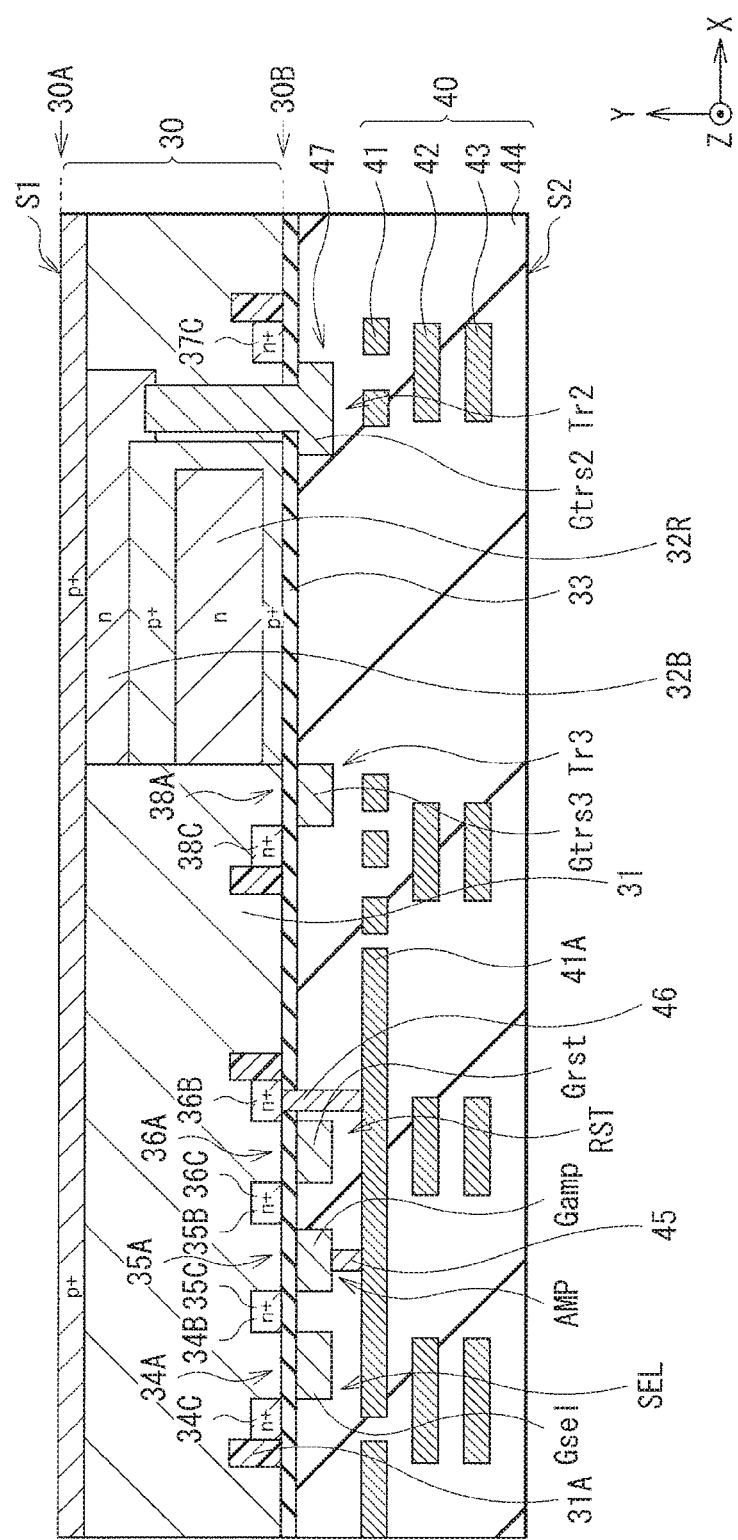
[FIG. 5]

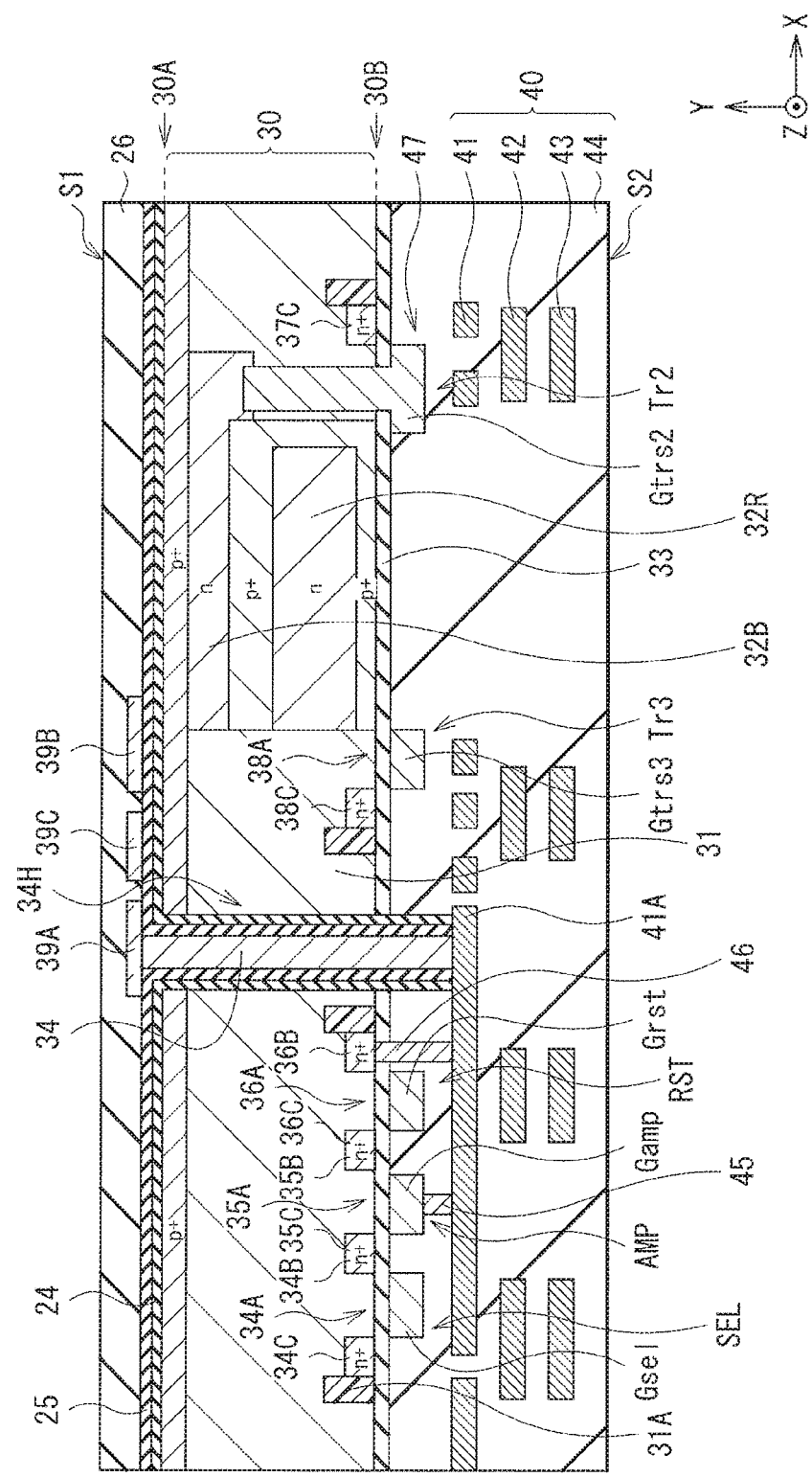
[FIG. 6]

[FIG. 7]
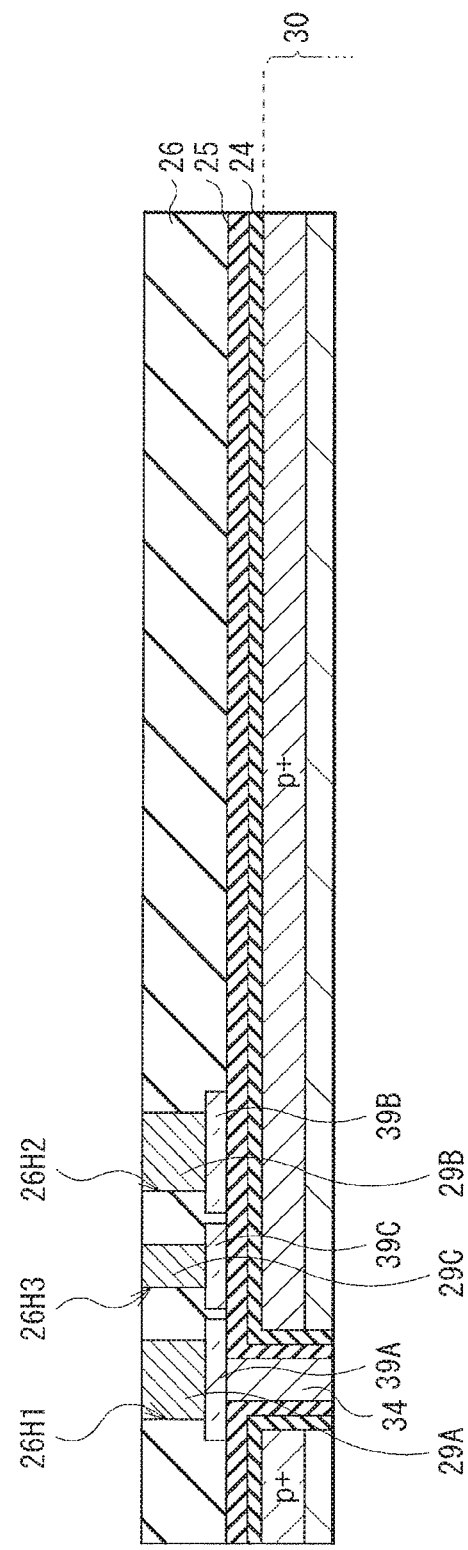

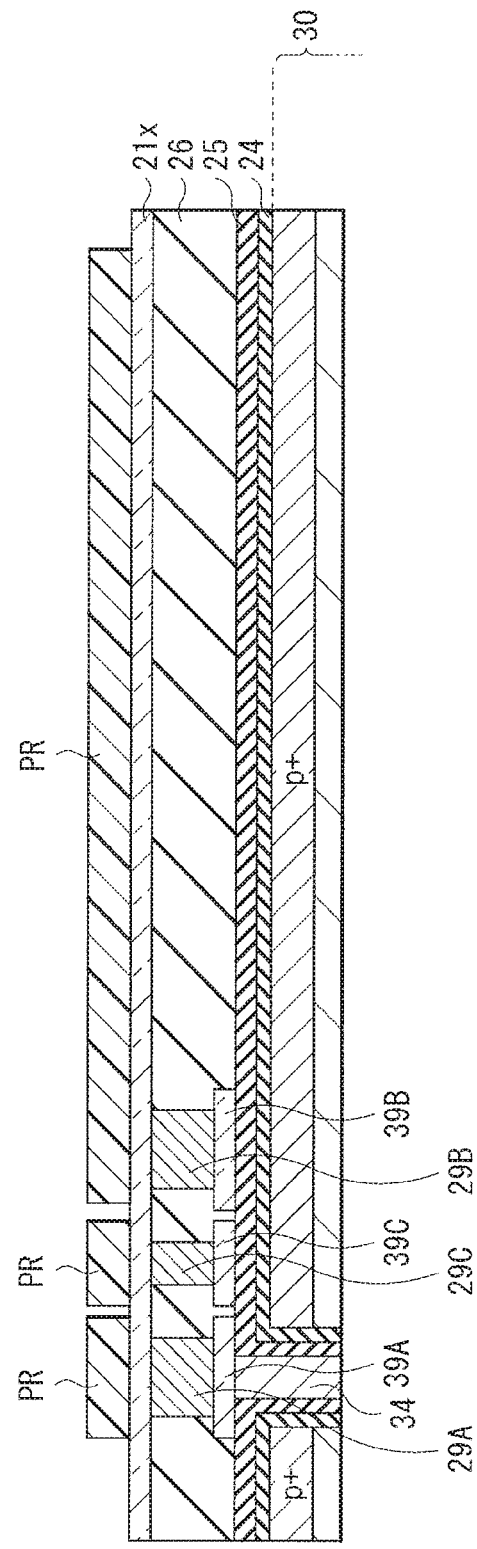
[FIG. 8]

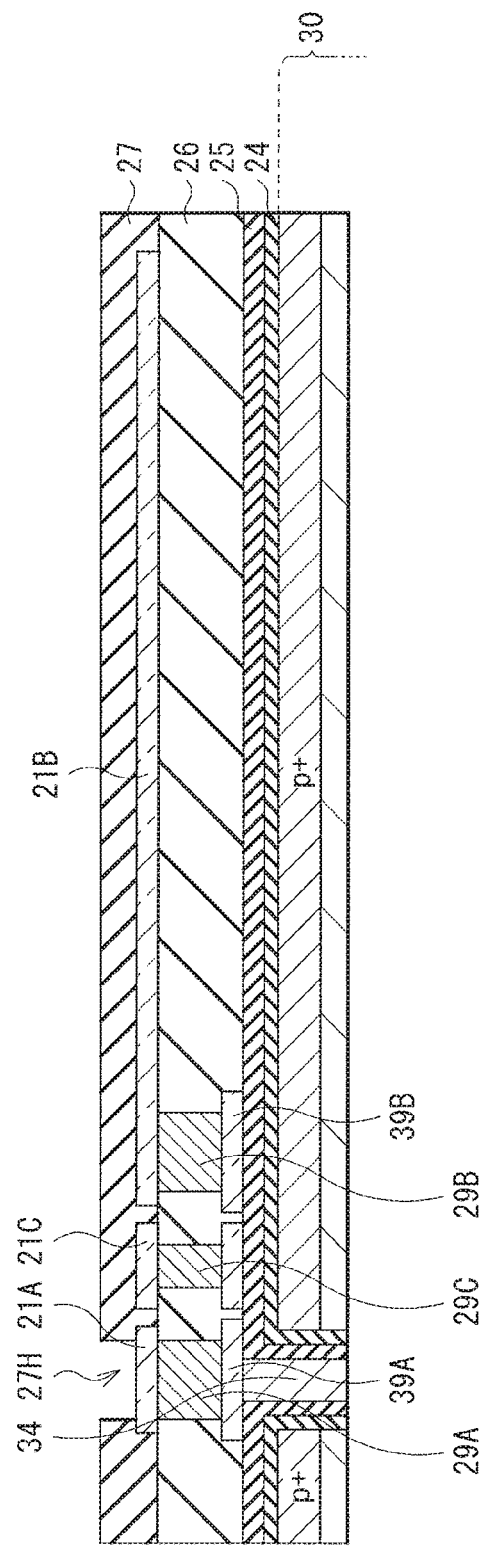
[FIG. 9]

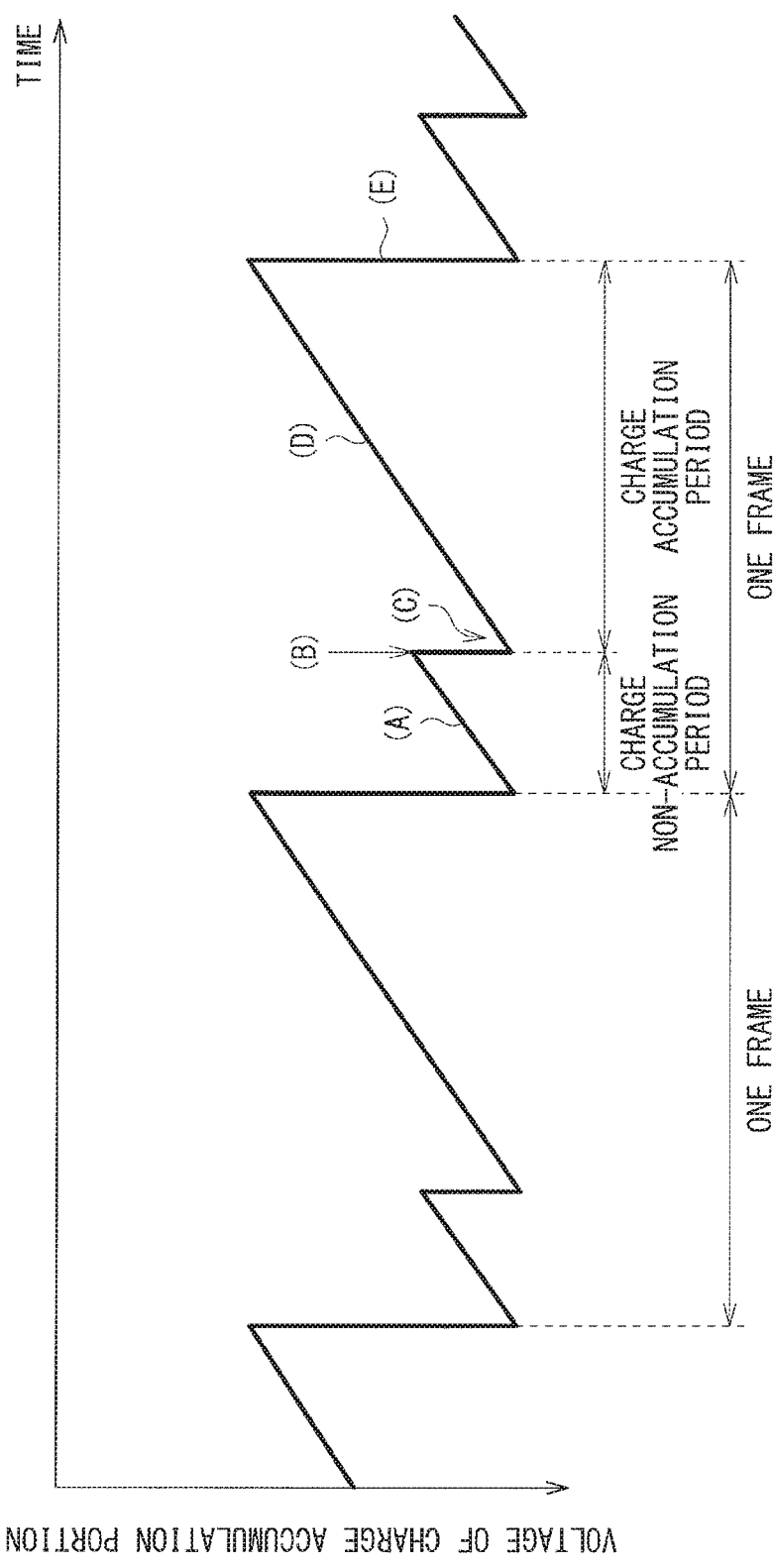
[FIG. 10]

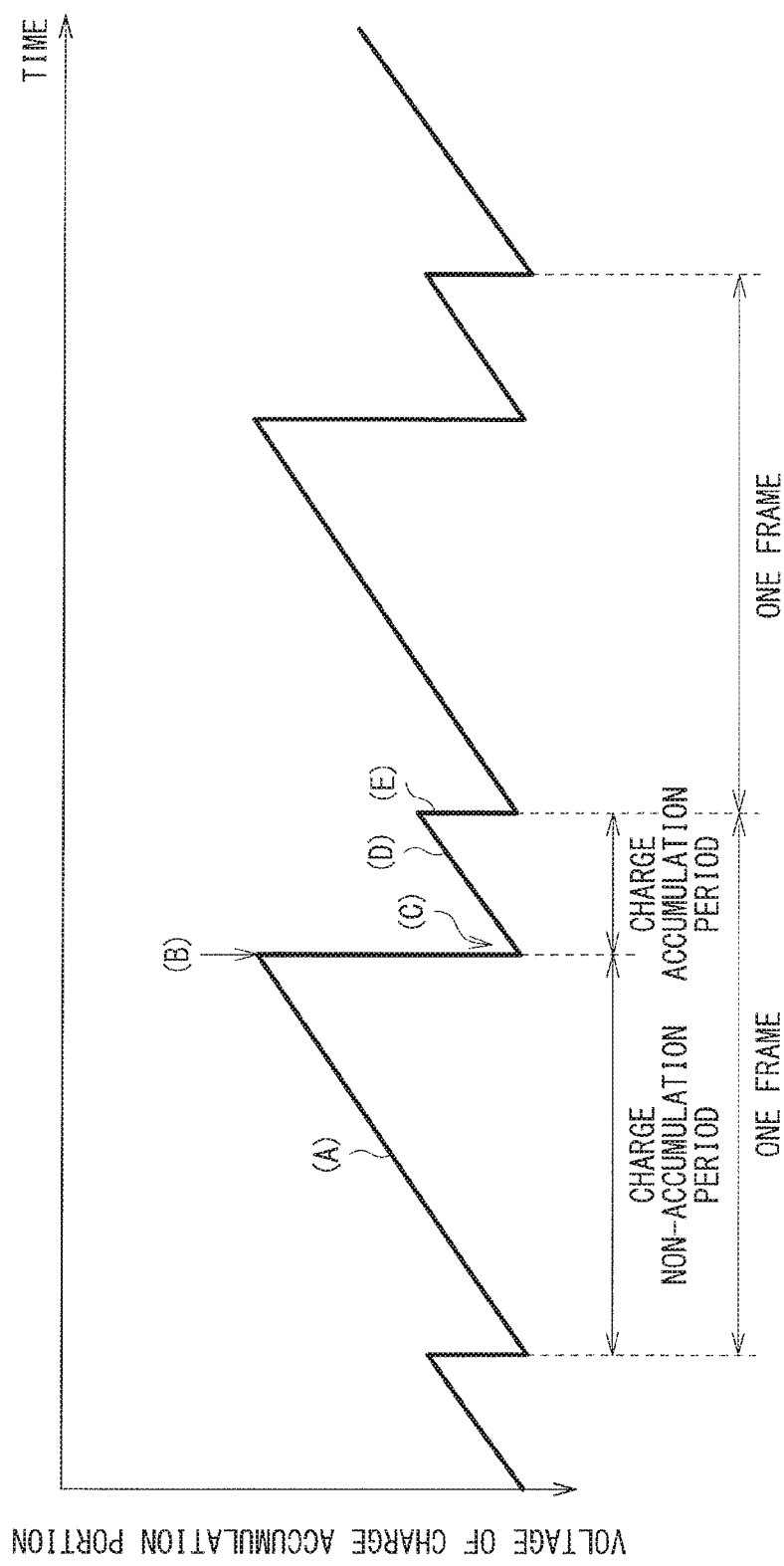
[FIG. 11]

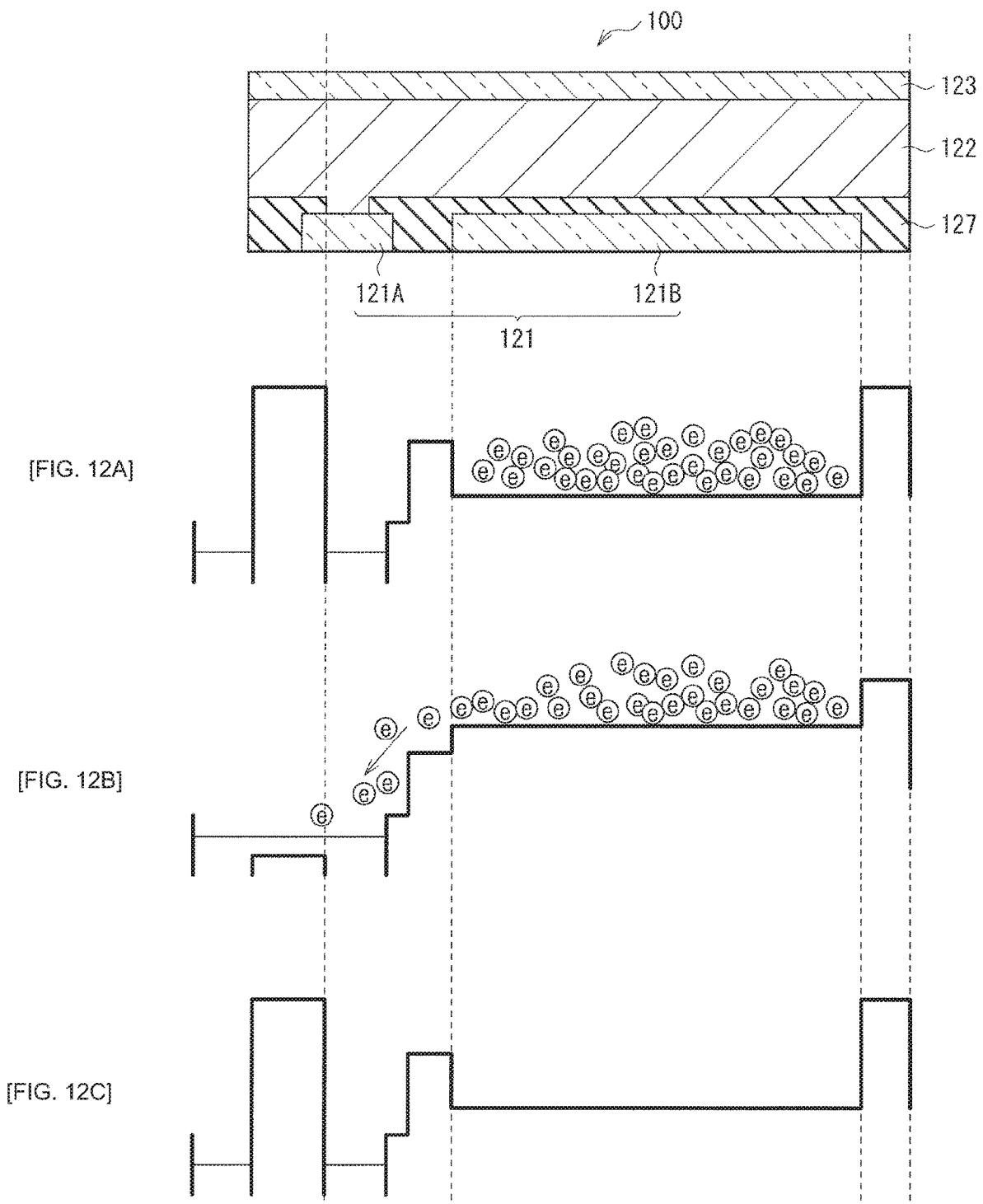

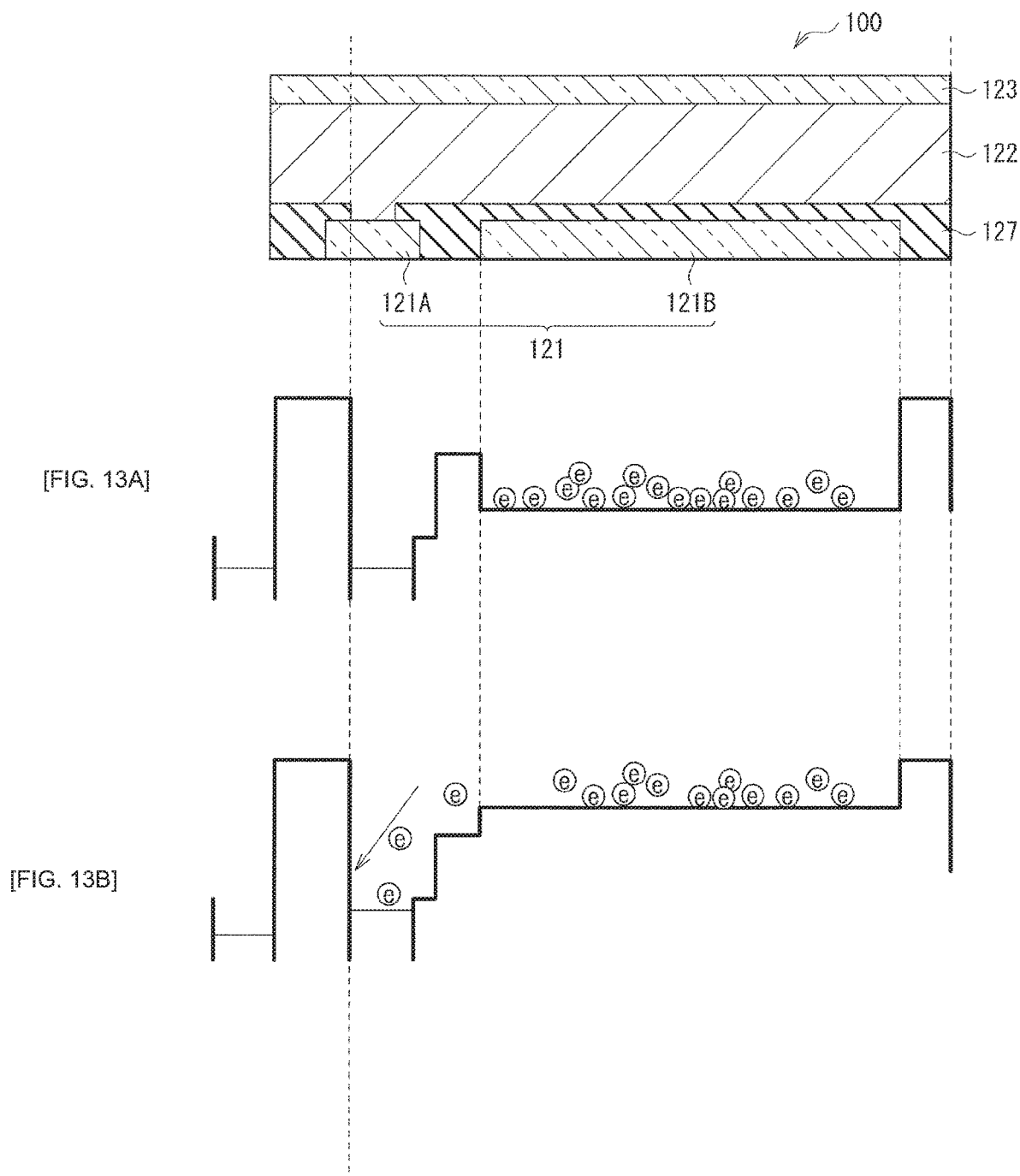

[FIG. 14A]
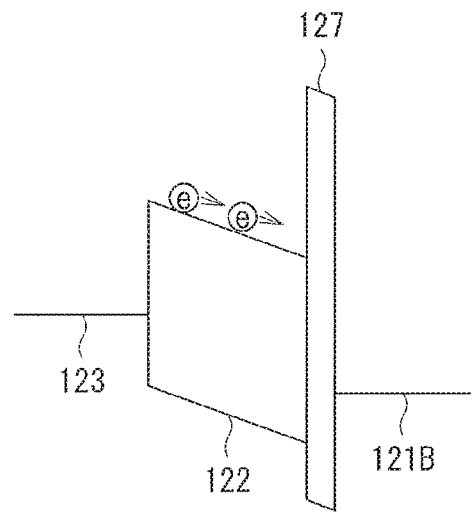
[FIG. 14B]
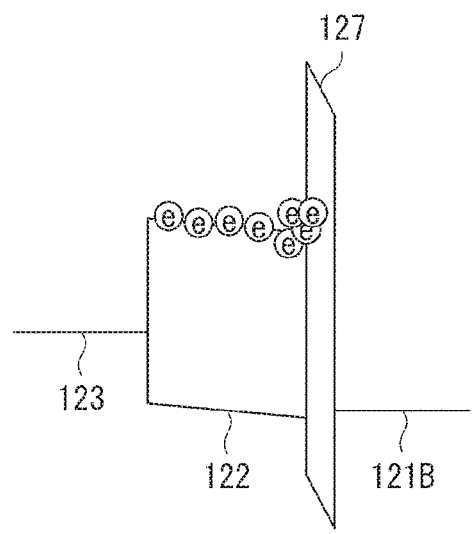

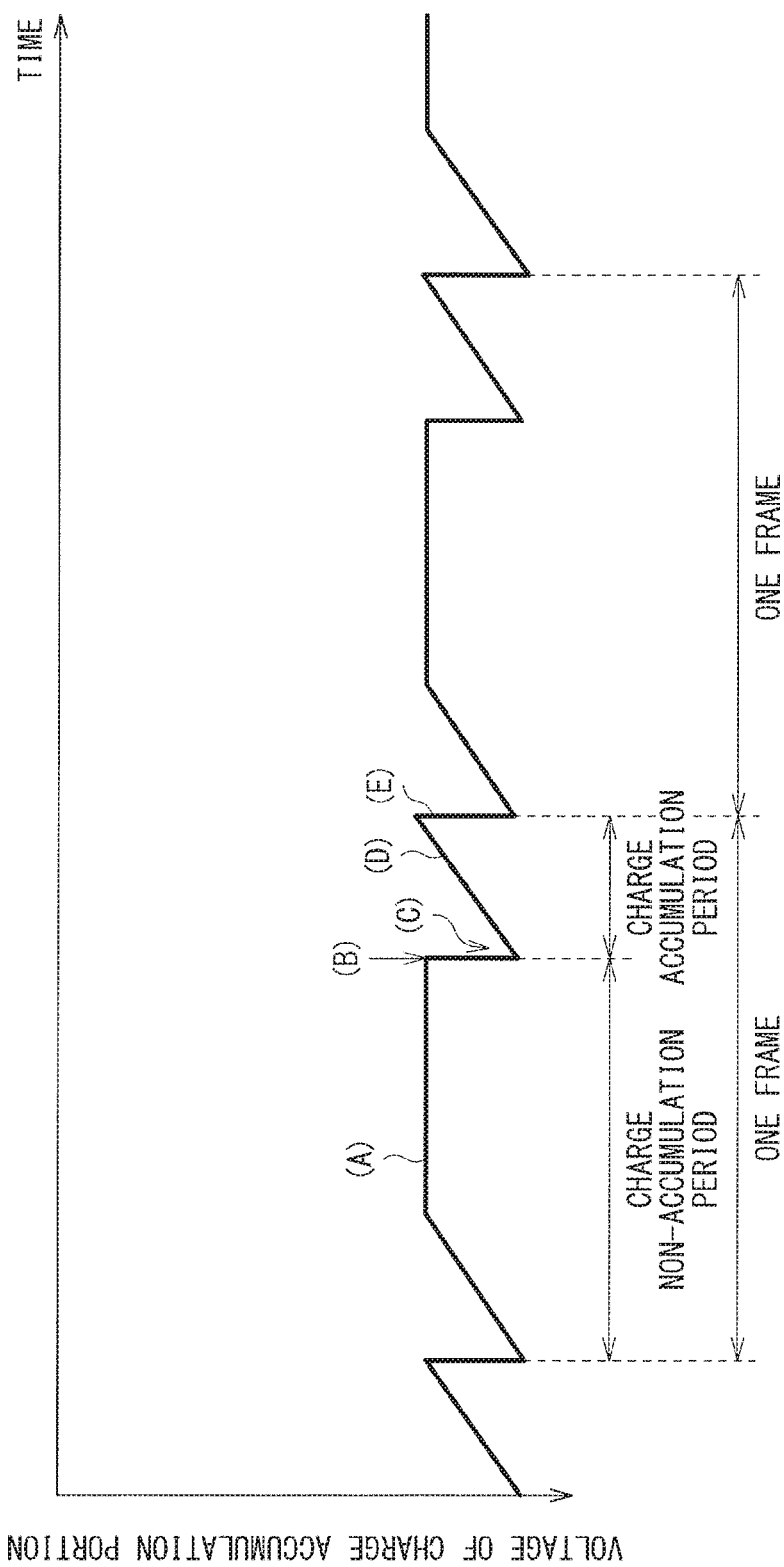
[FIG. 15]

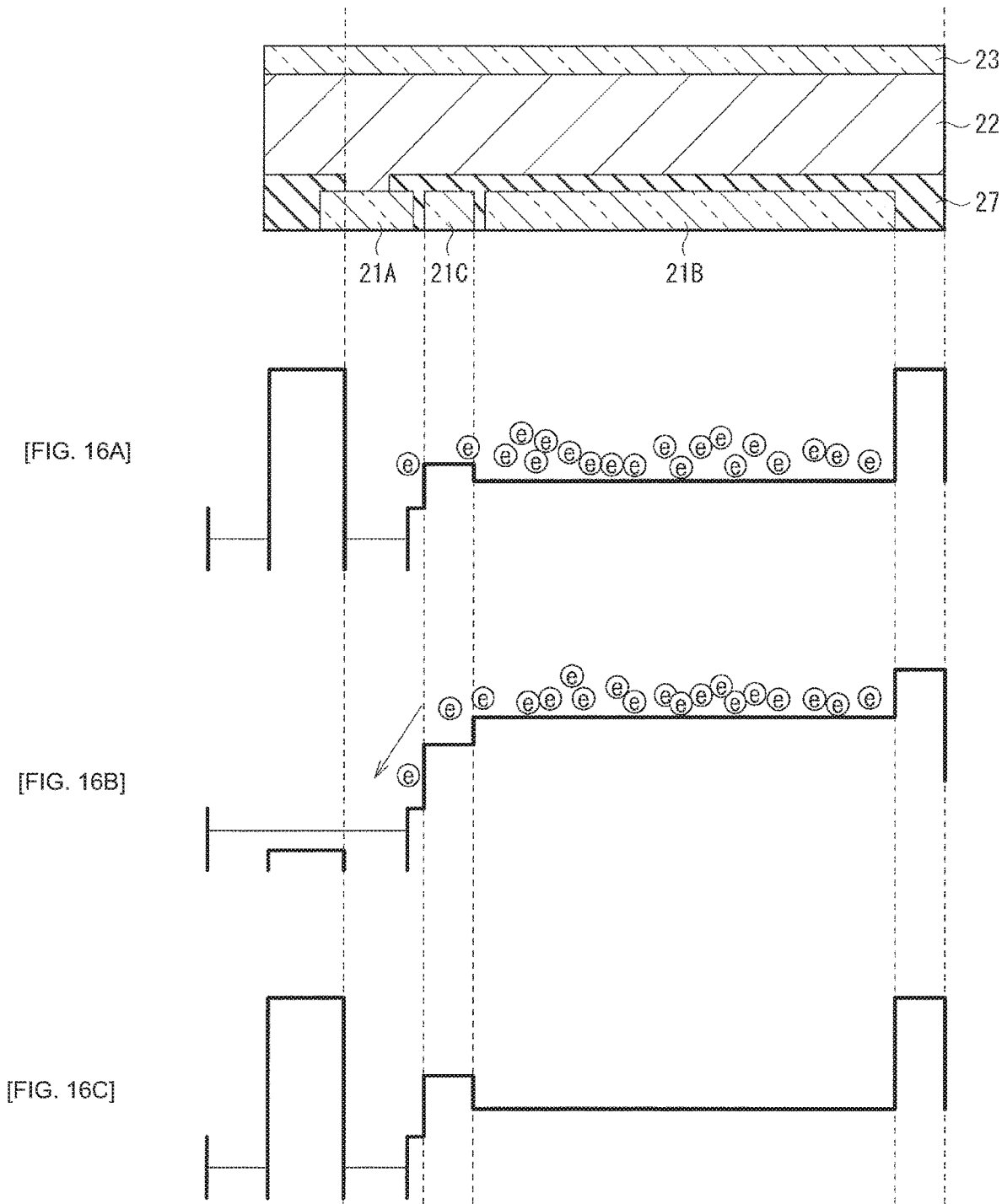

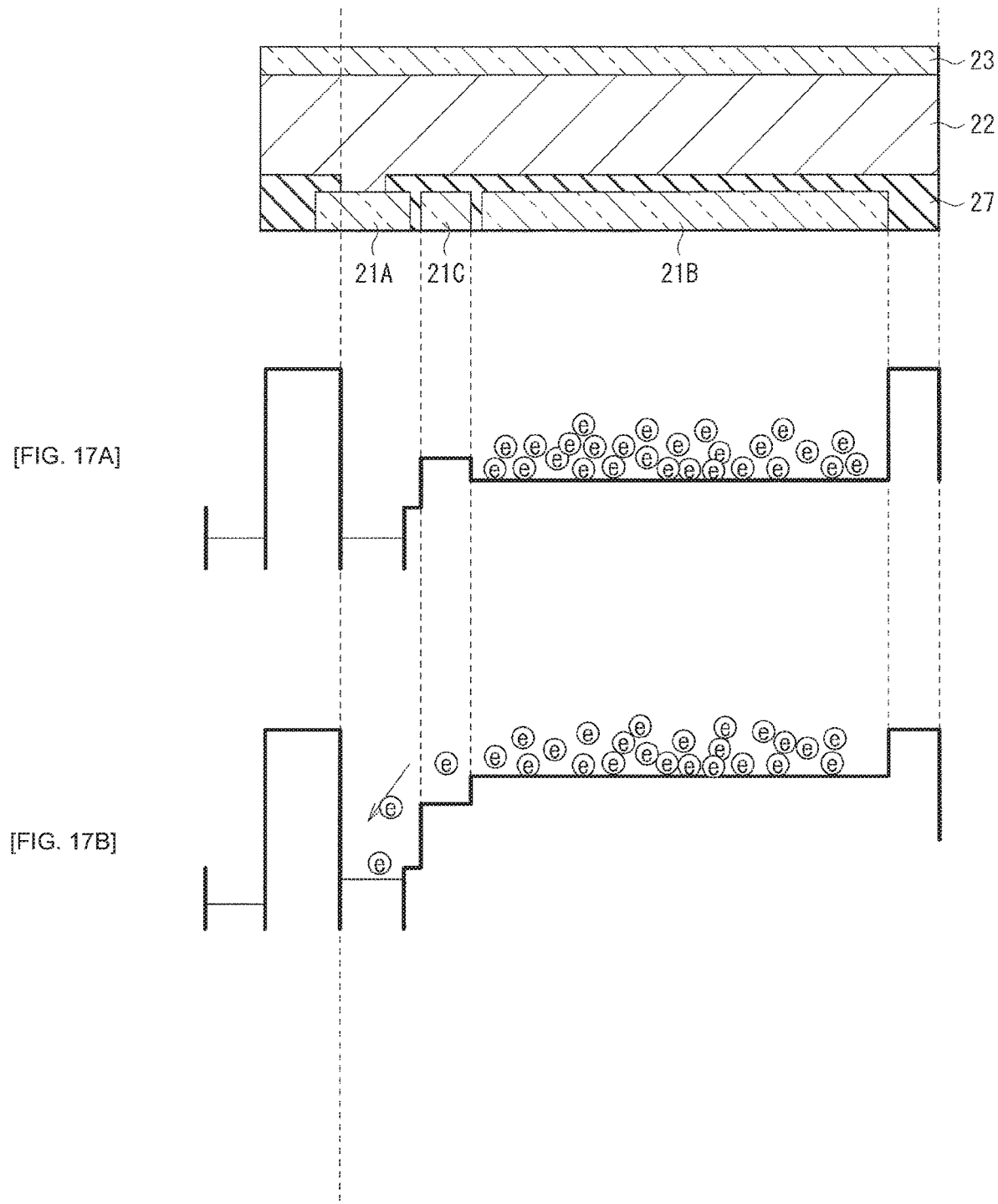

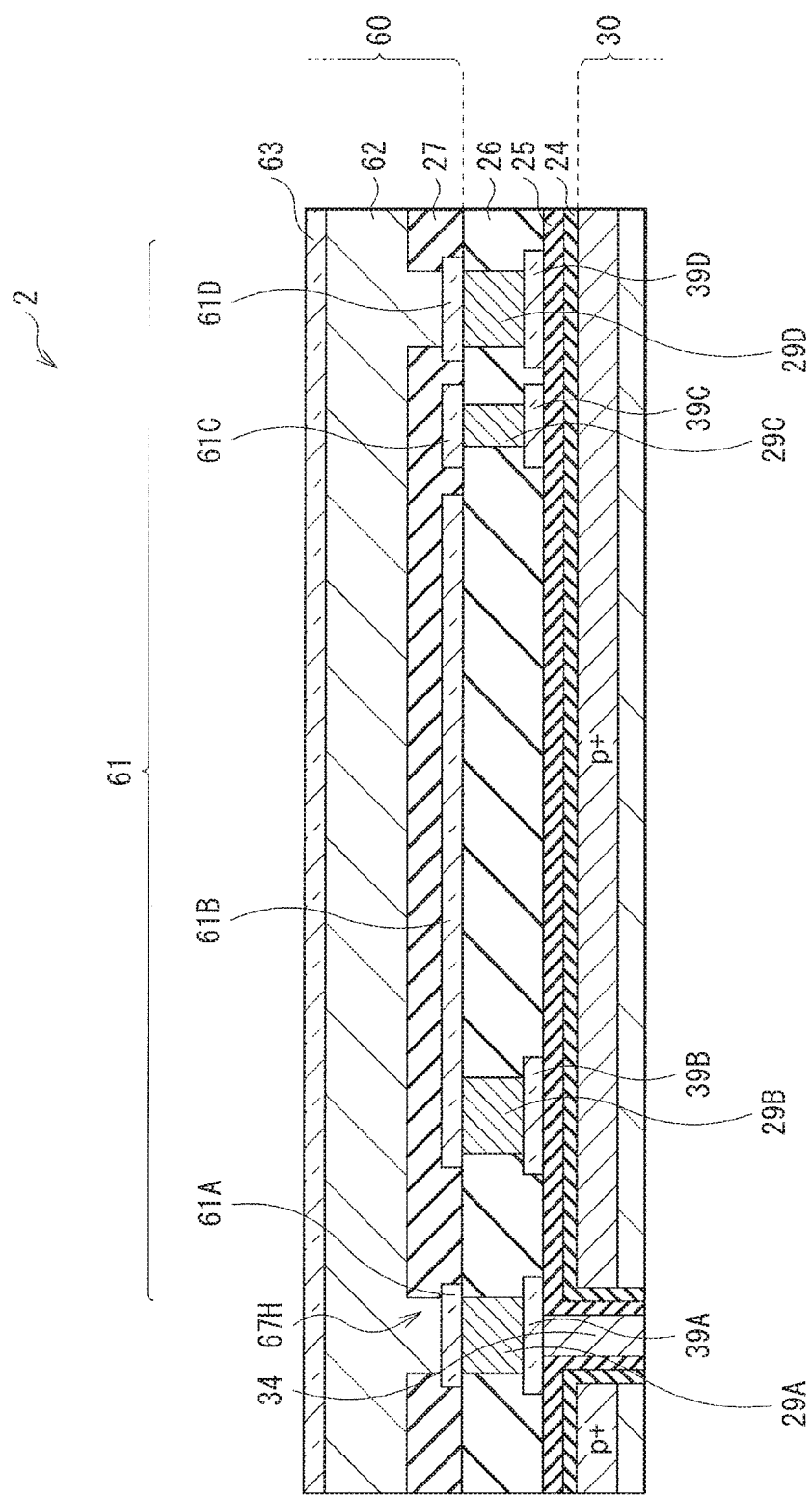
[FIG. 18]

[FIG. 19]
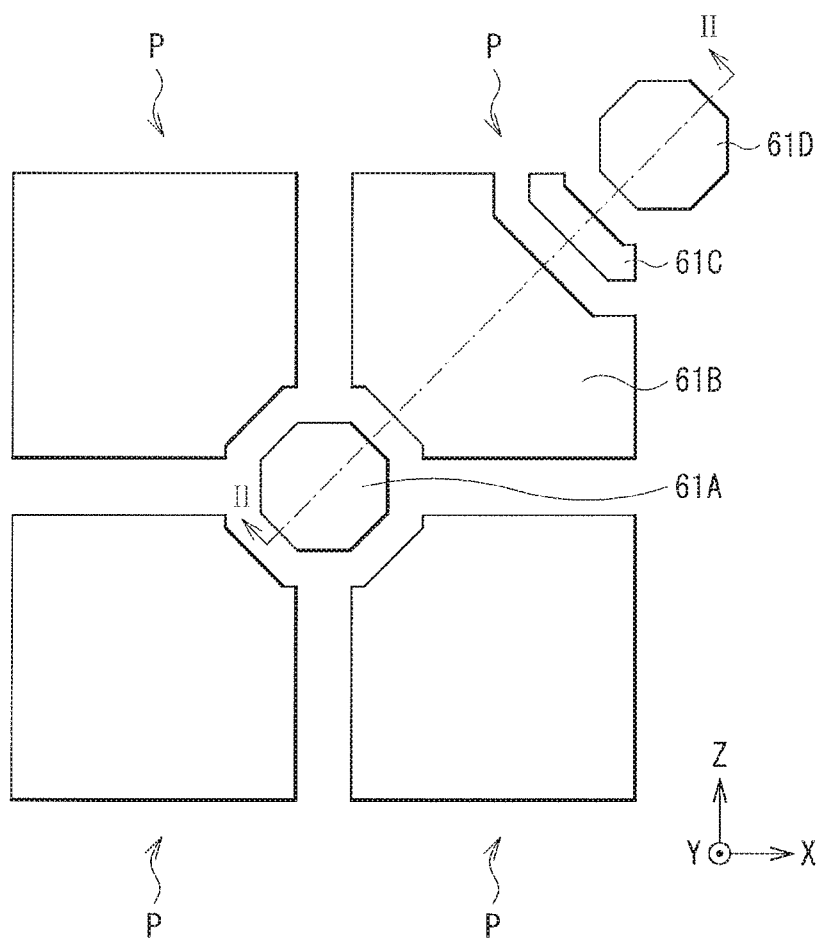

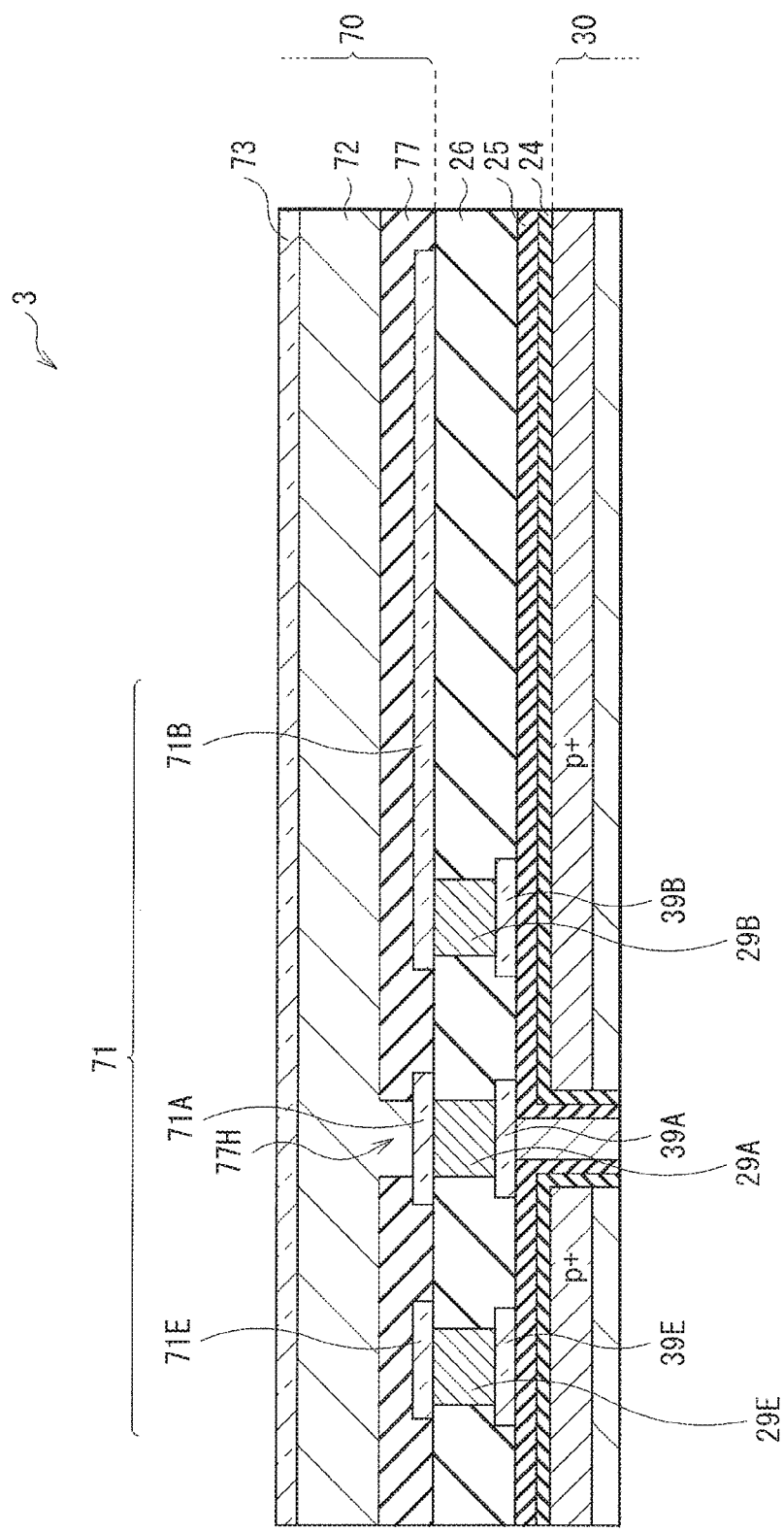
[FIG. 20]

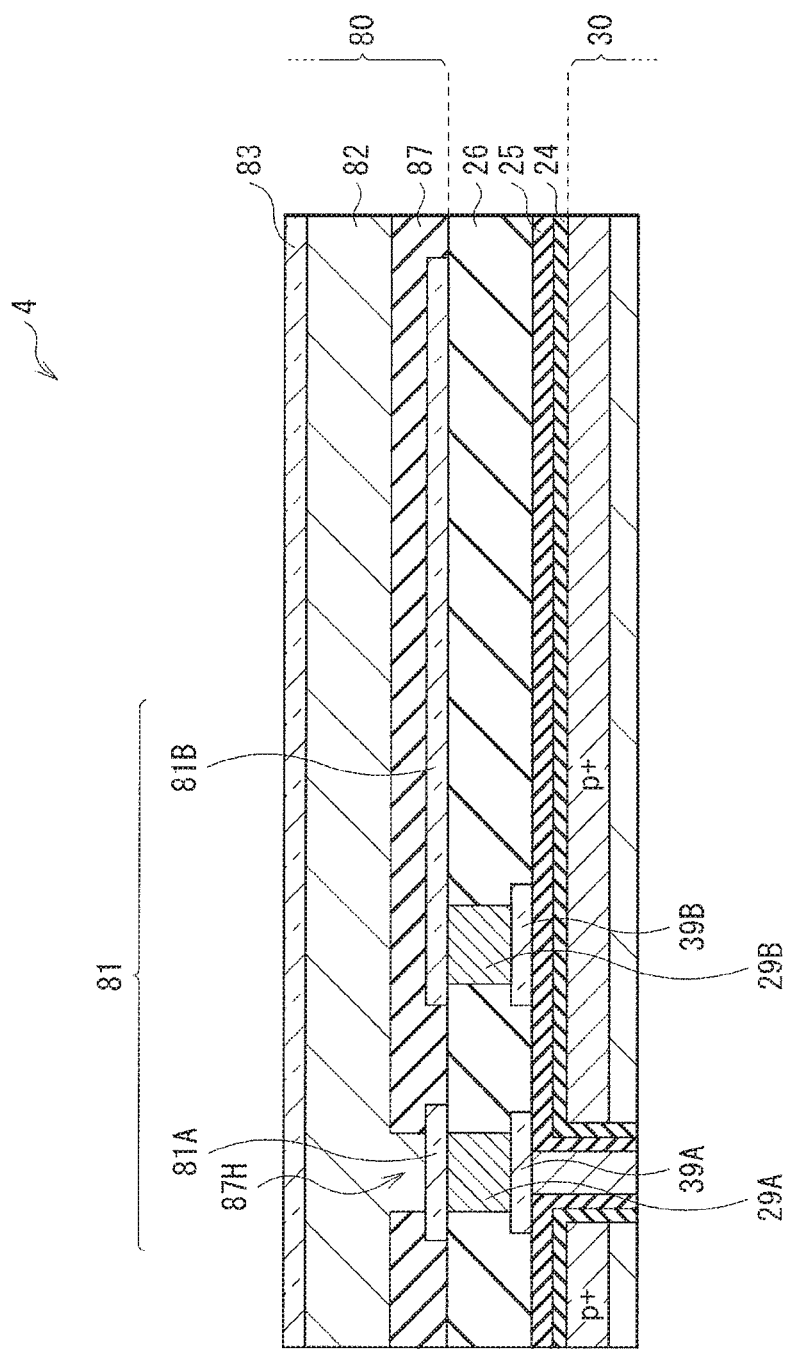
[FIG. 21]

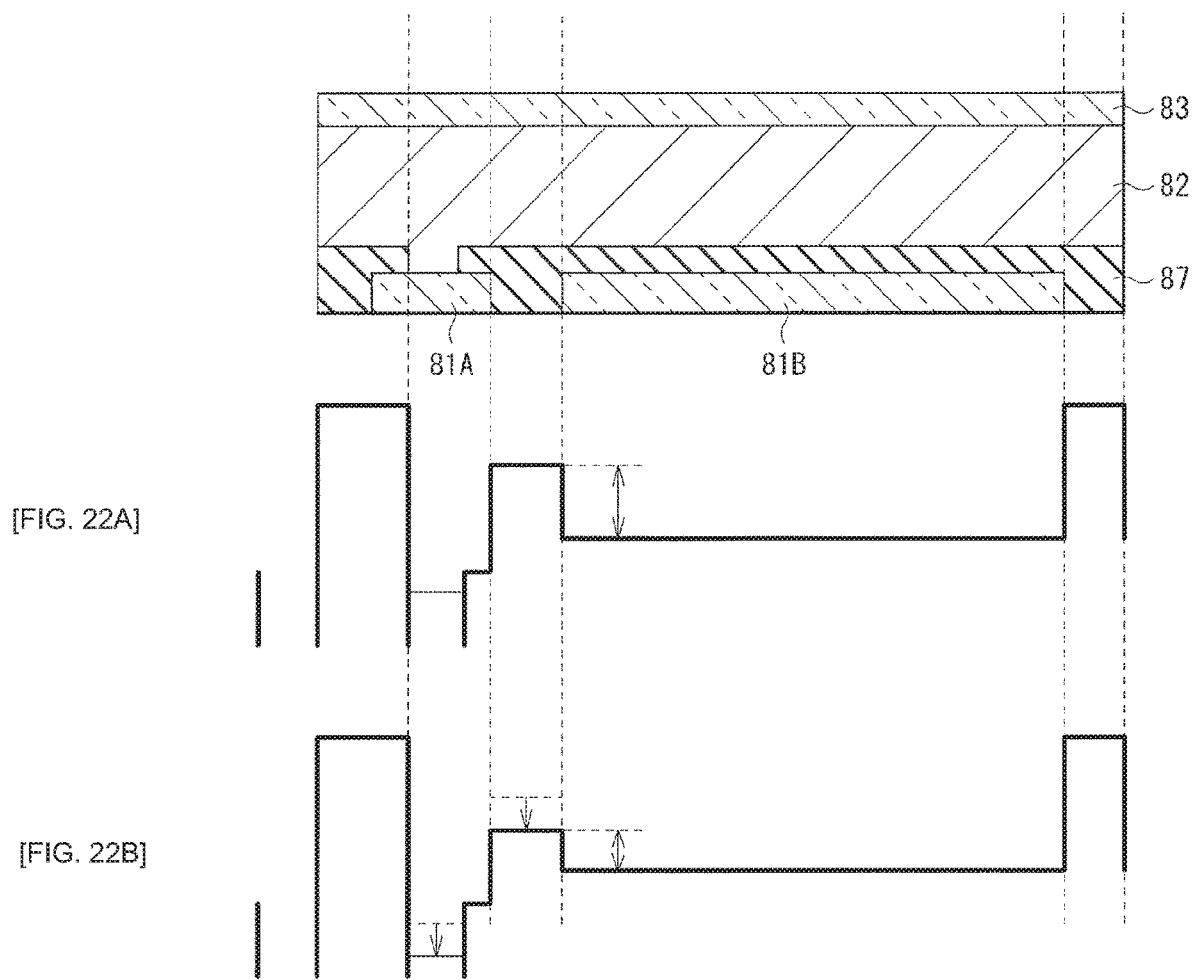

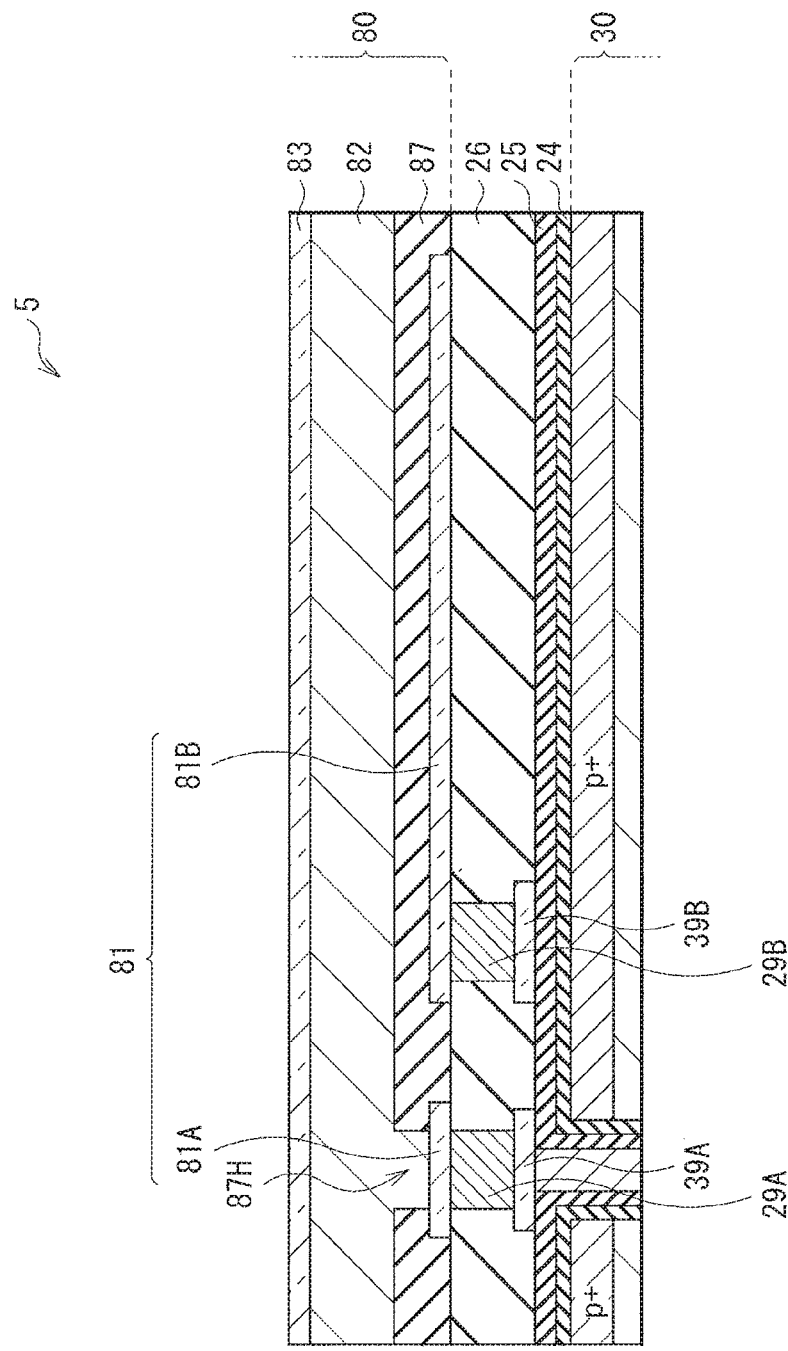
[FIG. 23]

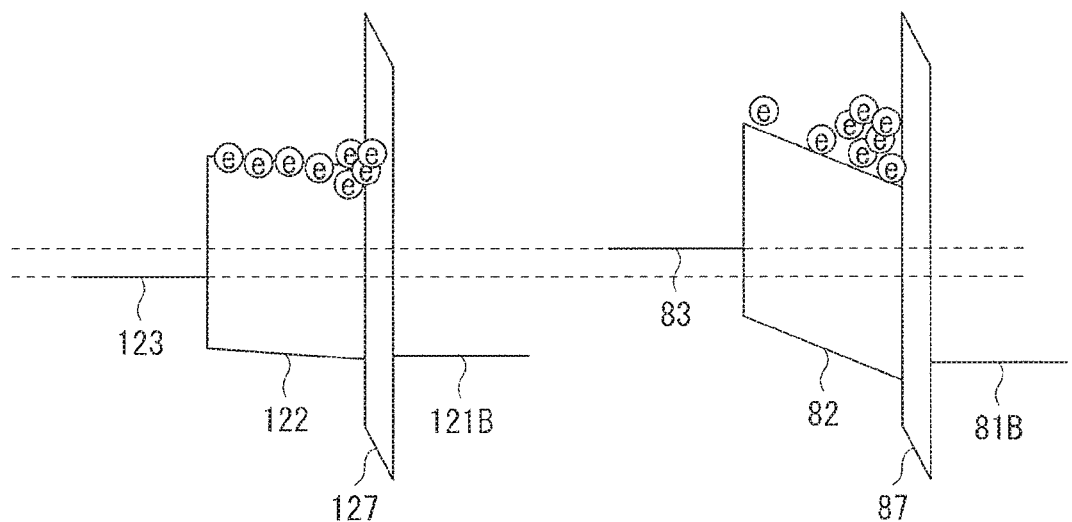

[FIG. 25]
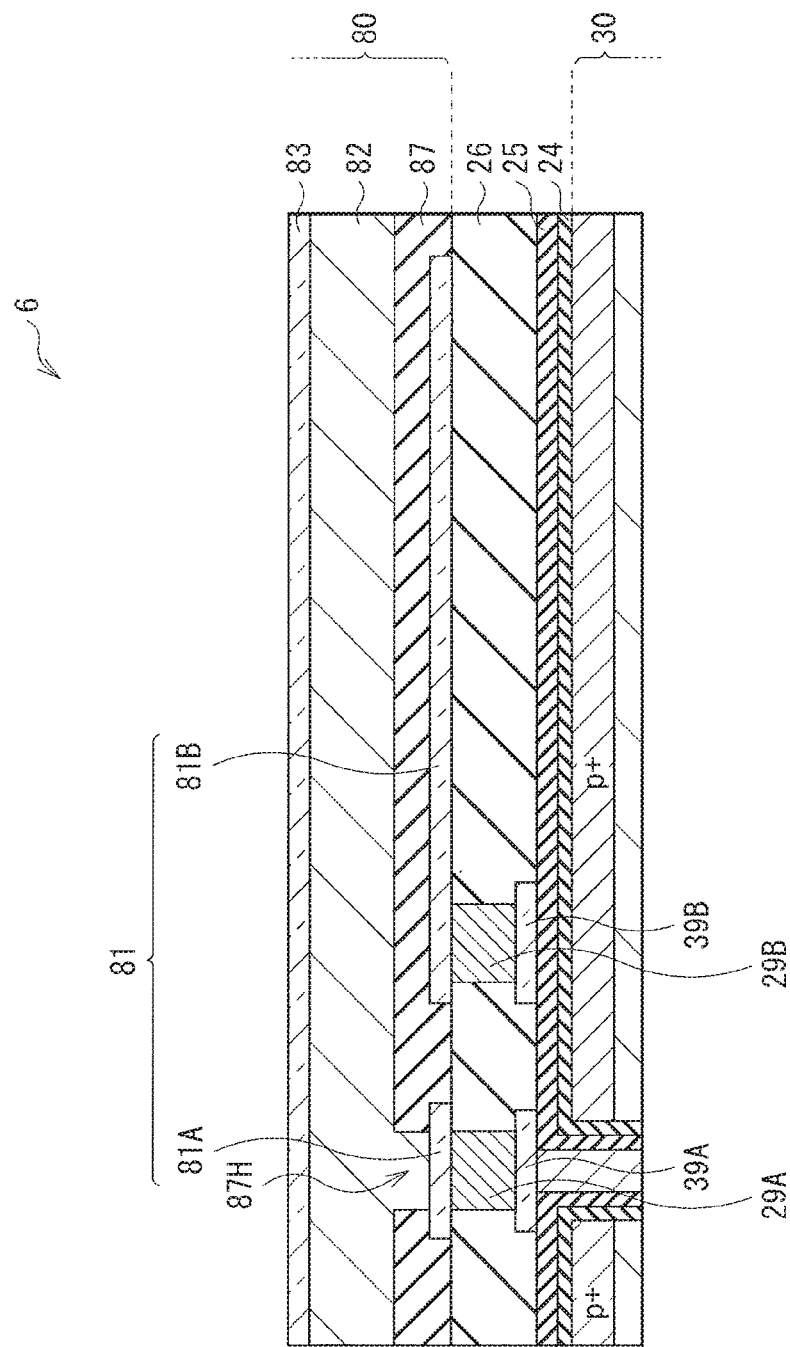

[FIG. 26]
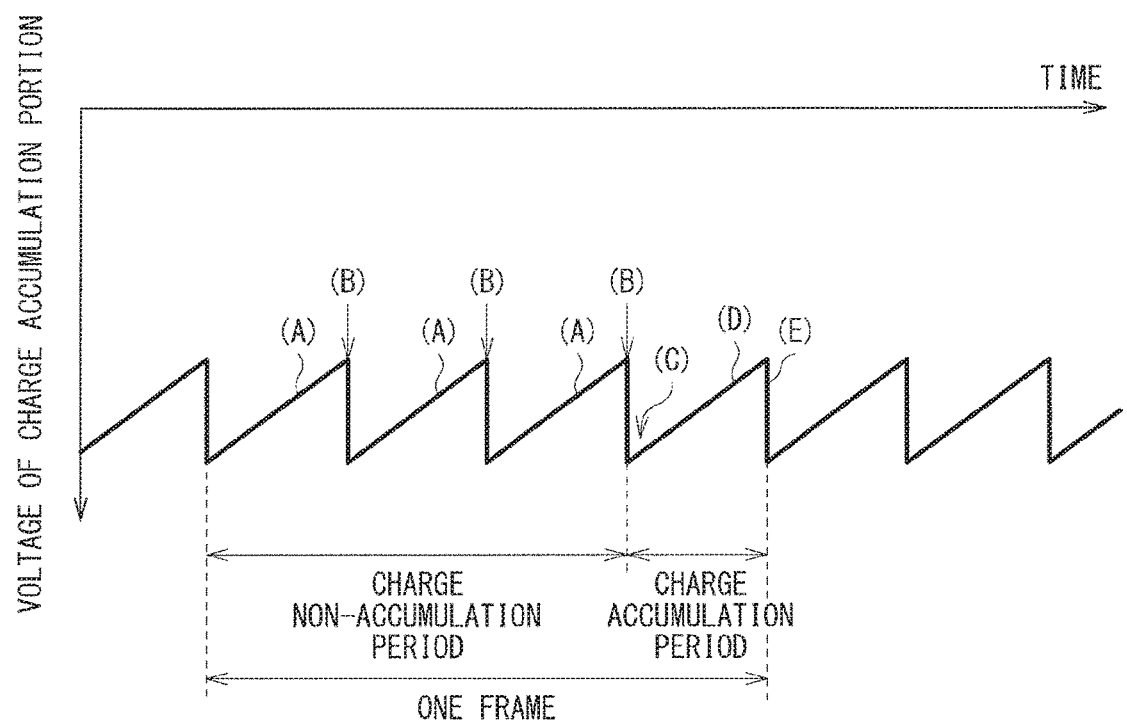

[FIG. 27]
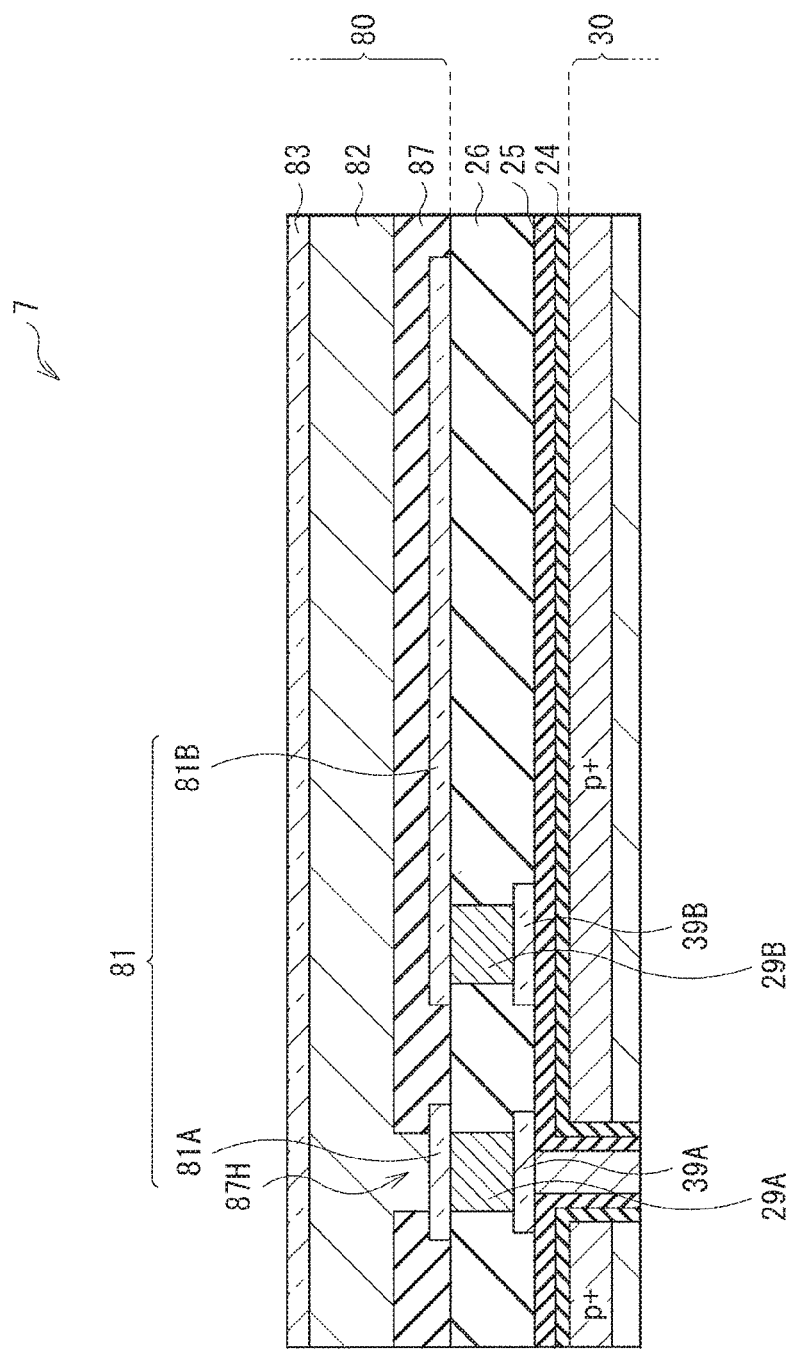

[FIG. 28]
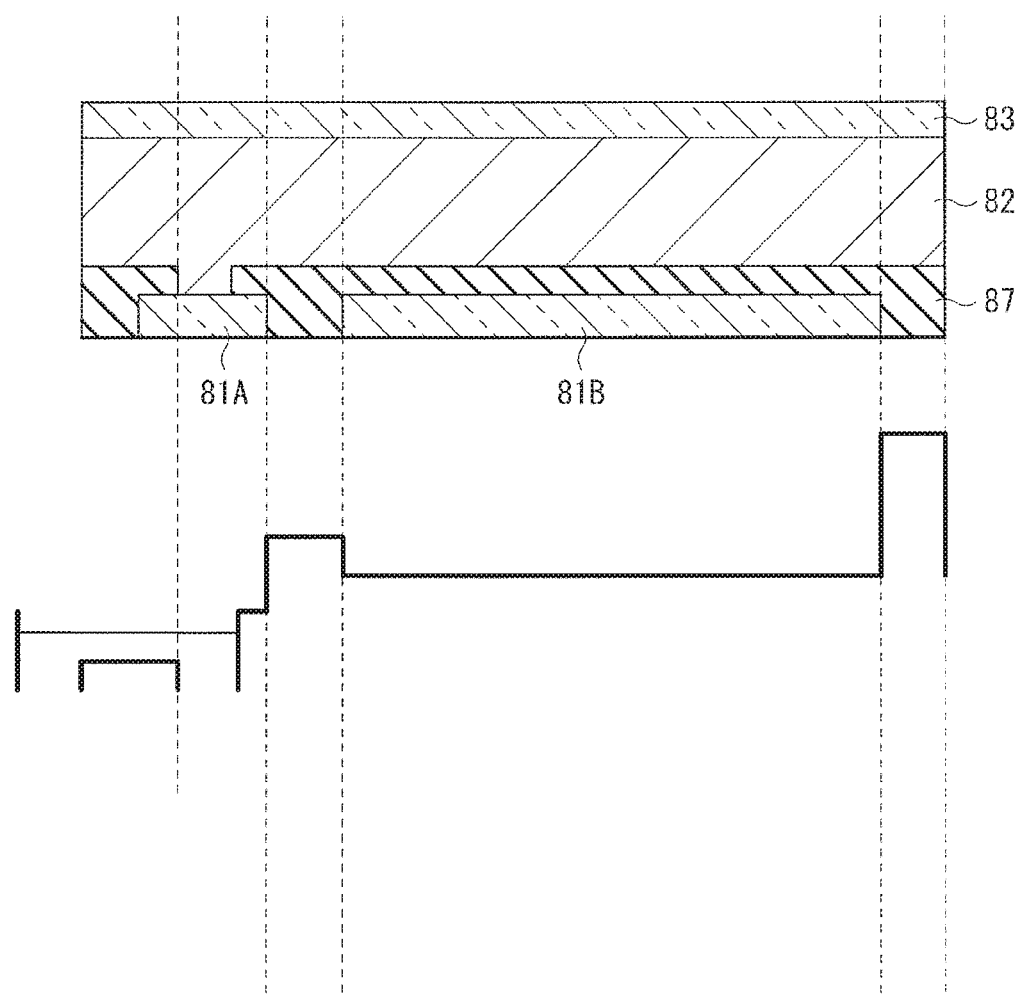

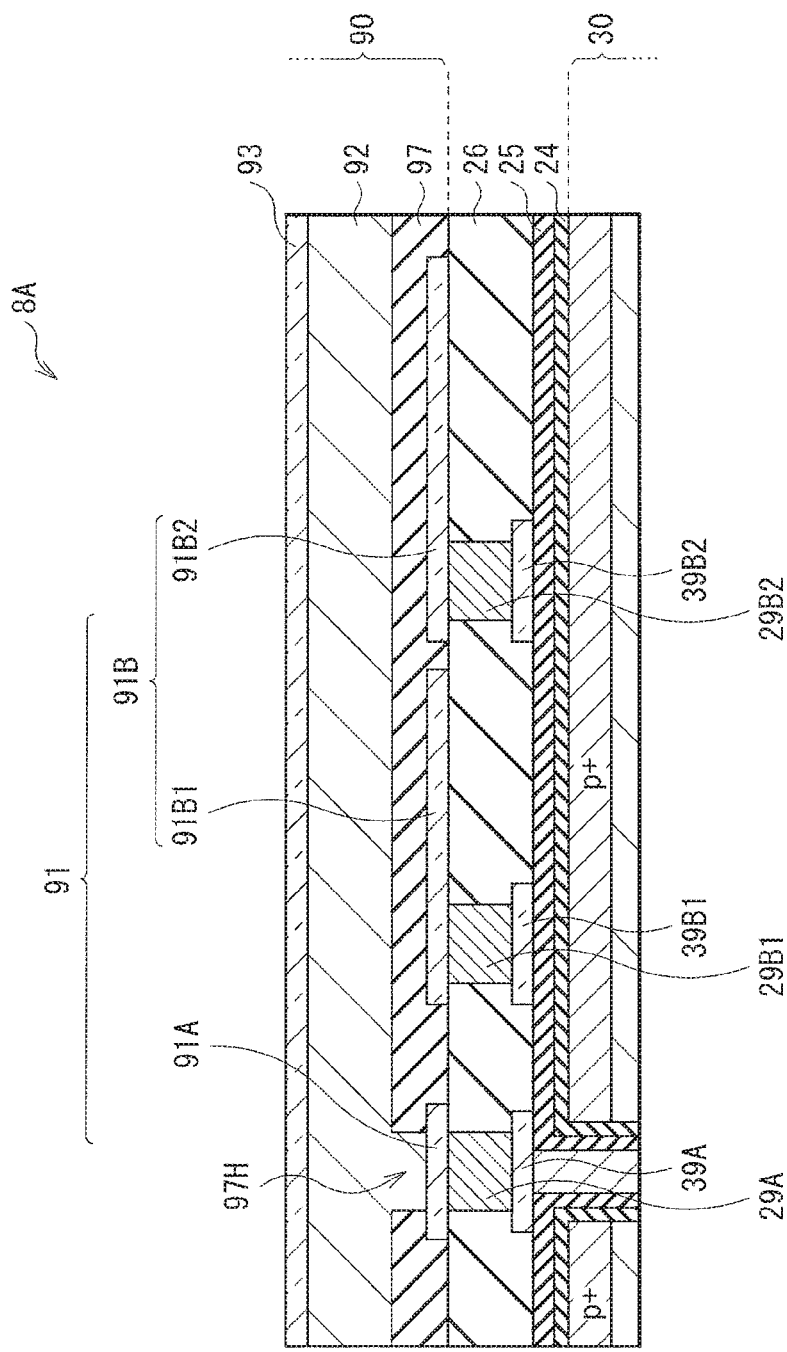
[FIG. 29]

[FIG. 30]
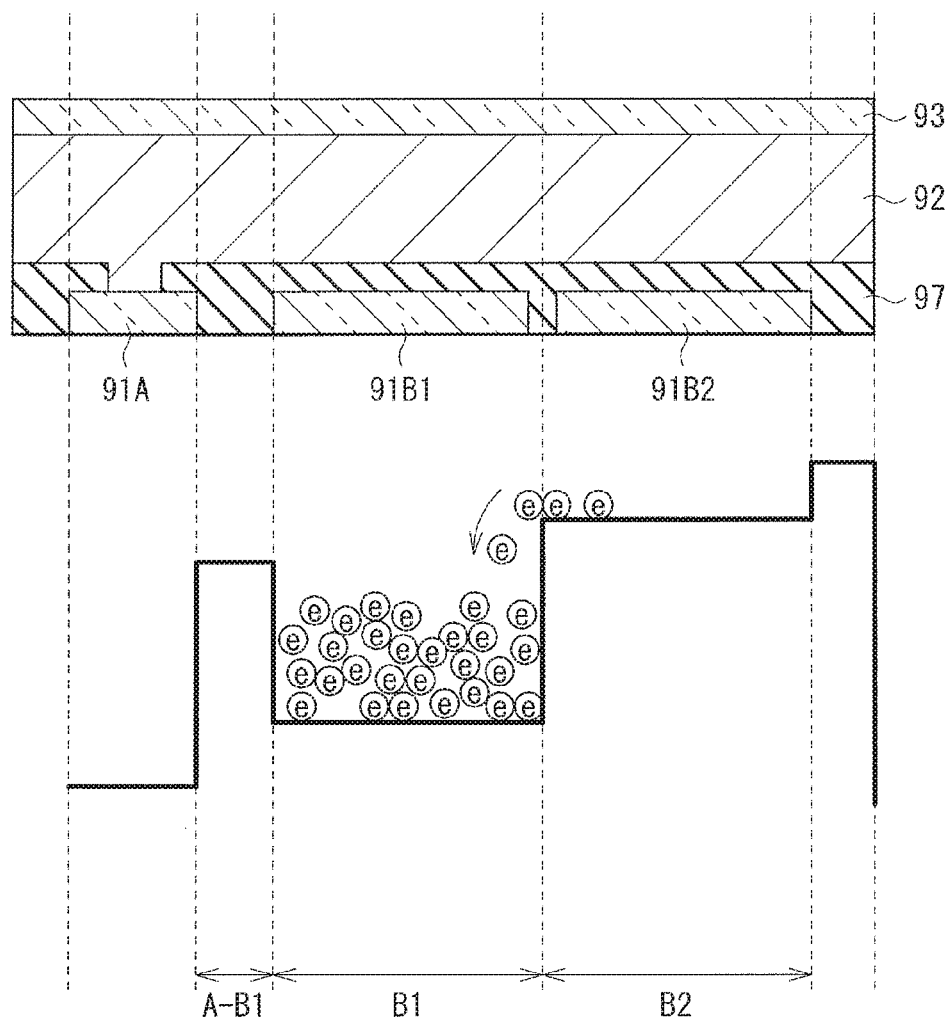

[FIG. 31]
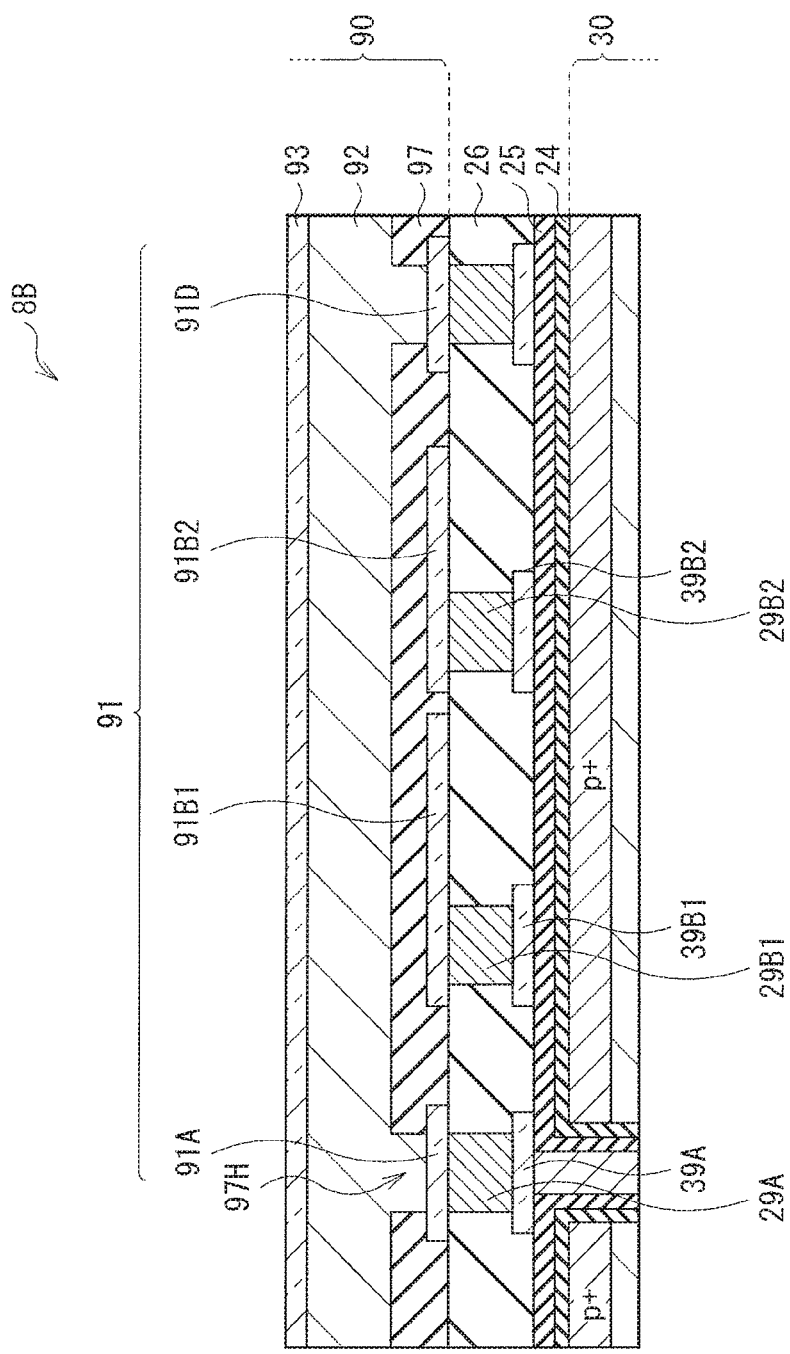

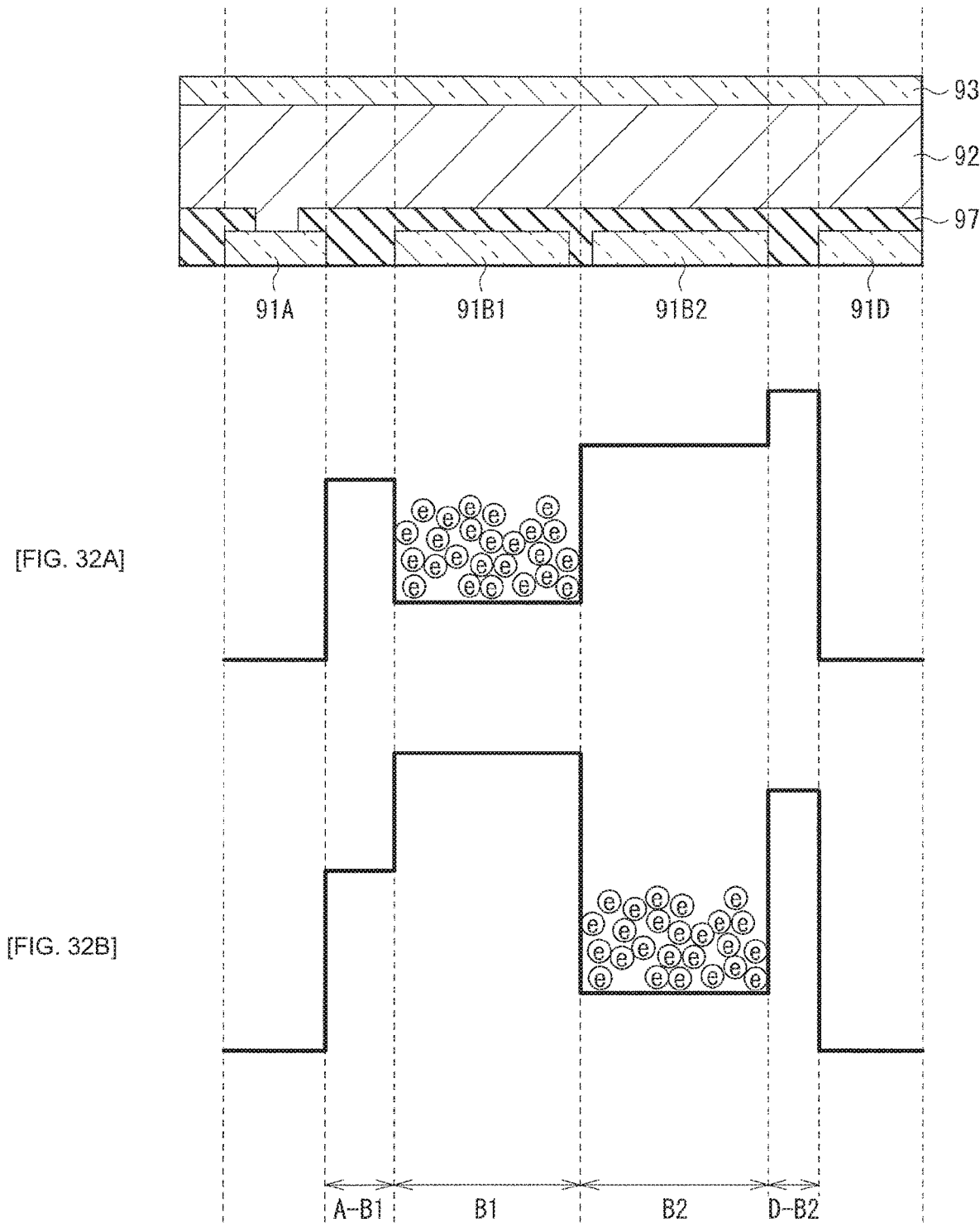

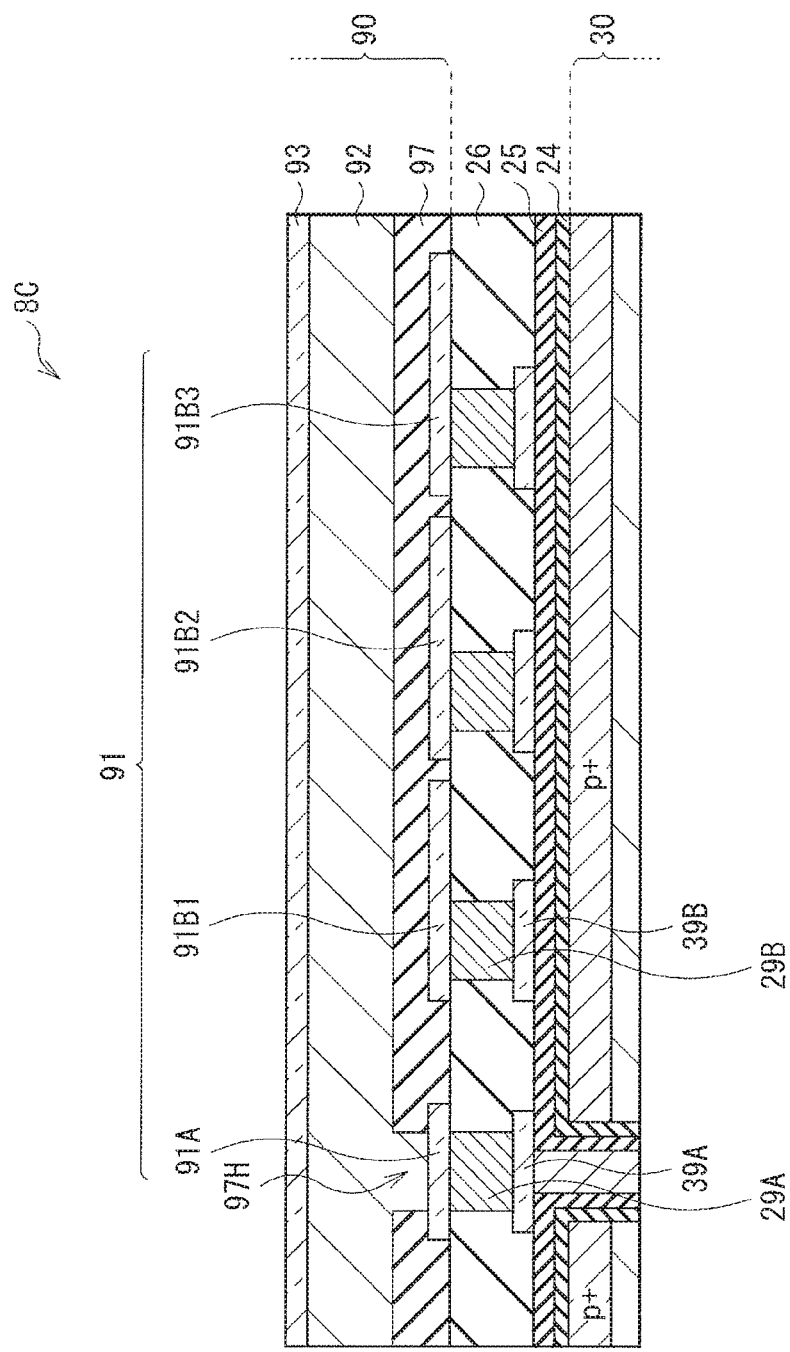
[FIG. 33]

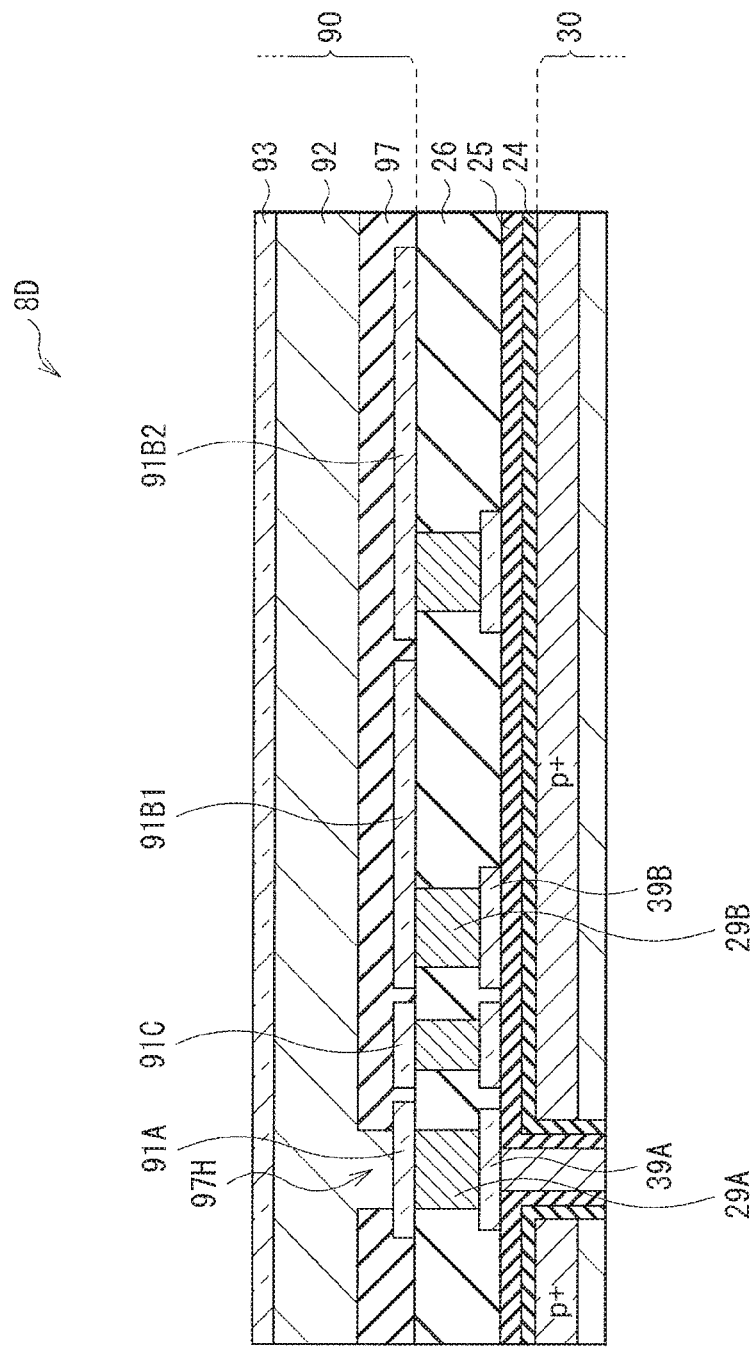
[FIG. 34]

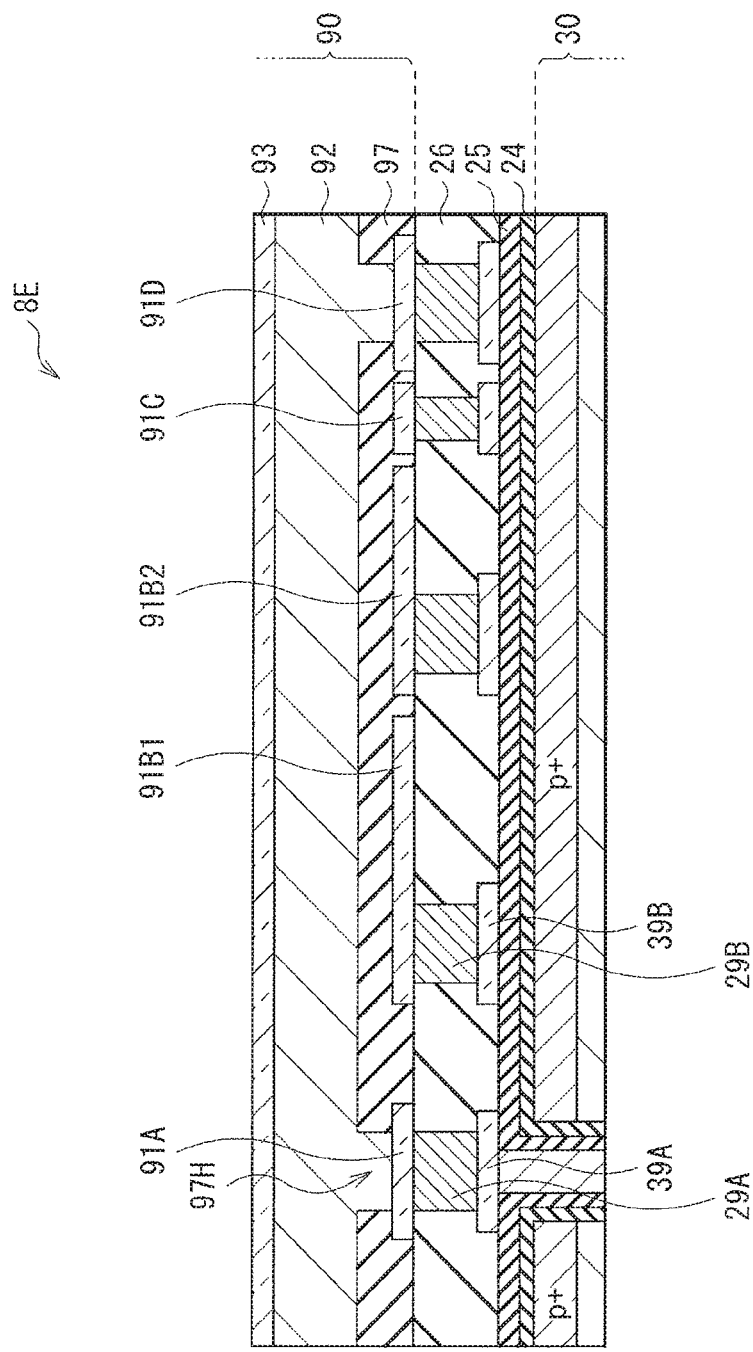
[FIG. 35]

[FIG. 36]
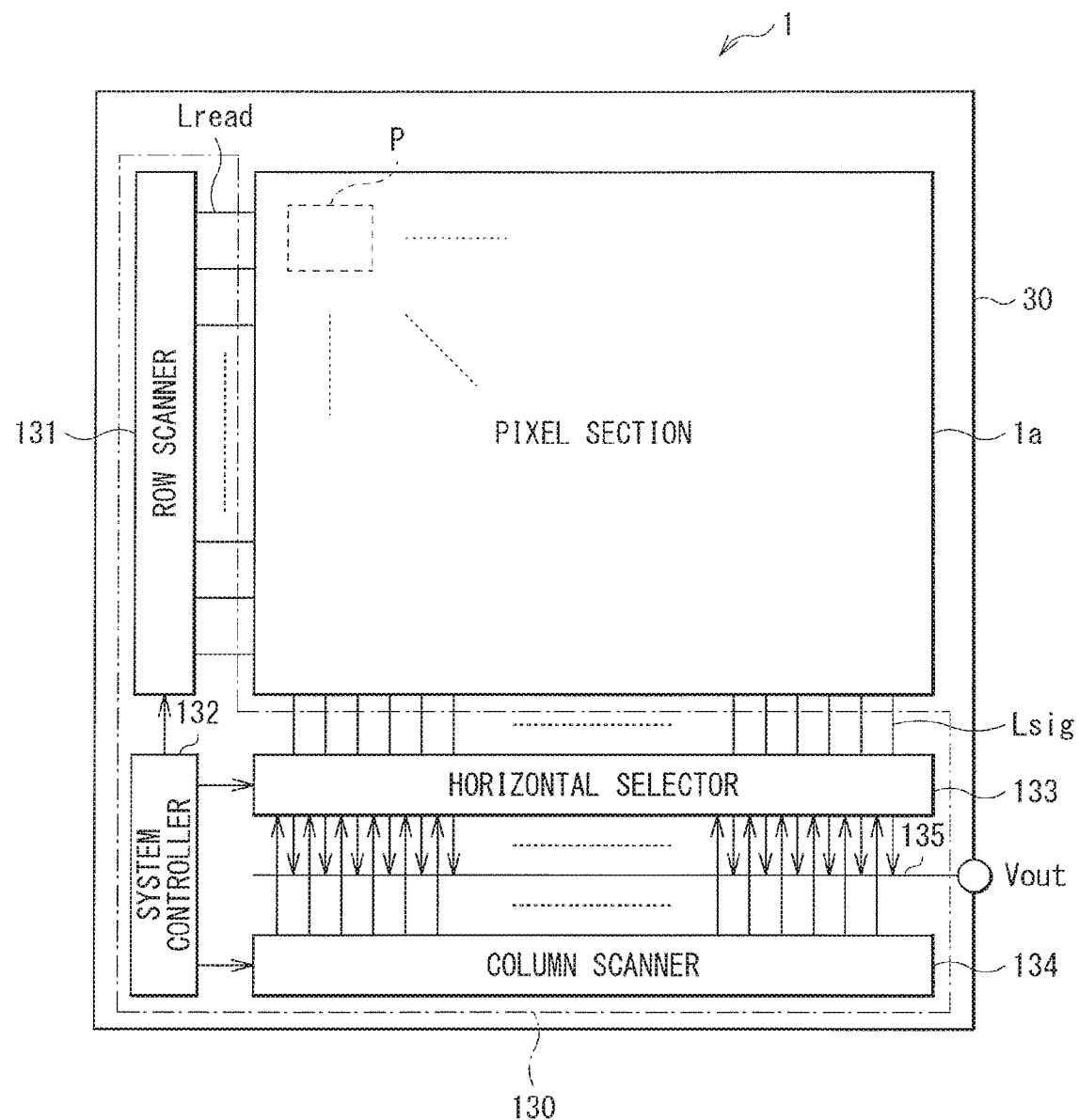

[FIG. 37]
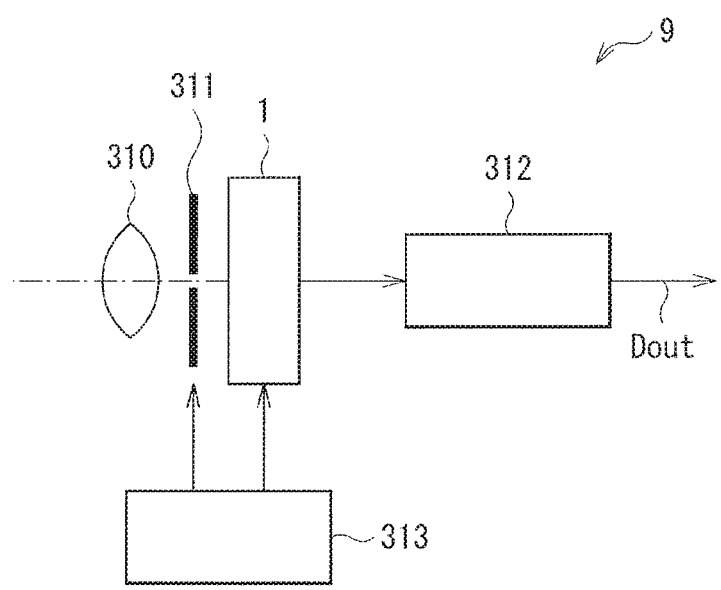

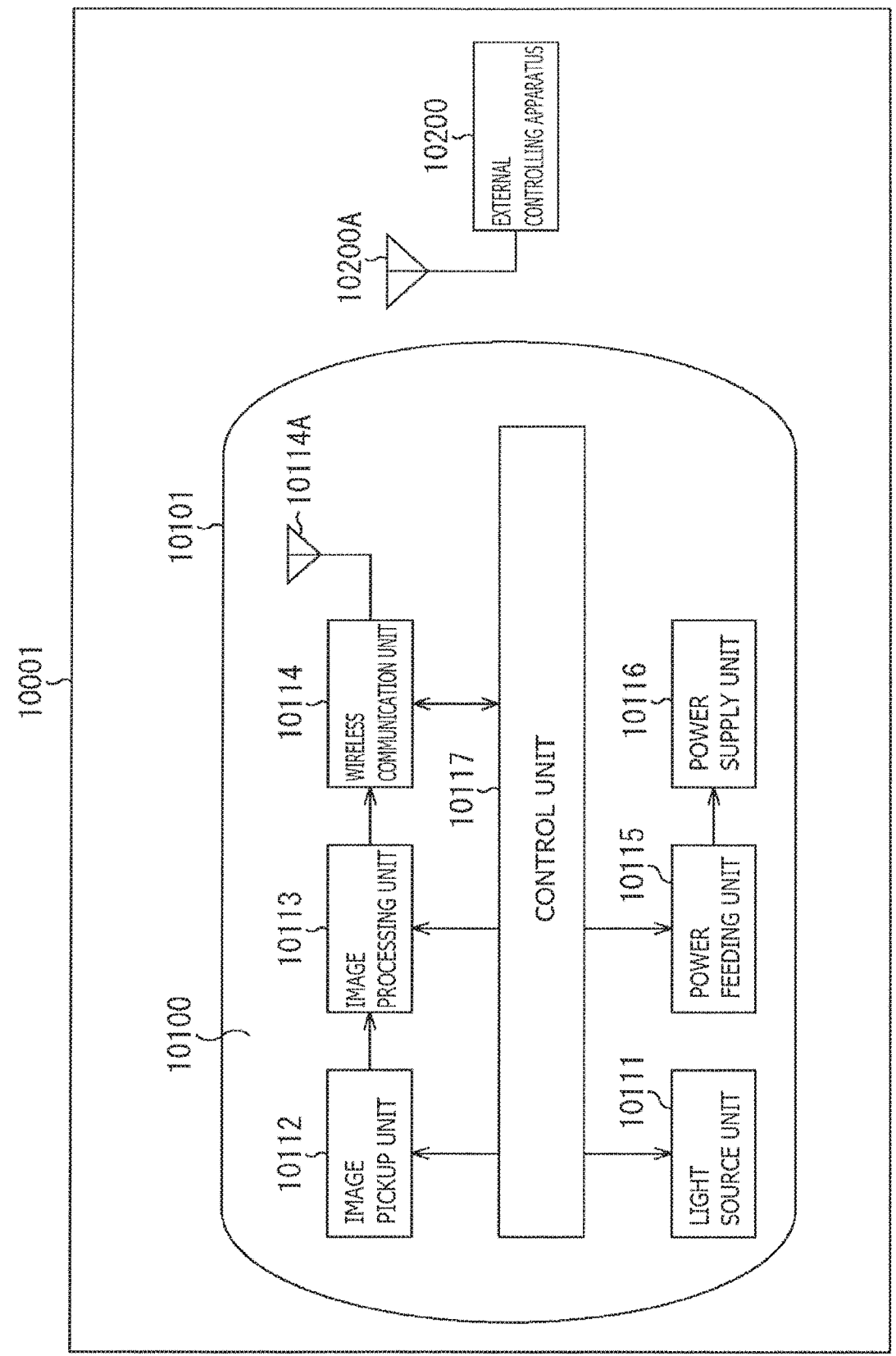
[FIG. 38]

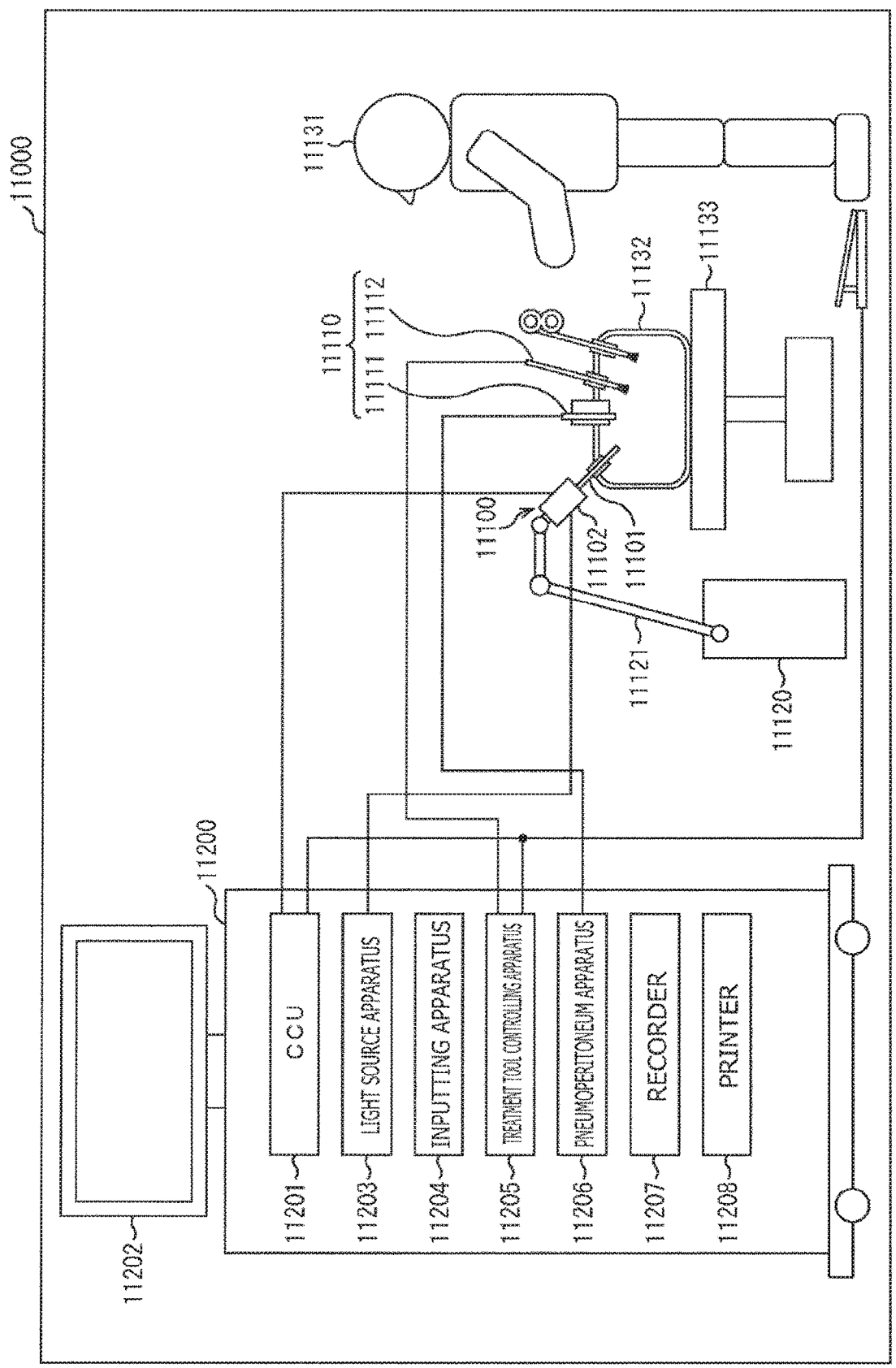
[FIG. 39]

[FIG. 40]
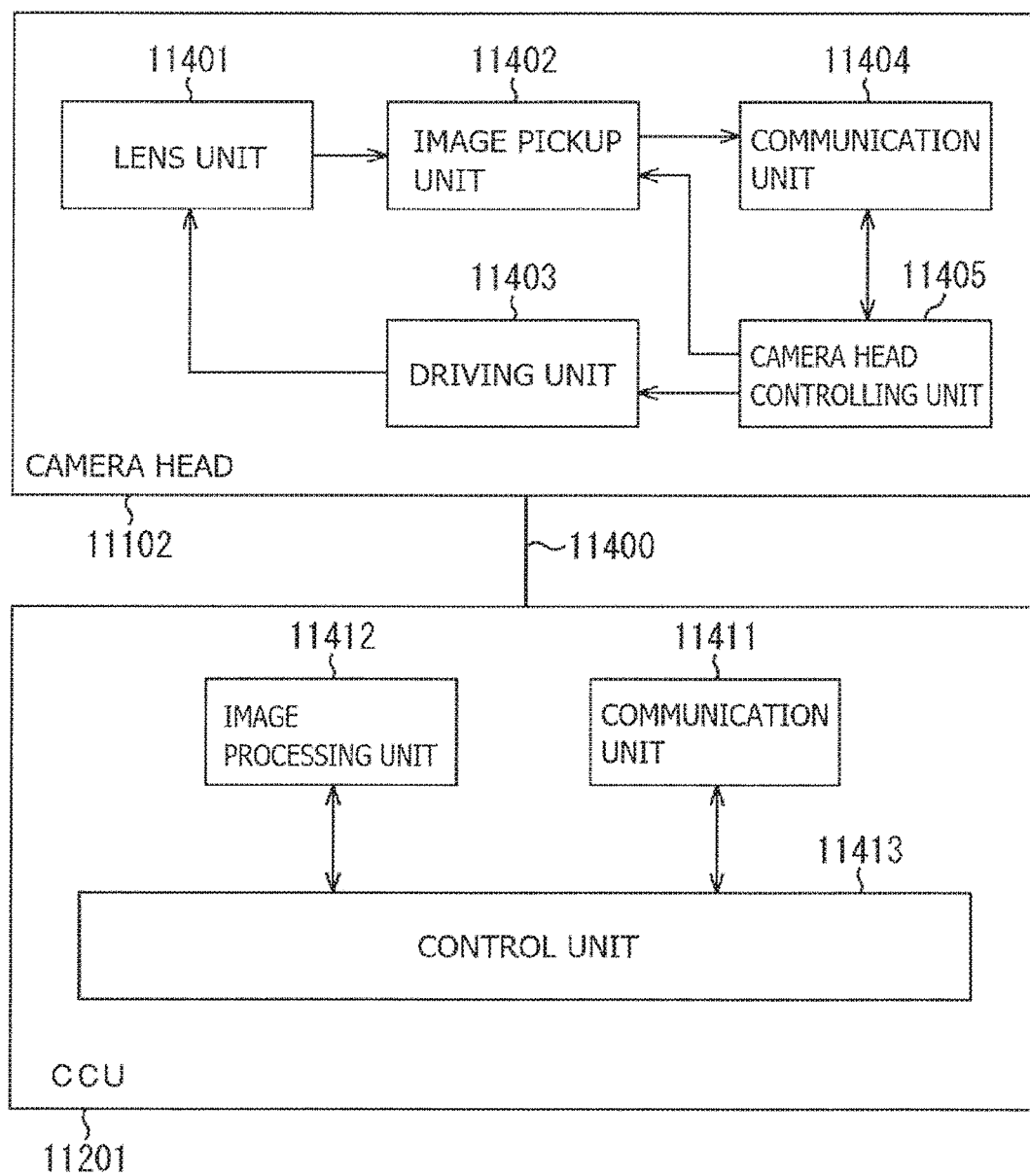

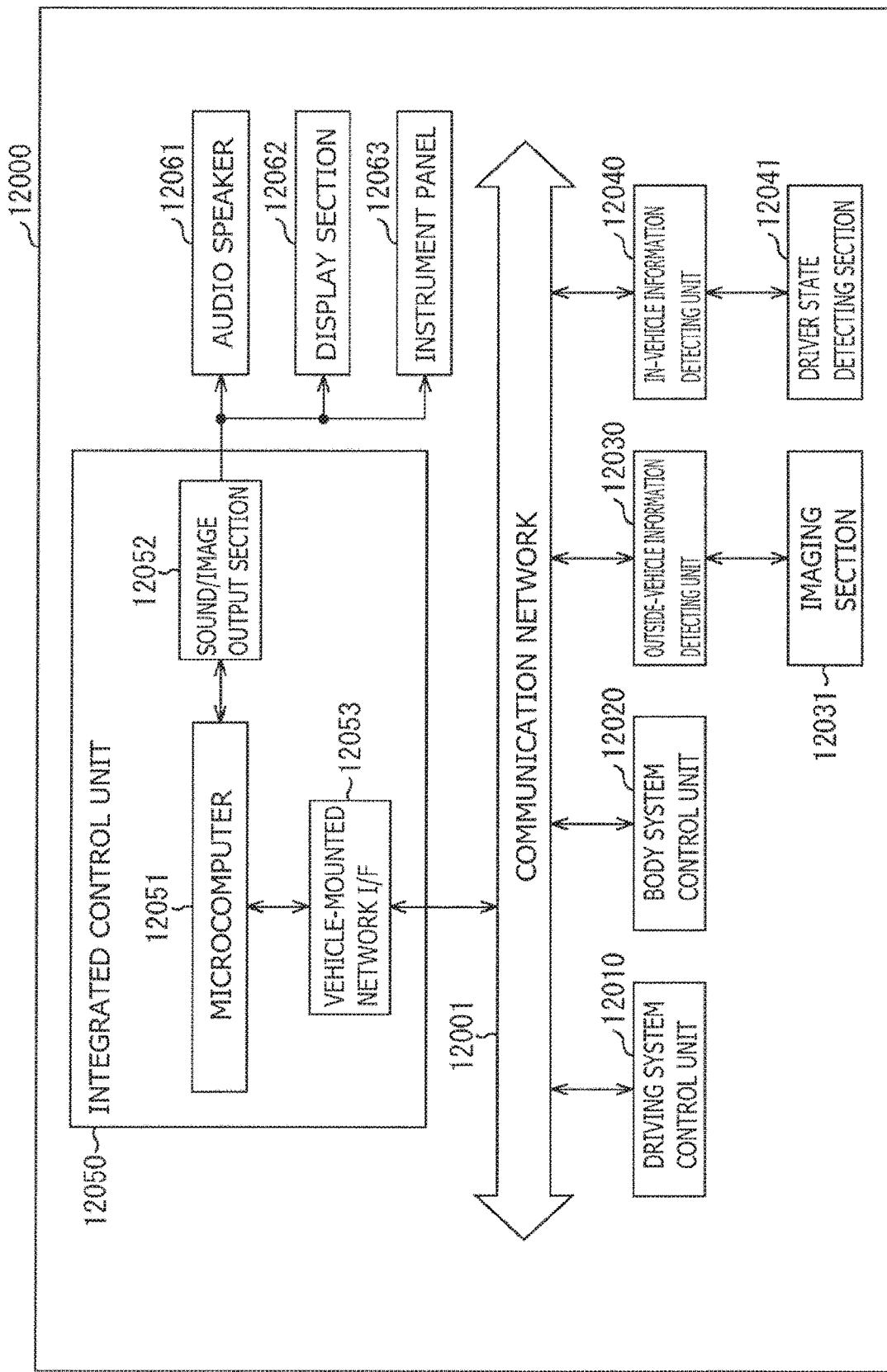
[FIG. 41]

[FIG. 42]
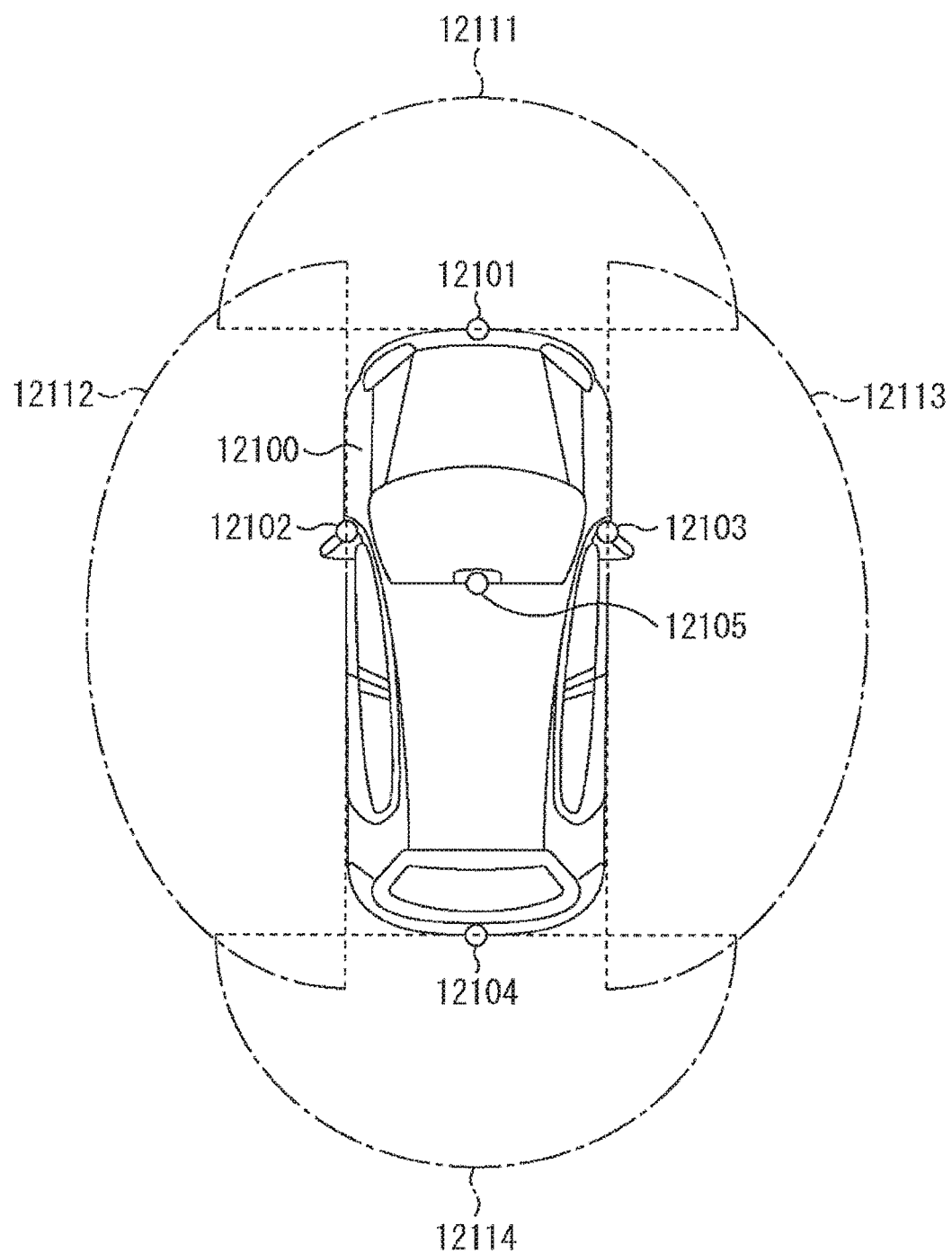

SOLID-STATE IMAGING DEVICE AND METHOD OF CONTROLLING SOLID-STATE IMAGING DEVICE

CROSS REFERENCE TO RELATED APPLICATIONS

This application is a U.S. National Phase of International Patent Application No. PCT/JP2018/030106 filed on Aug. 10, 2018, which claims priority benefit of Japanese Patent Application No. JP 2017-167852 filed in the Japan Patent Office on Aug. 31, 2017. Each of the above-referenced applications is hereby incorporated herein by reference in its entirety.

TECHNICAL FIELD

The disclosure relates to a solid-state imaging device including, for example, an organic semiconductor material, and a method of controlling a solid-state imaging device.

BACKGROUND ART

In recent years, the pixel size in solid-state imaging devices, such as charge coupled devices (CCD) and complementary metal oxide semiconductors (CMOS), has been decreasing. Some solid-state imaging devices are provided with photoelectric conversion films including organic semiconductor materials, the photoelectric conversion films being disposed outside semiconductor substrates. In such a solid-state imaging device, typically, electrical charges are accumulated in a floating diffusion layer (floating diffusion; FD) formed inside the semiconductor substrate. In such a case, however, there is a need for superior afterimage characteristics.

In contrast, for example, PTL 1 discloses a solid-state imaging device having a vertical transfer path inside a semiconductor substrate. The vertical transfer path includes a coupler, a potential barrier layer, and a charge accumulation layer, stacked in the vertical direction. In a solid-state imaging device having such a configuration, signal charges generated at a photoelectric transducer overflow in the vertical direction, and kTC noise, which is one cause of the generation of an afterimage, is thereby reduced. Thus, the afterimage characteristics are enhanced.

CITATION LIST

Patent Literature

PTL 1 Japanese Unexamined Patent Application Publication No. 2011-138927

SUMMARY OF THE INVENTION

As described above, there is a need for enhanced afterimage characteristics in a solid-state imaging device provided with a photoelectric conversion film including an organic semiconductor material, the photoelectric conversion film being disposed outside the semiconductor substrate.

It is desirable to provide a solid-state imaging device and a method of controlling the solid-state imaging device that are able to enhance afterimage characteristics.

A solid-state imaging device according to an embodiment of the disclosure includes a first electrode, a second electrode, a photoelectric conversion layer, and a voltage applier. The first electrode includes a plurality of electrodes independent from each other. The second electrode is disposed opposite to the first electrode. The photoelectric conversion layer is disposed between the first electrode and the second electrode. The voltage applier applies different voltages to at least one of the first electrode or the second electrode during a charge accumulation period and a charge non-accumulation period.

A method of controlling a solid-state imaging device according to an embodiment of the disclosure includes applying different voltages to at least one of a first electrode or a second electrode during a charge accumulation period and a charge non-accumulation period. The first electrode includes a plurality of electrodes independent from each other. The second electrode is disposed opposite to the first electrode with a photoelectric conversion layer disposed between the first electrode and the second electrode.

In the method of controlling a solid-state imaging device according to an embodiment of the disclosure, a voltage applier is provided that is able to apply different voltages to at least one of a first electrode or a second electrode during a charge accumulation period and a charge non-accumulation period, the first electrode including a plurality of electrodes independent from each other, the second electrode being disposed opposite to the first electrode with a photoelectric conversion layer disposed between the first electrode and the second electrode. In this way, it is possible to adjust the potential difference between the first electrode and the second electrode during the charge accumulation period and the charge non-accumulation period.

In the solid-state imaging device according to an embodiment and the method of controlling a solid-state imaging device according to an embodiment, a voltage applier is provided that is able to apply different voltages to at least one of a first electrode or a second electrode during a charge accumulation period and a charge non-accumulation period. Therefore, it is possible to adjust the potential difference between the first electrode and the second electrode during the charge accumulation period and the charge non-accumulation period. In this way, it is possible to enhance the afterimage characteristics.

Note that the effects described above are not necessarily limited and may include any of the effects described herein.

BRIEF DESCRIPTION OF THE DRAWINGS

FIG. 1 is a schematic cross-sectional view of the configuration of a unit pixel P of a solid-state imaging device according to a first embodiment of the disclosure.

FIG. 2 is a schematic plan view of the configuration of a lower electrode of the solid-state imaging device illustrated in FIG. 1.

FIG. 3 is an equivalent circuit diagram illustrating a solid-state imaging device illustrated in FIG. 1.

FIG. 4 is a schematic diagram of the positioning of a lower electrode and transistors constituting a controller, of the solid-state imaging device illustrated in FIG. 1.

FIG. 5 is a schematic cross-sectional view of a method of producing the solid-state imaging device illustrated in FIG. 1.

FIG. 6 is a schematic cross-sectional view illustrating a step following that illustrated in FIG. 5.

FIG. 7 is a schematic cross-sectional view illustrating a step following that illustrated in FIG. 6.

FIG. 8 is a schematic cross-sectional view illustrating a step following that illustrated in FIG. 7.

FIG. 9 is a schematic cross-sectional view illustrating a step following that illustrated in FIG. 8.

FIG. 10 is a diagram illustrating an example voltage variation in a charge accumulator of a typical solid-state imaging device.

FIG. 11 is a diagram illustrating another example voltage variation in a charge accumulator of a typical solid-state imaging device.

FIGS. 12A, 12B, and 12C are diagrams illustrating electrical potentials of regions on side of a lower electrode at points (A) to (C) illustrated in FIG. 11.

FIGS. 13A and 13B are diagrams illustrating electrical potentials of regions on side of a lower electrode at points (D) and (E) illustrated in FIG. 11.

FIG. 14A is a diagram illustrating a potential difference of a photoelectric conversion layer and movement of signal charges in the case of a small amount of electrical charges in a typical solid-state imaging device.

FIG. 14B is a diagram illustrating a potential difference of a photoelectric conversion layer and movement of signal charges in the case of a large amount of electrical charges in a typical solid-state imaging device.

FIG. 15 is a diagram illustrating an example voltage variation in a charge accumulator of the solid-state imaging device illustrated in FIG. 1.

FIGS. 16A, 16B, and 16C is a are diagrams illustrating electrical potentials of regions on side of a lower electrode at points (A) to (C) illustrated in FIG. 15.

FIGS. 17A and 17B is a are diagrams illustrating electrical potentials of regions on side of a lower electrode at points (D) and (E) illustrated in FIG. 15.

FIG. 18 is a schematic cross-sectional view of the configuration of a main part of a solid-state imaging device according to a first modification of the disclosure.

FIG. 19 is a schematic plan view of the configuration of a lower electrode of a solid-state imaging device illustrated in FIG. 18.

FIG. 20 is a schematic cross-sectional view of the configuration of a main part of a solid-state imaging device according to a second embodiment of the disclosure.

FIG. 21 is a schematic cross-sectional view of the configuration of a main part of a solid-state imaging device according to a third embodiment of the disclosure.

FIGS. 22A and 22B is a are diagrams illustrating electrical potentials of regions on side of a lower electrode of the solid-state imaging device illustrated in FIG. 21 during a charge accumulation and charge non-accumulation.

FIG. 23 is a schematic cross-sectional view of the configuration of a main part of a solid-state imaging device according to a fourth embodiment of the disclosure.

FIGS. 24A and 24B is a are diagrams illustrating a potential difference of a photoelectric conversion layer and movement of signal charges during a charge non-accumulation period of the solid-state imaging device illustrated in FIG. 23, in comparison with those illustrated in FIG. 14B.

FIG. 25 is a schematic cross-sectional view of the configuration of a main part of a solid-state imaging device according to a fifth embodiment of the disclosure.

FIG. 26 is a diagram illustrating an example voltage variation of a charge accumulator of the solid-state imaging device illustrated in FIG. 25.

FIG. 27 is a schematic cross-sectional view of the configuration of a main part of a solid-state imaging device according to a sixth embodiment of the disclosure.

FIG. 28 is a diagram illustrating an electrical potential of regions on side of a lower electrode during a charge non-accumulation period of the solid-state imaging device illustrated in FIG. 27.

FIG. 29 is a schematic cross-sectional view of an example of the configuration of a main part of a solid-state imaging device according to a seventh embodiment of the disclosure.

FIG. 30 is a diagram illustrating electrical potentials of regions on side of a lower electrode of a solid-state imaging device illustrated in FIG. 29.

FIG. 31 is a schematic cross-sectional view of another example of the configuration of the main part of the solid-state imaging device according to a seventh embodiment of the disclosure.

FIGS. 32A and 32B is a are diagrams illustrating electrical potentials of regions on side of a lower electrode of the solid-state imaging device illustrated in FIG. 31.

FIG. 33 is a schematic cross-sectional view of another example of the configuration of the main part of the solid-state imaging device according to the seventh embodiment of the disclosure.

FIG. 34 is a schematic cross-sectional view of another example of the configuration of the main part of the solid-state imaging device according to the seventh embodiment of the disclosure.

FIG. 35 is a schematic cross-sectional view of another example of the configuration of the main part of the solid-state imaging device according to the seventh embodiment of the disclosure.

FIG. 36 is a block diagram illustrating an overall configuration of a solid-state imaging device illustrated in FIG. 1, etc.

FIG. 37 is a functional block diagram illustrating an example of an electronic apparatus, such as a camera, including a solid-state imaging device illustrated in FIG. 36.

FIG. 38 is a block diagram depicting an example of a schematic configuration of an in-vivo information acquisition system.

FIG. 39 is a view depicting an example of a schematic configuration of an endoscopic surgery system.

FIG. 40 is a block diagram depicting an example of a functional configuration of a camera head and a camera control unit (CCU).

FIG. 41 is a block diagram depicting an example of schematic configuration of a vehicle control system.

FIG. 42 is a diagram of assistance in explaining an example of an installation positions of an outside-vehicle information detecting section and an imaging section.

DESCRIPTION OF THE EMBODIMENTS

Embodiments of the disclosure will now be described in detail with reference to the drawings. The following description is one specific example of the disclosure, and the disclosure is not limited to the following embodiments. Furthermore, the disclosure is also not limited to the arrangement, dimensions, dimensional ratios, etc., of each component illustrated in the drawings. Note that the description will be provided in the following order.

1. First embodiment (an example of a solid-state imaging device in which a barrier adjustment electrode is disposed between a readout electrode and accumulation electrode)
   1-1. Configuration of solid-state imaging device
   1-2. Method of producing solid-state imaging device
   1-3. Method of controlling solid-state imaging device
   1-4. Workings and effects 2. Modifications (an example of a solid-state imaging device in which a barrier adjustment electrode is disposed between an accumulation electrode and a discharge electrode)

3. Second embodiment (an example of a solid-state imaging device in which a barrier adjustment electrode is disposed on a side of a readout electrode opposite to an accumulation electrode)

4. Third embodiment (an example method of controlling a solid-state imaging device in which a voltage of a readout electrode is applied after a shutter timing after a charge accumulation period is larger than a reset voltage applied before start of a charge accumulation period)

5. Fourth embodiment (an example method of controlling a solid-state imaging device that applies a voltage to an upper electrode during a charge non-accumulation period, the voltage being smaller than that applied during a charge accumulation period)

6. Fifth embodiment (an example method of controlling a solid-state imaging device that discharges charges multiple times during a charge non-accumulation period)

7. Sixth embodiment (an example method of controlling a solid-state imaging device that always turns on a reset gate during a charge non-accumulation period)

8. Seventh embodiment (an example of a solid-state imaging device in which the accumulation electrode is divided into multiple segments, and different voltages are applied to multiple segments of an accumulation electrode)

9. Application example

1. First Embodiment

FIG. 1 illustrates a schematic cross-sectional configuration of a unit pixel P of a solid-state imaging device (solid-state imaging device 1) according to a first embodiment of the disclosure. FIG. 2 schematically illustrates an example of a planar configuration of a lower electrode of the solid-state imaging device 1 illustrated in FIG. 1, the lower electrode being adjacent to unit pixels P. FIG. 3 is an equivalent circuit diagram illustrating the solid-state imaging device 1 illustrated in FIG. 1. FIG. 4 is a schematic diagram illustrating the positioning of the lower electrode 21 and transistors constituting a controller, of the solid-state imaging device 1 illustrated in FIG. 1. The solid-state imaging device 1 constitutes, for example, a solid-state imaging device or an electronic apparatus (for example, camera 9 (see FIG. 37)) including the solid-state imaging device. The solid-state imaging device is, for example, a CMOS image sensor or the like used in the electronic apparatus, such as a digital still camera or a video camera.

(1-1. Configuration of Solid-State Imaging Device)

The solid-state imaging device 1 is of a so-called vertical-direction spectroscopic type. The solid-state imaging device 1 includes, for example, one organic photoelectric transducer 20 and two inorganic photoelectric transducers 32B and 32R, which are stacked in the vertical direction. The organic photoelectric transducer 20 is disposed on a first surface (rear surface) 30A side of a semiconductor substrate 30. The inorganic photoelectric transducers 32B and 32R are buried in the semiconductor substrate 30 and stacked in the thickness direction of the semiconductor substrate 30. The organic photoelectric transducer 20 includes a photoelectric conversion layer 22 disposed between a lower electrode 21 (first electrode) and an upper electrode 23 (second electrode) that are opposed to the photoelectric conversion layer 22. The photoelectric conversion layer 22 is formed of an organic material. The photoelectric conversion layer 22 includes a p-type semiconductor and an n-type semiconductor. The inside of the layer has a bulk heterojunction structure. The bulk heterojunction structure is a p/n junction plane formed by mixing the p-type semiconductor and the n-type semiconductor.

The lower electrode 21 of the solid-state imaging device 1 according to this embodiment includes a plurality of electrodes (a readout electrode 21A, an accumulation electrode 21B, and a barrier adjustment electrode 21C). The lower electrode 21 is disposed on a side of the photoelectric conversion layer 22 opposite to a light incident side S1. In this embodiment, a voltage applier 50 (voltage applying means) is further provided. The voltage applier 50 is able to variably control the voltage applied to the barrier adjustment electrode 21C disposed between the readout electrode 21A and the accumulation electrode 21B.

The organic photoelectric transducer 20 and the inorganic photoelectric transducers 32B and 32R selectively detect light in different wavelength bands and perform photoelectric conversion. In specific, the organic photoelectric transducer 20 acquires a green (G) color signal. The inorganic photoelectric transducers 32B and 32R respectively acquire a blue (B) color signal and a red (R) color signal based on a difference in absorption coefficients. In this way, the solid-state imaging device 1 is able to acquire multiple types of color signals at one pixel without use of a color filter.

Note that, this embodiment describes a case in which electrons among the pairs of electrons and holes (electrode-hole pairs) generated through photoelectric conversion are read out as signal charges (in a case in which the n-type semiconductor region is to be the photoelectric conversion layer). In the drawings, a "+(plus)" sign added to the "p" and "n" indicates a high p-type or n-type impurity concentration. A "++" sign indicates that the p-type or n-type impurity concentration is higher than that indicated by the "+" sign.

The second surface (front surface) 30B of the semiconductor substrate 30 is provided with, for example, floating diffusions (floating diffusion layers) FD1 (a region 36B in the semiconductor substrate 30), FD2 (a region 37C in the semiconductor substrate 30), and FD3 (a region 38C in the semiconductor substrate 30), transfer transistors Tr2 and Tr3, an amplifier transistor (modulation device) AMP, a reset transistor RST, a selection transistor SEL, and a multilayer wiring 40. The multilayer wiring 40 includes, for example, wiring layers 41, 42, and 43 stacked inside an insulating layer 44.

Note that, in the drawings, the first surface 30A side of the semiconductor substrate 30 is referred to as a light incident side S1, and the second surface 30B side is referred to as a wiring layer side S2.

The organic photoelectric transducer 20 includes, for example, the lower electrode 21, the photoelectric conversion layer 22, and the upper electrode 23, stacked in this order from the first surface 30A side of the semiconductor substrate 30. Furthermore, an insulating layer 27 is disposed between the lower electrode 21 and the photoelectric conversion layer 22. The lower electrode 21 is, for example, separately formed for each unit pixel P. The lower electrode 21 also includes the readout electrode 21A, the accumulation electrode 21B, and the barrier adjustment electrode 21C, which are separated from each other by the insulating layer 27, as described in detail below. Note that a portion of the lower electrode 21 (for example, the readout electrode 21A) may be shared among adjacent unit pixels P, as illustrated in FIG. 2.

The readout electrode 21A of the lower electrode 21 is electrically coupled with the photoelectric conversion layer 22 via an opening 27H provided in the insulating layer 27. FIG. 1 illustrates an example in which the photoelectric conversion layer 22 and the upper electrode 23 are separately formed for each solid-state imaging device 1. However, the photoelectric conversion layer 22 and the upper electrode 23 may be provided as, for example, a continuous layer shared by a plurality of solid-state imaging devices 1. For example, a layer including fixed charges (a fixed charge layer) 24, a dielectric layer 25 having insulation properties, and an interlayer insulating layer 26 are disposed between the first surface 30A of the semiconductor substrate 30 and the lower electrode 21. A protective layer 28 is disposed on the upper electrode 23. A light-shielding film 51 is disposed inside the protective layer 28, for example, above the readout electrode 21A. The light-shielding film 51A may be disposed to cover the region of the readout electrode 21A in direction contact with at least the photoelectric conversion layer 22, without overlapping at least the accumulation electrode 21B. It is desirable that the light-shielding film 51A be slightly larger than, for example, the readout electrode 21A disposed in the same layer as the accumulation electrode 21B. A flattening layer (not illustrated) and optical members, such as an on-chip lens 52, are disposed above the protective layer 28.

A through-electrode 34 extends between the first surface 30A and the second surface 30B of the semiconductor substrate 30. The organic photoelectric transducer 20 is coupled with the gate Gamp of the amplifier transistor AMP and one of source/drain regions 36B of the reset transistor RST (reset transistor Tr1*rst*) via the through-electrode 34. The reset transistor RST also serves as the floating diffusion FD1. In this way, the solid-state imaging device 1 is able to satisfactorily transfer the signal charges generated at the organic photoelectric transducer 20 on the first surface 30A side of the semiconductor substrate 30 to the second surface 30B side of the semiconductor substrate 30 through the through-electrode 34, so as to enhance the properties.

The lower end of the through-electrode 34 is coupled with a coupler 41A inside the wiring layer 41. The coupler 41A and the gate Gamp of the amplifier transistor AMP are coupled via a lower first contact 45. The coupler 41A and the floating diffusion FD1 (region 36B) are coupled via, for example, a lower second contact 46. The upper end of the through-electrode 34 is coupled with the readout electrode 21A via, for example, a pad 39A and an upper first contact 29A.

The through-electrode 34 functions as a connector of the organic photoelectric transducer 20 and the gate Gamp of the amplifier transistor AMP, and the organic photoelectric transducer 20 and the floating diffusion FD1. The through-electrode 34 also serves as a transfer path of the charges (here which are electrons) generated at the organic photoelectric transducer 20. The through-electrode 34 may be disposed on, for example, the organic photoelectric transducers 20 disposed on each unit pixel P, as illustrated in FIG. 1. Furthermore, in the case where the readout electrode 21A is shared by adjacent unit pixels P, one readout electrode 21A may be provided, for example, for every four adjacent unit pixels P, as illustrated in FIG. 2, for example.

A reset gate Grst of the reset transistor RST is disposed adjacent to the floating diffusion FD1 (one of the source/drain regions 36B of the reset transistor RST). In this way, it is possible to reset the charges accumulated in the floating diffusion FD1 by the reset transistor RST.

In the solid-state imaging device 1 of this embodiment, light entering the organic photoelectric transducer 20 from the upper electrode 23 side is absorbed at the photoelectric conversion layer 22. The excitons generated in this way move to the interface of the electron donor and the electron acceptor of the photoelectric conversion layer 22 and are subjected to exciton separation, i.e., the excitons disassociate into electrodes and holes. The charges (electrons and holes) generated here are transported to different electrodes by diffusion due to a concentration difference in the carriers and an internal electric field caused by a difference in the work functions of the anode (here the upper electrode 23) and the cathode (here, the lower electrode 21). The transported charges are detected as a photocurrent. Furthermore, an electric potential is so applied across the lower electrode 21 and the upper electrode 23 as to control the transport direction of the electrons and the holes.

The configuration and materials of the components will now be described.

The organic photoelectric transducer 20 is an organic photoelectric conversion device that absorbs green light corresponding to a portion or the entire wavelength band of a selected wavelength band (for example, within the range of 450 nm to 650 nm) and thereby generates electron-hole pairs.

As described above, the lower electrode 21 includes the readout electrode 21A, the accumulation electrode 21B, and the barrier adjustment electrode 21C, which are independent from each other.

The readout electrode 21A transfers the signal charges generated inside the photoelectric conversion layer 22 to the floating diffusion FD1. The readout electrode 21A is coupled to the floating diffusion FD1 via, for example, the upper first contact 29A, the pad 39A, the through-electrode 34, the coupler 41A, and the lower second contact 46. Furthermore, in this embodiment, the readout electrode 21A also serves as a discharge electrode that discharges the charges (electrons) accumulated, for example, during the charge non-accumulation period.

The accumulation electrode 21B accumulates, inside the photoelectric conversion layer 22, the signal charges (electrons) among the charges generated inside the photoelectric conversion layer 22. The accumulation electrode 21B is disposed in a region facing and covering light-receiving surfaces of the inorganic photoelectric transducers 32B and 32R formed inside the semiconductor substrate 30. It is desirable that the accumulation electrode 21B be larger than the readout electrode 21A. It is thereby possible to accumulate many charges.

The barrier adjustment electrode 21C is disposed between the readout electrode 21A and the accumulation electrode 21B, as described above. The barrier adjustment electrode 21C adjusts the potential barrier of a region between the readout electrode 21A and the accumulation electrode 21B. The barrier adjustment electrode 21C is electrically coupled with, for example, the voltage applier 50, as illustrated in FIG. 3. Although details will be described below, the voltage applier 50 applies a voltage V8 during the charge non-accumulation period, and a voltage V9 (V9<V8) during the charge accumulation period. In this way, in the solid-state imaging device 1 according to this embodiment, the electric potential of the region between the readout electrode 21A and the accumulation electrode 21B is higher than that during the charge accumulation period, and thereby the potential barrier between the readout electrode 21A and the accumulation electrode 21B decreases. Therefore, the amount of charges accumulated on the accumulation electrode 21B during the charge non-accumulation period is limited, and thereby the potential difference between the lower electrode 21 (specifically, the accumulation electrode 21B) and the upper electrode 23 is maintained.

The lower electrode 21 includes an electrically conductive film having light transmittance. The lower electrode 21 includes, for example, indium tin oxide (ITO). Note that, as the constituent material of the lower electrode 21, a tin oxide ($SnO_2$)-based material to which a dopant is added or a zinc oxide-based material formed by adding a dopant to aluminum zinc oxide (ZnO) may be used, in addition to ITO. Examples of the zinc oxide-based material include aluminum zinc oxide (AZO) in which aluminum (Al) is included as a dopant, gallium zinc oxide (GZO) in which gallium (Ga) is included, and indium zinc oxide (IZO) in which indium (In) is included. In addition, CuI, $InSbO_4$, ZnMgO, $CuInO_2$, $MgIN_2O_4$, CdO, $ZnSnO_3$ or the like may be also used.

The photoelectric conversion layer 22 converts light energy to electrical energy. The photoelectric conversion layer 22 includes, for example, two or more types of organic semiconductor materials (p-type semiconductor materials and n-type semiconductor materials) that each function as a p-type semiconductor or an n-type semiconductor. The photoelectric conversion layer 22 has, inside the layer, a junction plane (p/n junction plane) of the p-type semiconductor material and the n-type semiconductor material. The p-type semiconductor relatively functions as an electron donor (donor). The n-type semiconductor relatively functions as an electron acceptor (acceptor). The photoelectric conversion layer 22 provides a field for disassociating excitons generated during light absorption into electrons and holes. Specifically, the excitons disassociate into electrons and holes at the interface (p/n junction plane) of the electron donor and the electron acceptor.

The photoelectric conversion layer 22 may include, in addition to the p-type semiconductor material and the n-type semiconductor material, an organic semiconductor material (so-called colorant material) that photoelectrically converts light in a predetermined wavelength band while transmitting light of other wavelength bands. In the case where the photoelectric conversion layer 22 includes three types of organic semiconductor materials, i.e., the p-type semiconductor material, the n-type semiconductor material, and a dye material, the p-type semiconductor material and the n-type semiconductor material are desirably materials that have light transmittance in a visible range (for example, between 450 nm and 800 nm). The thickness of the photoelectric conversion layer 22 is, for example, within the range of 50 nm to 500 nm.

Examples of the organic semiconductor materials constituting the photoelectric conversion layer 22 include quinacridone, boron chloride subphthalocyanine, pentacene, benzothienobenzothiophene, fullerene, and derivatives thereof. The photoelectric conversion layer 22 includes a combination of two or more types of the above-mentioned organic semiconductor materials. The above-mentioned organic semiconductor materials function as a p-type semiconductor or an n-type semiconductor depending on the combination.

Note that the organic semiconductor materials constituting the photoelectric conversion layer 22 are not particularly limited. Besides the above-mentioned organic semiconductor materials, any one of naphthalene, anthracene, phenanthrene, tetracene, pyrene, perylene, and fluoranthene or derivatives thereof is suitably used. Alternatively, it is sufficient to use polymers such as phenylenevinylene, fluorene, carbazole, indole, pyrene, pyrrole, picoline, thiophene, acetylene, and diacetylene, or derivatives thereof. In addition, it is possible to suitably use metal complex dyes; cyanine dyes; merocyanine dyes; phenylxanthene dyes; triphenylmethane dyes; rhodacyanine dyes; xanthene dyes; macrocyclic azaanulene dyes; azulene dyes; naphthoquinones; anthraquinone dyes; a fused polycyclic aromatic compound such as anthracene and pyrene and a chain compound in which an aromatic ring or a heterocyclic compound is fused; two nitrogen-containing heterocycles, such as quinoline, benzothiazole, and benzoxazole, having a squarylium group and a cloconituximetine group as a linking chain; or cyanine-like dyes linked by a squarylium group and a cloconitucumetine group, etc. Note that the metal complex dye is preferably, but not limited to, a dithiol metal complex dye, a metal phthalocyanine dye, a metal porphyrin dye, or a ruthenium complex dye.

Other layers may be disposed between the photoelectric conversion layer 22 and the lower electrode 21 (specifically, between the photoelectric conversion layer 22 and the insulating layer 27), and between the photoelectric conversion layer 22 and the upper electrode 23. It is preferable to provide a semiconductor layer, for example, below the photoelectric conversion layer 22, in specific, between the insulating layer 27 and the photoelectric conversion layer 22. In such a case, the readout electrode 21A is electrically coupled with the photoelectric conversion layer 22 via the semiconductor layer. It is preferable that the semiconductor layer have charge mobility higher than that of the photoelectric conversion layer 22 and include a material having a large band gap. Examples of such a material include compound semiconductor materials such as IGZO, transition metal dichalcogenides, silicon carbide, diamond, graphene, carbon nanotubes, fused polycyclic hydrocarbon compounds, and fused heterocyclic compounds. A semiconductor layer constituting the above-mentioned materials is disposed in the lower portion of the photoelectric conversion layer 22. It is thereby possible to prevent recombination of the charges during the charge accumulation period, and increase the transfer efficiency.

In addition, it is sufficient to stack, in order from the lower electrode 21 side, an undercoat layer, a hole transport layer, an electron blocking film, a photoelectric conversion layer 22, a hole blocking film, a buffer film, an electron transport layer, a work-function adjustment film, etc.

The upper electrode 23 includes an electrically conductive film having light transmittance, like the lower electrode 21. The upper electrode 23 may be divided to correspond the respective unit pixels P or as an electrode shared by the unit pixels P. The thickness of the upper electrode 23 is, for example, within the range of 10 nm to 200 nm.

The fixed charge layer 24 may be a film having positive fixed charges or a film having negative fixed charges. Examples of a material of the film having a negative fixed charges include hafnium oxide, aluminum oxide, zirconium oxide, tantalum oxide, and titanium oxide. Alternatively, other materials be used, such as lanthanum oxide, praseodymium oxide, cerium oxide, neodymium oxide, promethium oxide, samarium oxide, europium oxide, gadolinium oxide, terbium oxide, dysprosium oxide, hole mium oxide, thulium oxide, ytterbium oxide, ruthenium oxide, yttrium oxide, aluminum nitride film, hafnium oxynitride film, or aluminum oxynitride film.

The fixed charge layer 24 may be a laminate of two or more types of films. In this way, in the case where the fixed charge layer 24 is, for example, a film having negative fixed charges, it is possible to further enhance the function of a hole accumulation layer.

The material of the dielectric layer 25 is not particularly limited. The dielectric layer 25 may include, for example, a silicon oxide film, TEOS, a silicon nitride film, a silicon oxynitride film, or the like.

The interlayer insulating layer 26 includes, for example, a single layer film including one type of material among silicon oxide, silicon nitride, silicon oxynitride (SiON), and the like, or a multilayer film including two or more types of these materials.

The insulating layer 27 electrically separates the photoelectric conversion layer 22 from the accumulation electrode 21B and the barrier adjustment electrode 21C. The insulating layer 27 is so disposed, for example, on the interlayer insulating layer 26 as to cover the lower electrode 21. Furthermore, the insulating layer 27 has an opening 27H above the readout electrode 21A of the lower electrode 21. The readout electrode 21A and the photoelectric conversion layer 22 are electrically coupled through the opening 27H. It is possible to form the insulating layer 27, for example, with the same material of the interlayer insulating layer 26. The insulating layer 27 includes, for example, a single layer film including one type of material among silicon oxide, silicon nitride, and silicon oxynitride (SiON), or a multilayer film including two or more of the materials. The thickness of the insulating layer 27 is, for example, within the range of 20 nm to 500 nm.

The protective layer 28 includes, for example, a material having light transmittance. The protective layer 28 includes, for example, a single layer film including any type of material, such as silicon oxide, silicon nitride and silicon oxynitride (SiON), or a multilayer film including two or more types of material. The thickness of the protective layer 28 is, for example, between 100 nm and 30000 nm.

The semiconductor substrate 30 includes, for example, an n-type silicon (S1) substrate. The semiconductor substrate 30 has a p-well 31 in a predetermined region. The second surface 30B of the p-well 31 is provided with the above-described transfer transistors Tr2 and Tr3, the amplifier transistor AMP, the reset transistor RST, the selection transistor SEL, etc. Furthermore, a peripheral circuit (not illustrated) including a logic circuit, etc., is disposed in the periphery of the semiconductor substrate 30.

The reset transistor RST (reset transistor Tr1*rst*) resets the charges transferred from the organic photoelectric transducer 20 to the floating diffusion FD1. The reset transistor RST includes, for example, an MOS transistor. In specific, the reset transistor Tr1*rst* includes a reset gate Grst, a channel formation region 36A, and source/drain regions 36B and 36C. The reset gate Grst is coupled with a reset line RST1. One of the source/drain regions 36B of the reset transistor Tr1*rst* also serves as the floating diffusion FD1. The other one of the source/drain regions 36C of the reset transistor Tr1*rst* is coupled with a power source VDD.

The amplifier transistor AMP is a modulation device that modulates the amount of charges generated at the organic photoelectric transducer 20 to a voltage. The amplifier transistor AMP includes, for example, an MOS transistor. In specific, the amplifier transistor AMP includes a gate Gamp, a channel formation region 35A, and source/drain regions 35B and 35C. The gate Gamp is coupled with the readout electrode 21A and one of the source/drain regions 36B (floating diffusion FD1) of the reset transistor Tr1*rst* via the lower first contact 45, the coupler 41A, the lower second contact 46, the through-electrode 34, etc. Furthermore, the one of the source/drain regions 35B shares a region with the other one of the source/drain regions 36C of the reset transistor Tr1*rst* and is coupled with the power source VDD.

The selection transistor SEL (selection transistor TR1*sel*) includes a gate Gsel, a channel formation region 34A, and source/drain regions 34B and 34C. The gate Gsel is coupled with a selection line SEL1. Furthermore, one of the source/drain regions 34B shares a region with the other one of the source/drain regions 35C of the amplifier transistor AMP. The other one of the source/drain regions 35C is coupled with a signal line (data output line) VSL1.

The inorganic photoelectric transducers 32B and 32R each have a pn junction in a predetermined region of the semiconductor substrate 30. The inorganic photoelectric transducers 32B and 32R are able to disperse light in the vertical direction through use of the difference in the wavelength of absorbed light depending on the entering depth of the light in the silicon substrate. The inorganic photoelectric transducer 32B selectively detects blue light and accumulates signal charges corresponding to the blue color. The inorganic photoelectric transducer 32B is disposed at a depth that enables efficient photoelectric conversion of blue light. The inorganic photoelectric transducer 32R selectively detects red light and accumulates signal charges corresponding to the red color. The inorganic photoelectric transducer 32R is disposed at a depth that enables efficient photoelectric conversion of red light. Note that the blue (B) color is a color corresponding the wavelength band, for example, within the range of 450 nm to 495 nm. The red (R) color corresponding to the wavelength band, for example, within the range of 620 nm to 750 nm. The inorganic photoelectric transducers 32B and 32R only have to be able to detect some or all the light in the respective wavelength bands.

The inorganic photoelectric transducer 32B includes, for example, a p+ region and an n region. The p+ region serves as a hole accumulation layer. The n region serves as an electron accumulation layer. The inorganic photoelectric transducer 32R includes, for example, a p+ region and an n region (has a p-n-p lamination structure). The p+ region serves as a hole accumulation layer. The n region serves as an electron accumulation layer. The n region of the inorganic photoelectric transducer 32B is coupled with a vertical-type transfer transistor Tr2. The p+ region of the inorganic photoelectric transducer 32B bends along the transfer transistor Tr2 and continues to the p+ region of the inorganic photoelectric transducer 32R.

The transfer transistor Tr2 (transfer transistor TR2*trs*) transfers signal charges (which are electrons here) corresponding to the blue color generated and accumulated at the inorganic photoelectric transducer 32B, to the floating diffusion FD2. The inorganic photoelectric transducer 32B is formed at a deep position from the second surface 30B of the semiconductor substrate 30. Therefore, preferably, the transfer transistor TR2*trs* of the inorganic photoelectric transducer 32B includes a vertical-type transistor. Furthermore, the transfer transistor TR2*trs* is coupled with a transfer gate line TG2. Furthermore, the floating diffusion FD2 is disposed in a region 37C near the gate Gtrs2 of the transfer transistor TR2*trs*. The charges accumulated in the inorganic photoelectric transducer 32B are read out to the floating diffusion FD2 through a transfer channel formed along the gate Gtrs2.

The transfer transistor Tr3 (transfer transistor TR3*trs*) transfers the signal charges (which are electrons here) corresponding to the red color generated and accumulated at the inorganic photoelectric transducer 32R to the floating diffusion FD3. The transfer transistor Tr3 includes, for example, an MOS transistor. Furthermore, the transfer transistor TR3*trs* is coupled with a transfer gate line TG3. Furthermore, the floating diffusion FD3 is disposed in a region 38C near the gate Gtrs3 of the transfer transistor TR3*trs*. The charges accumulated in the inorganic photoelectric transducer 32R are read out to the floating diffusion FD3 through a transfer channel formed along the gate Gtrs3.

The second surface 30B side of the semiconductor substrate 30 is further provided with a reset transistor TR2*rst*, an amplifier transistor TR2*amp*, and a selection transistor TR2*sel*, which constitute a controller of the inorganic photoelectric transducer 32B. There are further provided a reset transistor TR3*rst*, an amplifier transistor TR3*amp*, and a selection transistor TR3*sel*, which constitute a controller of the inorganic photoelectric transducer 32R.

The reset transistor TR2*rst* includes a gate, a channel formation region, and source/drain regions. The gate of the reset transistor TR2*rst* is coupled with a reset line RST2. One of the source/drain regions of the reset transistor TR2*rst* is coupled with the power source VDD. The other one of the source/drain regions of the reset transistor TR2*rst* also serves as the floating diffusion FD2.

The amplifier transistor TR2*amp* includes a gate, a channel formation region, and source/drain regions. The gate is coupled with the other one of the source/drain regions (floating diffusion FD2) of the reset transistor TR2*rst*. Furthermore, one of the source/drain regions of the amplifier transistor TR2*amp* shares a region with the one of the source/drain regions of the reset transistor TR2*rst* and is coupled with the power source VDD.

The selection transistor TR2*sel* includes a gate, a channel formation region, and source/drain regions. The gate is coupled with a selection line SEL2. Furthermore, one of the source/drain regions of the selection transistor TR2*sel* shares a region with the other one of the source/drain regions of the amplifier transistor TR2*amp*. The other one of the source/drain regions of the selection transistor TR2*sel* is coupled with a signal line (data output line) VSL2.

The reset transistor TR3*rst* includes a gate, a channel formation region, and source/drain regions. The gate of the reset transistor TR3*rst* is coupled with a reset line RST3. One of the source/drain regions of the reset transistor TR3*rst* is coupled with the power source VDD. The other one of the source/drain regions of the reset transistor TR3*rst* also serves as the floating diffusion FD3.

The amplifier transistor TR3*amp* includes a gate, a channel formation region, and source/drain regions. The gate is coupled with the other one of the source/drain regions (floating diffusion FD3) of the reset transistor TR3*rst*. Furthermore, one of the source/drain regions of the amplifier transistor TR3*amp* shares a region with one of the source/drain regions of the reset transistor TR3*rst* and is coupled with the power source VDD.

The selection transistor TR3*sel* includes a gate, a channel formation region, and source/drain regions. The gate is coupled with a selection line SEL3. Furthermore, one of the source/drain regions of the selection transistor TR3*sel* shares a region with the other one of the source/drain regions of the amplifier transistor TR3*amp*. The other one of the source/drain regions of the selection transistor TR3*sel* is coupled with a signal line (data output line) VSL3.

The reset lines RST1, RST2, and RST3, the selection lines SEL1, SEL2, and SEL3, the transfer gate lines TG2 and TG3 are each coupled with a vertical driving circuit 112. The vertical driving circuit 112 constitutes a driving circuit. The signal lines (data output lines) VSL1, VSL2, and VSL3 are coupled with a column signal processing circuit 113. The column signal processing circuit 113 constitutes a driving circuit.

The lower first contact 45, the lower second contact 46, the upper first contact 29A, the upper second contact 29B, and the upper third contact 29C include, for example, a doped silicon material or a metal material. An example of the dopes silicon material includes phosphorus doped amorphous silicon (PDAS). Examples of the metal material include aluminum (Al), tungsten (W), titanium (Ti), cobalt (Co), hafnium (Hf), and tantalum (Ta).

(1-2. Method of Producing Solid-State Imaging Device)

It is possible to produce the solid-state imaging device 1 according to this embodiment, for example, as follows.

FIGS. 5 to 9 illustrate the sequential steps of a method of producing a solid-state image-pick device 1. First, a first electrically-conductive well is formed inside a semiconductor substrate 30, as illustrated in FIG. 5. The first electrically-conductive well is, for example, a p-well 31. Second electrically-conductive (e.g., n-type) inorganic photoelectric transducers 32B and 32R are formed in the p-well 31. A +p region is formed near a first surface 30A of the semiconductor substrate 30.

A second surface 30B of the semiconductor substrate 30 is provided with, for example, n+ regions that are to serve as the floating diffusions FD1, FD2, and FD3, as also illustrated in FIG. 5. A gate wiring layer 47 is then formed. The gate wiring layer 47 includes respective gates of the gate insulating layer 33, the transfer transistor Tr2, the transfer transistor Tr3, the selection transistor SEL, the amplifier transistor AMP, and the reset transistor RST. In this way, the transfer transistor Tr2, the transfer transistor Tr3, the selection transistor SEL, the amplifier transistor AMP, and the reset transistor RST are formed. Furthermore, a multilayer wiring 40 is formed on the second surface 30B of the semiconductor substrate 30. The multilayer wiring 40 includes wiring layers 41 to 43 and an insulating layer 44. The wiring layers 41 to 43 include a lower first contact 45, a lower second contact 46, and a coupler 41A.

As a substrate of the semiconductor substrate 30, a silicon on insulator (SOI) substrate is used. The SOI substrate is a laminate of, for example, a semiconductor substrate 30, a buried oxide film (not illustrated), and a holding substrate (not illustrated). The buried oxide film and the holding substrate are bonded to the first surface 30A of the semiconductor substrate 30, although not illustrated in FIG. 5. After ions are injected, annealing is performed.

Subsequently, a support substrate (not illustrated) or another semiconductor substrate or the like are bonded to the second surface 30B side (multilayer wiring 40 side) of the semiconductor substrate 30. The semiconductor substrate 30 is then flipped. Subsequently, the semiconductor substrate 30 is so separated from the buried oxide film of the SOI substrate and the holding substrate as to expose the first surface 30A of the semiconductor substrate 30. It is possible to perform the above-described steps through a technique used in a typical CMOS process, such as ion injection and chemical vapor deposition (CVD).

The semiconductor substrate 30 is then processed from the first surface 30A side by, for example, dry etching, so as to form, for example, an annular opening 34H, as illustrated in FIG. 6. The opening 34H penetrates the semiconductor substrate 30 from the first surface 30A to the second surface 30B and has a depth that reaches, for example, the coupler 41A, as illustrated in FIG. 6.

Subsequently, a negative fixed charge layer 24, for example, is formed on the first surface 30A of the semiconductor substrate 30 and a side surface of the opening 34H. The negative fixed charge layer 24 may be a laminate of two or more types of films. It is thereby possible to further enhance the function of a hole accumulation layer. After the negative fixed charge layer 24 is formed, a dielectric layer 25 is formed. Subsequently, pads 39A, 39B, and 39C are formed at a predetermined position on the dielectric layer 25. An interlayer insulating layer 26 is thereafter formed on the dielectric layer 25 and the pads 39A, 39B, and 39C. Subsequently, the interlayer insulating layer 26 is formed. The surface of the interlayer insulating layer 26 is thereafter flattened, for example, through chemical mechanical polishing (CMP).

Subsequently, openings 26H1, 26H2, and 26H3 are formed in an electrically-conductive film 21*b* above the pads 39A, 39B, and 39C, respectively. The openings 26H1, 26H2, and 26H3 are thereafter filled with, an electrically-conductive material, such as Al, so as to form an upper first contact 29A, an upper second contact 29B, and an upper third contact 29C, as illustrated in FIG. 7.

Subsequently, an electrically-conductive film 21*x* is formed on the interlayer insulating layer 26. A photoresist PR is thereafter formed at a predetermined position of the electrically-conductive film 21*x* (for example, on the pad 39A, the pad 39B, and the pad 39C), as illustrated in FIG. 8. A readout electrode A, an accumulation electrode 21B, and a barrier adjustment electrode 21C, illustrated in FIG. 9, are thereafter patterned through etching and removal of the photoresist PR.

An insulating layer 27 is then formed on the interlayer insulating layer 26, the readout electrode 21A, the accumulation electrode 21B, and the upper third contact 29C. An opening 27H is thereafter provided on the readout electrode 21A. A photoelectric conversion layer 22, an upper electrode 23, a protective layer 28, and a light-shielding film 51 are thereafter formed on the interlayer insulating layer 26. Finally, optical members, such as a flattening layer, and an on-chip lens 52 are provided. As described above, the solid-state imaging device 1 illustrated in FIG. 1 is completed.

Note that, in the case where another organic layer (for example, an atom-blocking layer) is formed above or below the photoelectric conversion layer 22, as described above, it is desirable to continuously form the organic layer in a vacuum process (an in-situ vacuum process). Furthermore, the method of forming the photoelectric conversion layer 22 is not necessarily limited to a procedure using vacuum deposition, and other procedures, such as spin coating or printing, may be used.

(1-3. Method of Controlling Solid-State Imaging Device)

In the solid-state imaging device 1, when light enters the organic photoelectric transducer 20 through the on-chip lens 52, the light passes through the organic photoelectric transducer 20 and the inorganic photoelectric transducers 32B and 32R, in this order. As the light passes, photoelectric conversion is performed on the light of each of the green, blue, and red colors.

(Acquisition of Green Color Signal by Organic Photoelectric Transducer 20)

Among the light entering the solid-state imaging device 1, green light is first selectively detected (absorbed) and photoelectrically converted at the organic photoelectric transducer 20.

The organic photoelectric transducer 20 is coupled with the gate Gamp of the amplifier transistor AMP and the floating diffusion FD1 through the through-electrode 34. Therefore, the electrons (signal charges) of the electron-hole pairs generated at the organic photoelectric transducer 20 are drawn out of the lower electrode 21 side, transferred to the second surface 30B side of the semiconductor substrate 30 through the through-electrode 34, and accumulated in the floating diffusion FD1. At the same time, the amount of charges generated at the organic photoelectric transducer 20 is modulated to a voltage by the amplifier transistor AMP.

Furthermore, the reset gate Grst of the reset transistor RST is disposed adjacent to the floating diffusion FD1. In this way, the charges accumulated in the floating diffusion FD1 is reset by the reset transistor RST.

In this embodiment, the organic photoelectric transducer 20 is coupled not only with the amplifier transistor AMP but also the floating diffusion FD1 through the through-electrode 34. Therefore, it is possible to readily reset the charges accumulated in the floating diffusion FD1 by the reset transistor RST.

In contrast, in the case where the through-electrode 34 and the floating diffusion FD1 are not coupled, it is difficult to reset the charges accumulated in the floating diffusion FD1. Therefore, a large voltage is applied so as to draw the charges to the upper electrode 23 side. Therefore, there is a possibility of the photoelectric conversion layer 22 being damaged. Furthermore, a structure that enables reset in a short time causes an increase in dark noise that leads to a tradeoff. Therefore, it is difficult to employ such a structure.

FIG. 10 illustrates an example of voltage variation at an interface between a photoelectric conversion layer 122 and an insulating layer 127 disposed opposite to an accumulation electrode 121B of a typical solid-state imaging device (solid-state imaging device 100, see FIGS. 12A, 12B, and 12C, for example). For the solid-state imaging device 100, a charge accumulation period and a charge non-accumulation period constitute a single frame. During the charge accumulation period, charges are accumulated. The charge non-accumulation period is a period before the start of accumulation of signal charges. The solid-state imaging device 100 repeats the frames so as to acquire signals of the color light detected at the photoelectric conversion layer 122 disposed outside the semiconductor substrate (below a lower electrode 121, not illustrated), for example, as illustrated in FIGS. 12A, 12B, and 12C.

The typical solid-state imaging device 100 is of a long-time accumulation mode and a short-time accumulation mode. In the long-time accumulation mode, the charge accumulation period is longer than the charge non-accumulation period in a single frame, as illustrated in FIG. 10. In the short-time accumulation mode, the charge accumulation period is shorter than the charge non-accumulation period in a single frame, as illustrated in FIG. 11. In the typical solid-state imaging device 100, the voltage of the insulating layer 127 interface varies depending on the respective lengths of the charge accumulation period and the charge non-accumulation period, as illustrated in FIGS. 10 and 11. That is, the voltage of the interface of the insulating layer 127 fluctuates larger as the charge accumulation period and the charge non-accumulation period becomes longer.

FIGS. 12A, 12B, 12C, 13A, and 13B illustrate the electric potential of each region on the lower electrode 121 side at each of points (A) to (E) in the charge accumulation period and the charge non-accumulation period in the short-time accumulation mode.

During the charge non-accumulation period and the charge accumulation period of the solid-state imaging device 100, voltages V5 and V6 (V5=V6) are respectively applied to the readout electrode 121A and the accumulation electrode 121B from the driving circuit. When light enters the photoelectric conversion layer 122 during the charge non-accumulation period and the charge accumulation period, the signal charges photoelectrically converted in the photoelectric conversion layer 122 are attracted to the accumulation electrode 121B. At this time, potential barriers are formed in a region between the readout electrode 121A and the accumulation electrode 121B, and a region on a side opposite to the readout electrode 121A. The signal charges (electrons) are thereby accumulated at the interface of the insulating layer 127 facing the accumulation electrode 121B during the charge non-accumulation period (A) and the charge accumulation period (D), as illustrated in FIGS. 12A and 13A. At this time, the voltage of the interface of the insulating layer 127 fluctuates to the negative direction (for example, the direction indicated by an arrow on the vertical axis in FIG. 11) in accordance with the amount of photoelectric conversion, i.e., the mount of signal charges accumulated at the interface of the insulating layer 127 (in periods (A) and (D) in FIG. 11).

At a shutter timing (the (B) point in FIG. 11) at the switching of the charge non-accumulation period to the charge accumulation period, the voltage applied to the accumulation electrode 121B is varied (for example, the voltage V7 (V7>V6) is applied to the accumulation electrode 121B). In this way, the electric potential of the interface of the insulating layer 127 in the region facing the accumulation electrode 121B becomes higher than the potential barrier between the readout electrode 121A and the accumulation electrode 121B, as illustrated in FIG. 12B. The signal charges accumulated during the charge non-accumulation period thereby is discharged to a power voltage via the readout electrode 121A and a floating diffusion FD (not illustrated) coupled with the readout electrode 121A. A voltage V6 is thereafter applied to the accumulation electrode 121B. The electric potential of the interface of the insulating layer 127 in the region facing the accumulation electrode 121B thereby becomes lower than the potential barrier between the readout electrode 121A and the accumulation electrode 121B, as illustrated in FIG. 12C. That is, the voltage of the interface of the insulating layer 127 facing the accumulation electrode 121B is reset, as at the (C) point illustrated in FIG. 11.

At a readout timing at the switching of the charge accumulation period to the charge non-accumulation period, for example, the voltage V7 is applied to the accumulation electrode 121B, as at the shutter timing. In this way, the electric potential of the interface of the insulating layer 127 on the accumulation electrode 121B becomes higher than the potential barrier between the readout electrode 121A and the accumulation electrode 121B, as illustrated in FIG. 13B. The signal charges accumulated during the charge accumulation period thereby is transferred from the readout electrode 121A to the floating diffusion FD (not illustrated). The voltage V6 is thereafter applied to the accumulation electrode 121B. The voltage of the interface of the insulating layer 127 facing the accumulation electrode 121B is thereby reset, as at the (E) point illustrated in FIG. 11.

In the short-time accumulation mode, the charge non-accumulation period is long. Therefore, the amount of signal charges accumulated at the interface of the insulating layer 127 facing the accumulation electrode 121B is larger than that in the charge accumulation period, as illustrated in FIGS. 12A and 13A. In contrast, in the long-time accumulation mode, the amount of signal charges accumulated at the interface of the insulating layer 127 corresponding to the accumulation electrode 121B is smaller than that in the charge accumulation period (FIG. 13A).

Note that a predetermined voltage is always applied to the upper electrode 123 disposed opposite to the lower electrode 121 with the insulating layer 127 and the photoelectric conversion layer 122 disposed therebetween. Therefore, when the voltage at the interface of the insulating layer 127 fluctuates, the voltage applied to the photoelectric conversion layer 122 fluctuates. For example, during a dark time when no light enters the photoelectric conversion layer 122, photoelectric conversion does not occur. Therefore, the voltage of the interface of the insulating layer 127 does not fluctuate. Therefore, the photoelectric conversion layer 122 enters a state in which a large voltage (potential difference) is applied thereto.

In contrast, in the case where there is light entering the photoelectric conversion layer 122, the larger the amount of the incident light, and the longer the time of charges being accumulated, the voltage being applied to the photoelectric conversion layer 122 become smaller.

FIG. 14A illustrates the potential difference applied to the photoelectric conversion layer and the movement of the signal charges when the amount of accumulated charges in the solid-state imaging device 100 is small. FIG. 14B illustrates the potential difference applied to the photoelectric conversion layer and the movement of the signal charges when the amount of accumulated charges in the solid-state imaging device 100 is large. In the case of a small amount of incident light, the amount of charges accumulated in the photoelectric conversion layer 122 is small. Therefore, the electric field applied to the photoelectric conversion layer 122 is large, and the signal charges or electrons swiftly move from the upper electrode 123 side to the interface of the insulating layer 127, as illustrated in FIG. 14A. Therefore, the amount of charges in the photoelectric conversion layer 122 decreases. In contrast, in the case of a large amount of incident light, the amount of charges accumulated in the photoelectric conversion layer 122 is large. Therefore, the electric field applied to the photoelectric conversion layer 122 becomes small, and the signal charges in the photoelectric conversion layer 122 are not completely discharged, for example, during a reset operation timing, such as the shutter timing. As a result, the signal charges remain in the next frame, as illustrated in FIG. 14B. This turns into noise signals that generate afterimages. This problem becomes especially prominent in the short-time accumulation mode.

FIG. 15 illustrates a variation in voltage at an interface of the insulating layer 27 disposed opposite to the accumulation electrode 21B serving as a charge accumulator according to this embodiment. FIGS. 16A, 16B, 16C, 17A, and 17B illustrate electrical potentials of respective regions on the lower electrode 21 side at the respective points (A) to (E) during the charge accumulation period and the charge non-accumulation period illustrated in FIG. 15. The solid-state imaging device 1 according to this embodiment, as described above, includes the barrier adjustment electrode 21C between the readout electrode 21A and the accumulation electrode 21B. The solid-state imaging device 1 further includes a voltage applier 50 that variably controls the voltage applied to the barrier adjustment electrode 21C.

In the case where light enters the photoelectric conversion layer 122 of the solid-state imaging device 1, as in the above-described typical solid-state imaging device 100, signal charges photoelectric converted in the photoelectric conversion layer 22 during both the charge non-accumulation period and the charge accumulation period are accumulated at the interface of the insulating layer 27 disposed opposite to the accumulation electrode 21B. At this time, in this embodiment, a voltage V8 is applied from the voltage applier 50 to the barrier adjustment electrode 21C during the charge non-accumulation period, and a voltage V9 is applied during the charge accumulation period. Here, voltages V8 and V9 have the relationship V9<V8. In this way, a potential difference larger than that during the charge accumulation period is applied to the photoelectric conversion layer 22 between the readout electrode 21A and the accumulation electrode 21B during the charge non-accumulation period. That is, the potential barrier between the readout electrode 21A and the accumulation electrode 21B during the charge non-accumulation period becomes lower than the potential barrier between the readout electrode 21A and the accumulation electrode 21B during the charge accumulation period, as illustrated in FIGS. 16A and 17A. Therefore, the signal charges accumulated, by more than a predetermined amount, at the interface of the insulating layer 27 on the accumulation electrode 21B exceed the potential barrier between the readout electrode 21A and the accumulation electrode 21B and are discharged to the power source voltage via the readout electrode 21A and the floating diffusion FD1 coupled with the readout electrode 21A. That is, the signal charges exceeding a predetermined amount actively overflows.

At the shutter timing (the point (B) in FIG. 15 and FIG. 16B) when the charge non-accumulation period switches to the charge accumulation period, at the reset timing (the point (C) in FIG. 15 and FIG. 16C), and at the readout timing when the charge accumulation period switches to the charge non-accumulation period (the point (E) in FIG. 15 and FIG. 17B), the same operation as that performed by the above-described solid-state imaging device 100 is performed.

The voltage of the interface of the insulating layer 27 disposed opposite to the accumulation electrode 21B during the charge non-accumulation period of the solid-state imaging device 1 thereby falls to a predetermined value and thereafter maintains the predetermined value until the shutter timing, for example, as illustrated in the (A) period in FIG. 15. That is, the solid-state imaging device 1 according to this embodiment is able to maintain the amount of signal charges accumulated during the charge non-accumulation period at a predetermined amount or smaller, regardless of the long-time accumulation mode and the short-time accumulation mode. Therefore, it is possible to maintain the potential difference of the photoelectric conversion layer 22 between the lower electrode 21 and the upper electrode 23 during the charge non-accumulation period.

(1-3. Workings and Effects)

As described above, a solid-state imaging device including a photoelectric conversion film outside a semiconductor substrate typically accumulates charges in a floating diffusion FD formed inside the semiconductor substrate. In such a case, however, it is difficult to remove kCT noise generated by a reset operation of the FD. The kCT noise is one of the causes of the generation of afterimages.

In contrast, a solid-state imaging device has been developed that includes a vertical transfer path including a coupler, a potential barrier layer, and a charge accumulation layer, stacked on each other in the vertical direction inside the semiconductor substrate. In such a solid-state imaging device, signal charges generated at a photoelectric transducer are overflowed in the vertical direction, and thereby the kTC noise is reduced. In addition, the solid-state imaging device 100, such as that illustrated in FIGS. 12A, 12B, and 12C, etc., has been proposed that reads out signal charges. The solid-state imaging device 100 includes paired electrodes 121 and 123 disposed opposite to each other with a photoelectric conversion layer 122 disposed therebetween. One of the electrodes (the lower electrode 121 in FIGS. 12A, 12B, and 12C) includes two independent electrodes (a readout electrode 121A and an accumulation electrode 121B). The solid-state imaging device 100 reads out signal charges by accumulating signal charges generated by photoelectric conversion at the interface of an insulating layer 127 disposed on the accumulation electrode 121B, and transferring the accumulated signal charges to the readout electrode 121A coupled with a floating diffusion FD. The solid-state imaging device 100 is able to accumulate signal charges in the photoelectric conversion layer 122. Therefore, the solid-state imaging device 100 is able to perform correlated double sampling in which an output signal is the difference between the voltages of the floating diffusion FD before and after readout of the signal charges to the floating diffusion FD. In this way, it is possible to remove kTC noise. Furthermore, it is presumed that, with the solid-state imaging device 100, frame rate and const reduction are readily enhanced.

However, with the above-described solid-state imaging device 100, the larger the amount of incident light and the longer the period of charge accumulation, the smaller the voltage applied to the photoelectric conversion layer 122 becomes. Thus, the signal charges accumulated in the photoelectric conversion layer 122 during a reset operation are not fully discharged, and thereby are likely to impair the afterimage characteristics. Therefore, there is a need for enhanced afterimage characteristics in a solid-state imaging device having a photoelectric conversion film outside the semiconductor substrate.

In contrast, the solid-state imaging device 1 according to this embodiment includes a barrier adjustment electrode 21C disposed between the readout electrode 21A and the accumulation electrode 21B, which constitute a lower electrode 21. The solid-state imaging device 1 also includes a voltage applier 50 that is able to apply voltages different from each other to the barrier adjustment electrode 21C during the charge accumulation period and the charge non-accumulation period. In this way, a voltage larger than that during the charge accumulation period is applied to the barrier adjustment electrode 21C during the charge non-accumulation period. It is thereby possible to reduce the height of the potential barrier between the readout electrode 21A and the accumulation electrode 21B. Therefore, it is possible to actively discharge the signal charges accumulated during the charge non-accumulation period to a power source voltage via the readout electrode 21A and a floating diffusion FD1 coupled with the readout electrode 21A. Thus, it is possible to maintain the potential difference of the photoelectric conversion layer 22 during the charge non-accumulation period.

As described in this embodiment, the barrier adjustment electrode 21C is disposed between the readout electrode 21A and the accumulation electrode 21B, which constitute the lower electrode 21. A voltage applier 50 is further provided that is able to separately apply voltages different from each other to the barrier adjustment electrode 21C during the charge accumulation period and the charge non-accumulation period. A voltage larger than that during the charge accumulation period is applied to the barrier adjustment electrode 21C, for example, during the charge non-accumulation period. In this way, the signal charges accumulated during the charge non-accumulation period are actively discharged. Therefore, the potential difference of the photoelectric conversion layer 22 is maintained during the charge non-accumulation period. Thus, it is possible to enhance the afterimage characteristics.

A modification of the first embodiment and second to seventh embodiments of the disclosure will now be described. Note that, component corresponding to those of the solid-state imaging device 1 according to the first embodiment will be denoted by same reference signs, and descriptions thereof will be omitted.

2. Modification Examples

FIG. 18 schematically illustrates a cross-sectional configuration of a main part of a solid-state imaging device (solid-state imaging device 2) according to a modification of the disclosure. FIG. 19 is a schematic view of an example of a planar configuration of a lower electrode of the solid-state imaging device 2 illustrated in FIG. 18, the lower electrode being that adjacent to unit pixels P. Similar to that according to the first embodiment, the solid-state imaging device 2 is a solid-state imaging device or an electronic apparatus including the solid-state imaging device. The solid-state imaging device is, for example, a CMOS image sensor or the like used in the electronic apparatus, such as a digital still camera, a video camera, etc.

The solid-state imaging device 2 according to this modification differs from the solid-state imaging device 1 according to the first embodiment in that the solid-state imaging device 2 further includes a discharge electrode 61D, in addition to a readout electrode 61A and an accumulation electrode 61B, to serve as a lower electrode 61. The discharge electrode 61D is disposed, for example, on a side opposite to the readout electrode 61A with the accumulation electrode 61B disposed therebetween, and discharges the signal charges accumulated during a charge non-accumulation period. In this modification, a barrier adjustment electrode 61C (first barrier adjustment electrode) is disposed between the accumulation electrode 61B and the discharge electrode 61D.

In this way, the electrode that discharges signal charge accumulated during the charge non-accumulation period may also serve as the readout electrode 61A, as in the first embodiment, or a discharge electrode 61D dedicated to discharge may be provided. In the case where the discharge electrode 61D is disposed as in this modification, the barrier adjustment electrode 61C is disposed between the accumulation electrode 61B and the discharge electrode 61D. Thus, it is possible to enhance the afterimage characteristics, as in the first embodiment.

3. Second Embodiment

FIG. 20 schematically illustrates a cross-sectional configuration of a main part of a solid-state imaging device (solid-state imaging device 3) according to a second embodiment of the disclosure. Similar to that according to the first embodiment, etc., the solid-state imaging device 3 constitutes a solid-state imaging device or an electronic apparatus including the solid-state imaging device. The solid-state imaging device is, for example, a CMOS image sensor or the like used in the electronic apparatus, such as a digital still camera, a video camera, etc. The solid-state imaging device 3 according to this embodiment includes a barrier adjustment electrode 71E (second barrier adjustment electrode) disposed at a position adjacent to a readout electrode 71A on a side opposite to an accumulation electrode 71B. The readout electrode 71A also serves as a discharge electrode.

The barrier adjustment electrode 71E is disposed adjacent to the readout electrode 71A, as described above. In specific, the barrier adjustment electrode 71E is disposed at a position on a side of the readout electrode 71A opposite to the accumulation electrode 71B. The barrier adjustment electrode 71E is coupled with a voltage applier 50, like the above-described barrier adjustment electrodes 21C and 61C. In this embodiment, a high voltage (e.g., Ve≥Vb≥Va) is applied to from the voltage applier 50 to the barrier adjustment electrode 71E, for example, at the start of the charge non-accumulation period. In this way, the voltage applied to the readout electrode 71A and the electric potential between the readout electrode 71A and the accumulation electrode 71B during the charge non-accumulation period is increased by capacitive coupling. The potential barrier between the readout electrode 71A and the accumulation electrode 71B thereby decreases. Therefore, the signal charges accumulated during the charge non-accumulation period are actively discharged. The potential difference between an upper electrode 73 and an accumulation electrode 71B is thereby maintained during the charge accumulation period.

As described above, the barrier adjustment electrode 71E is disposed at a position adjacent to the readout electrode 71A on a side opposite to the accumulation electrode 71B. A high voltage is applied from the voltage applier 50 to the barrier adjustment electrode 71E, for example, at the start of the charge non-accumulation period. In this way, the potential barrier between the readout electrode 71A and the accumulation electrode 71B is decreased by capacitive coupling. The signal charges accumulated during the charge non-accumulation period are thereby actively discharged. That is, it is possible to enhance the afterimage characteristics, as in the first embodiment.

Note that, in the case where a separate discharge electrode is provided, as in the solid-state imaging device 2 according to the above-described modification, the barrier adjustment electrode 71E according to this embodiment is preferably disposed at a position adjacent to the discharge electrode on a side opposite to the accumulation electrode 71B. In this way, it is possible to achieve effects similar to the solid-state imaging device 3 according to this embodiment.

4. Third Embodiment

FIG. 21 schematically illustrates a cross-sectional configuration of a main part of a solid-state imaging device (solid-state imaging device 4) according to a third embodiment of the disclosure. Similar to that according to the first embodiment, etc., the solid-state imaging device 4 constitutes a solid-state imaging device or an electronic apparatus including the solid-state imaging device. The solid-state imaging device is, for example, a CMOS image sensor or the like used in the electronic apparatus, such as a digital still camera, a video camera, etc. The solid-state imaging device 4 according to this embodiment applies a reset voltage larger than that at the shutter timing after the charge non-accumulation period to the readout electrode 81A, for example, at a readout timing after the charge accumulation period.

FIG. 22A illustrates an electrical potential of each region on a lower electrode 81 side during a charge accumulation period. FIG. 22B illustrates an electrical potential of each region on the lower electrode 81 side during a charge non-accumulation period. In this embodiment, a reset voltage larger than that at the shutter timing after the charge non-accumulation period is applied to the readout electrode 81A, for example, at a readout timing after the charge accumulation period, as described above. In this way, the electric potential of the readout electrode 81A increases, and the electric potential of the interface of the insulating layer 87 between the readout electrode 81A and the accumulation electrode 81B is increased by the capacitive coupling. Therefore, the potential barrier between the readout electrode 81A and the accumulation electrode 81B decreases, and the signal charges accumulated in the charge non-accumulation period are thereby actively discharged, as illustrated in FIG. 22B. In this way, the potential difference between the upper electrode 83 and the accumulation electrode 81B is maintained during the charge non-accumulation period.

As described above, a reset voltage larger than that at the shutter timing after the charge non-accumulation period is applied to the readout electrode 81A, for example, at the readout timing after the charge accumulation period. The electric potential of the interface of the insulating layer 87 between the readout electrode 81A and the accumulation electrode 81B is thereby increased by capacitive coupling. That is, the potential barrier between the readout electrode 81A and the accumulation electrode 81B decreases, and the signal charges accumulated in the charge non-accumulation period are thereby actively discharged. That is, it is possible to enhance the afterimage characteristics, as in the first embodiment.

5. Fourth Embodiment

FIG. 23 schematically illustrates a cross-sectional configuration of a main part of a solid-state imaging device (solid-state imaging device 5) according to a fourth embodiment of the disclosure. Similar to that according to the first embodiment, etc., the solid-state imaging device 5 constitutes a solid-state imaging device or an electronic apparatus including the solid-state imaging device. The solid-state imaging device is, for example, a CMOS image sensor or the like used in the electronic apparatus, such as a digital still camera, a video camera, etc. The solid-state imaging device 5 according to this embodiment applies a voltage smaller than that applied during a charge accumulation period to an upper electrode 83, for example, during the charge non-accumulation period.

FIGS. 24A and 24B are diagrams illustrating the potential difference of a photoelectric conversion layer 82 between a lower electrode, i.e., an accumulation electrode 81B, and an upper electrode 83 during the charge non-accumulation period of the solid-state imaging device 5 according to this embodiment. FIG. 24A illustrates the voltage (potential difference) applied to the photoelectric conversion layer 82 and the movement of signal charges during the charge non-accumulation period; and FIG. 24B the potential difference applied to a photoelectric conversion layer and the movement of signal charges in the case where the amount of charges accumulated in the solid-state imaging device 100 illustrated in FIG. 14B, as a comparative example. In this embodiment, a voltage smaller than that applied to the upper electrode 83 during the charge accumulation period is applied to the upper electrode 83 during the charge non-accumulation period. The potential difference between the upper electrode 83 and the accumulation electrode 81B thereby is larger in comparison with the potential difference between the upper electrode 123 and the accumulation electrode 121B of the solid-state imaging device 100, as illustrated in FIG. 24A. In this way, a large voltage is applied across the upper electrode 83 and the accumulation electrode 81B during the charge non-accumulation period. The movement speed of the signal charges generated by photoelectric conversion from the upper electrode 83 side to the interface of the insulating layer 87 thereby increases. Furthermore, the potential difference applied to the photoelectric conversion layer 82 does not readily decrease even when the charge non-accumulation period is extended. Therefore, the signal charges are less likely to remain in the photoelectric conversion layer 122, for example, at the shutter timing after the charge non-accumulation period.

As described above, a voltage smaller than that applied during the charge accumulation period is applied to the upper electrode 83 during the charge non-accumulation period. The movement rate of the signal charges generated by photoelectric conversion from the upper electrode 83 side to the insulating layer 87 during the charge non-accumulation period thereby increases. Furthermore, the potential difference applied to the photoelectric conversion layer 82 does not readily decrease even when the charge non-accumulation period is extended. Therefore, the discharge efficiency of the signal charges in the photoelectric conversion layer 122 by a reset operation (for example, at the shutter timing after the charge non-accumulation period). It is thereby possible to enhance the afterimage characteristics, as in the first embodiment.

6. Fifth Embodiment

FIG. 25 schematically illustrates a cross-sectional configuration of a main part of a solid-state imaging device (solid-state imaging device 6) according to a fifth embodiment of the disclosure. FIG. 26 illustrates a variation in the voltage of an interface of an insulating layer 87 facing an accumulation electrode 82B serving as a charge accumulator of the solid-state imaging device 6. Similar to that according to the first embodiment, etc., the solid-state imaging device 6 constitutes a solid-state imaging device or an electronic apparatus including the solid-state imaging device. The solid-state imaging device is, for example, a CMOS image sensor or the like used in the electronic apparatus, such as a digital still camera, a video camera, etc. The solid-state imaging device 6 according to this embodiment performs a reset operation multiple times during a charge non-accumulation period, as illustrated in FIG. 26.

As illustrated in FIG. 26, the reset operation is performed multiple times during the charge non-accumulation period so as to discharges (pre-shutter), during every rest operation, the signal charge accumulated at the interface of the insulating layer 87 corresponding to an accumulation electrode 81B to a power supply voltage via a readout electrode 81A and a floating diffusion FD1 coupled with the readout electrode 81A. In this way, the electric potential of the interface of the insulating layer 87 is decreased during the charge non-accumulation period. The signal charges are thereby less likely to remain in the photoelectric conversion layer 82 during the reset operations. That is, it is possible to enhance the afterimage characteristics, as in the first embodiment.

7. Sixth Embodiment

FIG. 27 schematically illustrates a cross-sectional configuration of a main part of a solid-state imaging device (solid-state imaging device 7) according to a sixth embodiment of the disclosure. Similar to that according to the first embodiment, etc., the solid-state imaging device 7 constitutes a solid-state imaging device or an electronic apparatus including the solid-state imaging device. The solid-state imaging device is, for example, a CMOS image sensor or the like used in the electronic apparatus, such as a digital still camera, a video camera, etc. In the solid-state imaging device 7 according to this embodiment, a gate Grst of a reset transistor RST (reset transistor Tr1rst) is always turned on, for example, during a charge non-accumulation period.

FIG. 28 illustrates an electrical potential of a lower electrode 81 side during the charge non-accumulation period. In this embodiment, as described above, the gate Grst of the reset transistor Tr1rst is always turned on during the charge non-accumulation period. The electric potentials of a readout electrode 81A and a floating diffusion FD1 coupled with the readout electrode 81A are thereby fixed to the power supply voltage. In this way, the electric potential of the interface of an insulating layer 87 between the readout electrode 81A and an accumulation electrode 81B is increased by capacitive coupling in comparison with that when the floating diffusion FD1 is in a floating state. That is, the potential barrier between the readout electrode 81A and the accumulation electrode 81B decreases. Therefore, the signal charges accumulated during the charge non-accumulation period are actively discharged. The potential difference between an upper electrode 83 and an accumulation electrode 81B is thereby maintained during the charge non-accumulation period.

In this embodiment, as described above, the gate Grst of the reset transistor Tr1rst is always turned on, for example, during the charge non-accumulation period. The electric potential of the interface of the insulating layer 87 between the readout electrode 81A and the accumulation electrode 81B is thereby increased by capacitive coupling. In this way, the potential barrier between the readout electrode 81A and the accumulation electrode 81B decreases. The signal charges accumulated in the charge non-accumulation period are thereby actively discharged. That is, it is possible to enhance the afterimage characteristics, as in the first embodiment.

8. Seventh Embodiment

FIG. 29 schematically illustrates a cross-sectional configuration of a main part of a solid-state imaging device (solid-state imaging device 8A) according to a seventh embodiment of the disclosure. Similar to that according to the first embodiment, etc., the solid-state imaging device 8A constitutes a solid-state imaging device or an electronic apparatus including the solid-state imaging device. The solid-state imaging device is, for example, a CMOS image sensor or the like used in the electronic apparatus, such as a digital still camera, a video camera, etc. In the solid-state imaging device 8A according to this embodiment, an accumulation electrode 91B is divided into multiple segments (here, two segments).

FIG. 30 illustrates an electrical potential of each region on a lower electrode 91 side. In this embodiment, a lower electrode 91 includes a readout electrode 91A and an accumulation electrode 91B2, which are formed independently. The lower electrode 91 is further divided into two segments, for example, an accumulation electrode 91B1 and an accumulation electrode 91B2. Different voltages are respectively applied to the accumulation electrode 91B1 and the accumulation electrode 91B2. In specific, a voltage larger than that applied to the accumulation electrode 91B2 is applied to the accumulation electrode 91B1. The accumulation electrode 91B1 is disposed adjacent to the readout electrode 91A that reads out signal charges. Furthermore, the insulating layer 97 between the readout electrode 91A and the accumulation electrode 91B1 has a potential barrier that is larger than that on the accumulation electrode 91B2 and smaller than that on the accumulation electrode 91B1. That is, an electric potential relationship region B1>region A-B1>region B2 is established on the interface of the insulating layer 97 on the lower electrode 91.

For example, as in the solid-state imaging device 1 according to the first embodiment, in the case where signal charges generated in the photoelectric conversion layer 12 through photoelectric conversion are accumulated at the interface of the insulating layer 27 on the accumulation electrode 21B, the signal charges accumulated in a region remote from the readout electrode 21A coupled with a floating diffusion FD1 move a long distance during charge transfer and charge reset. Therefore, the time for transfer and reset is long. This may make it difficult to achieve high-speed driving.

In contrast, in this embodiment, the accumulation electrode is divided into, for example, two segments, as described above, and a voltage larger than that applied to the accumulation electrode 91B2 is applied to the accumulation electrode 91B1 adjacent to the readout electrode 91A. A potential gradient is thereby formed on the interfaces of the insulating layer 97 with the accumulation electrode 91B1 and the accumulation electrode 91B2. Furthermore, the interface of the insulating layer 97 in the region between the readout electrode 91A and the accumulation electrode 91B1 has a potential barrier larger than that on the accumulation electrode 91B2 and smaller than that on the accumulation electrode 91B1. In this way, the signal charges photoelectrically converted at a photoelectric conversion layer 92 on the accumulation electrode 91B2 (region B2) move to and are accumulated on the accumulation electrode 91B1 (region B1) due to the potential gradient. Therefore, by establishing the above-described the electric potential relationship during the charge non-accumulation period, it is possible to enhance the afterimage characteristics, as in the first embodiment. Furthermore, by establishing the above-described relationship of the electric potentials in the charge accumulation period, it is possible to enhance the transfer efficiency of the charges during the charge readout without reducing the sensitivity.

Note that the electric potential relationship of the respective regions on the lower electrode 91 may be established during one or both of the charge non-accumulation period and the charge accumulation period. Furthermore, it is possible to apply the configuration according to this embodiment to a case in which hole are used as the signal charges, besides a case in which electrons are used as the signal charges. In such a case, the negative and positive signs of the voltages applied to the respective electrodes 91A, 91B1, and 91B2 only have to be inverted.

Moreover, the solid-state imaging device 8A according to this embodiment may have the following configuration.

FIG. 31 schematically illustrates a cross-sectional configuration of a main part of a solid-state imaging device (solid-state imaging device 8B) according to a seventh embodiment of the disclosure. The solid-state imaging device 8B, similar to the solid-state imaging device 2 described above in the modification example, includes a discharge electrode 91D that discharges signal charges accumulated during a charge non-accumulation period. That is, a lower electrode of the solid-state imaging device 8B includes four electrodes: a readout electrode 91A, two accumulation electrodes 91B1 and 91B2, and a discharge electrode 91D.

FIG. 32A illustrates an electric potential during the charge accumulation period, and FIG. 32B an electric potential during the charge non-accumulation period, on the lower electrode 91 side of the solid-state imaging device 8B. For the voltages applied to the accumulation electrode 91B1 and the accumulation electrode 91B2 during the charge accumulation period, a voltage larger than that applied to the accumulation electrode 91B2 is applied to the accumulation electrode 91B1 adjacent to the readout electrode 91A, as illustrated in FIG. 32A, similar to that of the solid-state imaging device 8A. That is, an electric potential relationship region B1>region A-B1>region B2 is established on the interface of the insulating layer 97 on the lower electrode 91. In this way, signal charges are accumulated on the accumulation electrode 91B1. The transfer efficiency of the signal charges thereby increases during the readout.

In contrast, during the charge non-accumulation period, a voltage larger than that applied to the accumulation electrode 91B is applied to the accumulation electrode 91B2 adjacent to the discharge electrode 91D. Furthermore, the interface of the insulating layer 97 between the discharge electrode 91D and the accumulation electrode 91B2 has a potential barrier larger than that on the accumulation electrode 91B1 and smaller than that on the accumulation electrode 91B2. That is, an electric potential relationship region B2>region D-B2>region B1 is established on the interface of the insulating layer 97 on the lower electrode 91. In this way, signal charges are accumulated on the accumulation electrode 91B2 side during the charge non-accumulation period. The discharge efficiency of the signal charges at the reset timing is thereby increased.

FIG. 33 schematically illustrates an example of a cross-sectional configuration of a main part of a solid-state imaging device (solid-state imaging device 8C) according to a seventh embodiment of the disclosure. In the solid-state imaging device 8C, an accumulation electrode 91B is divided into three segments. In this way, the accumulation electrode 91B may be divided into three or more segments. Note that, in the solid-state imaging device 8C, the voltages applied to accumulation electrodes 91B1, 91B2, and 91B3 increasing as the distance to the readout electrode 91A decreases. That is, it is desirable that voltages be applied such that the relationship of the electric potentials of the interface of the insulating layer 97 on the lower electrode 91 is established to be the accumulation electrode 91B1>the accumulation electrode 91B2>the accumulation electrode 91B3. Thus, it is possible to enhance the afterimage characteristics during the charge non-accumulation period, as in the first embodiment. Furthermore, in the charge accumulation period, it is possible to increase the transfer efficiency of the charges during the charge readout without reducing the sensitivity.

FIG. 34 schematically illustrates an example of a cross-sectional configuration of a main part of a solid-state imaging device (solid-state imaging device 8D) according to a seventh embodiment of the disclosure. The solid-state imaging device 8D includes a barrier adjustment electrode 91C disposed between a readout electrode 91A and an accumulation electrode 91B1. The solid-state imaging device 8D is a combination of the above-described solid-state imaging device 1 and the above-described solid-state imaging device 8A. FIG. 35 schematically illustrates an example of a cross-sectional configuration of a main part of a solid-state imaging device (solid-state imaging device 8E) according to a seventh embodiment of the disclosure. The solid-state imaging device 8E includes a barrier adjustment electrode 91C disposed between a discharge electrode 91D and an accumulation electrode 91B2. The solid-state imaging device 8E is a combination of the above-described solid-state imaging device 2 and the above-described solid-state imaging device 8A. The solid-state imaging device 8E has such a configuration and applies a predetermined voltage to the barrier adjustment electrode 91C during a non-accumulation period. The solid-state imaging device 8E is thereby able to actively discharge signal charges accumulated during the charge non-accumulation period. Therefore, it is possible to further enhance the afterimage characteristics.

9. Application Examples

Application Example 1

FIG. 36 illustrates an overall configuration of a solid-state imaging device (for example, a solid-state imaging device 1) according to an above-described embodiment. The solid-state imaging device 1 is a CMOS image sensor. The solid-state imaging device 1 includes a semiconductor substrate 10 on which a pixel section 1a serving as an imaging area is disposed. The solid-state imaging device 1 also includes a peripheral circuit unit 130 in a peripheral region of the pixel section 1a. The peripheral circuit unit 130 includes, for example, a row scanner 131, a horizontal selector 133, a column scanner 134, and a system controller 132.

The pixel section 1a includes, for example, multiple unit pixels P arranged in a two-dimensional matrix. In the unit pixels P, for example, each pixel row is coupled with a pixel driving line Lread (specifically, a row selection line and a reset control line), and each pixel column is coupled with a vertical signal line Lsig. The pixel driving line Lread transfers a drive signal for signal readout from a pixel. One end of the pixel driving line Lread is coupled with an output terminal corresponding to each row of the row scanner 131.

The row scanner 131 includes a shift register, an address decoder, etc. The row scanner 131 is a pixel driver that drives the unit pixels P of the pixel section 1a in, for example, row units. A signal outputted from each unit pixel P of a pixel row selectively scanned by the row scanner 131 is fed to the horizontal selector 133 through the corresponding vertical signal line Lsig. The horizontal selector 133 includes an amplifier, a horizontal selection switch for each vertical signal line Lsig, etc.

The column scanner 134 includes a shift register, an address decoder, etc. The column scanner 134 scans and drives every horizontal selector switch of the horizontal selector 133 in a sequential order. Through selective scanning by the column scanner 134, the signals of the pixels transmitted through the vertical signal lines Lsig are sequentially output to horizontal signal lines 135 and transmitted to an external unit of the semiconductor substrate 10 via the horizontal signal lines 135.

The circuitry section including the row scanner 131, the horizontal selector 133, the column scanner 134, and the horizontal signal lines 135 may be directly disposed on the semiconductor substrate 10 or disposed on an external control IC. Furthermore, the circuitry section may be formed on another substrate coupled via a cable or the like.

The system controller 132 receives a clock signal, data instructing the operation mode, etc., from an external unit of the semiconductor substrate 10, and also outputs data on internal information of the solid-state imaging device 1, etc. The system controller 132 further includes a timing generator that generates various timing signals. The system controller 132 performs drive control of the peripheral circuits, such as the row scanner 131, the horizontal selector 133, and the column scanner 134, on the basis of the various timing signals generated by the timing generator.

A pixel region 211 corresponds to the pixel section 1a. A control circuit 212 is provided with, for example, the row scanner 131, the system controller 132, etc. A logic circuit 223 is provided with, for example, the peripheral circuit unit 130 and the horizontal selector 133.

Application Example 2

It is possible to apply the solid-state imaging device 1, etc., to any type of electronic apparatus having an imaging function, such as a camera system of a digital still camera or a video camera, or a mobile phone having an imaging function. FIG. 37 is a schematic view of the configuration of an example of an electronic apparatus 9 (camera). The electronic apparatus 9 is, for example, a video camera capable of imaging of still mages or moving images. The electronic apparatus 9 includes the solid-state imaging device 1, an optical system (optical lens) 310, a shutter device 311, a driver 313 that drives the solid-state imaging device 1 and the shutter device 311, and a signal processor 312.

The optical system 310 guides image light (incident light) from an object to the pixel section 1a of the solid-state imaging device 1. The optical system 310 may include a plurality of optical lenses. The shutter device 311 controls a light irradiation period and a light shielding period of the solid-state imaging device 1. The driver 313 controls the transfer operation of the solid-state imaging device 1 and the shutter operation of the shutter device 311. The signal processor 312 performs various types of signal processing on the signals output from the solid-state imaging device 1. An image signal Dout acquired after signal processing is stored in a storage medium, such as a memory, or output to a monitor or the like.

Application Example 3

Application Example to In-Vivo Information Acquisition System

Furthermore, the technology according to the present disclosure (present technology) can be applied to various products. For example, the technology according to the present disclosure may be applied to an endoscopic surgery system.

FIG. 38 is a block diagram depicting an example of a schematic configuration of an in-vivo information acquisition system of a patient using a capsule type endoscope, to which the technology according to an embodiment of the present disclosure (present technology) can be applied.

The in-vivo information acquisition system 10001 includes a capsule type endoscope 10100 and an external controlling apparatus 10200.

The capsule type endoscope 10100 is swallowed by a patient at the time of inspection. The capsule type endoscope 10100 has an image pickup function and a wireless communication function and successively picks up an image of the inside of an organ such as the stomach or an intestine (hereinafter referred to as in-vivo image) at predetermined intervals while it moves inside of the organ by peristaltic motion for a period of time until it is naturally discharged from the patient. Then, the capsule type endoscope 10100 successively transmits information of the in-vivo image to the external controlling apparatus 10200 outside the body by wireless transmission.

The external controlling apparatus 10200 integrally controls operation of the in-vivo information acquisition system 10001. Further, the external controlling apparatus 10200 receives information of an in-vivo image transmitted thereto from the capsule type endoscope 10100 and generates image data for displaying the in-vivo image on a display apparatus (not depicted) on the basis of the received information of the in-vivo image.

In the in-vivo information acquisition system 10001, an in-vivo image imaged a state of the inside of the body of a patient can be acquired at any time in this manner for a period of time until the capsule type endoscope 10100 is discharged after it is swallowed.

A configuration and functions of the capsule type endoscope 10100 and the external controlling apparatus 10200 are described in more detail below.

The capsule type endoscope 10100 includes a housing 10101 of the capsule type, in which a light source unit 10111, an image pickup unit 10112, an image processing unit 10113, a wireless communication unit 10114, a power feeding unit 10115, a power supply unit 10116 and a control unit 10117 are accommodated.

The light source unit 10111 includes a light source such as, for example, a light emitting diode (LED) and irradiates light on an image pickup field-of-view of the image pickup unit 10112.

The image pickup unit 10112 includes an image pickup element and an optical system including a plurality of lenses provided at a preceding stage to the image pickup element. Reflected light (hereinafter referred to as observation light) of light irradiated on a body tissue which is an observation target is condensed by the optical system and introduced into the image pickup element. In the image pickup unit 10112, the incident observation light is photoelectrically converted by the image pickup element, by which an image signal corresponding to the observation light is generated. The image signal generated by the image pickup unit 10112 is provided to the image processing unit 10113.

The image processing unit 10113 includes a processor such as a central processing unit (CPU) or a graphics processing unit (GPU) and performs various signal processes for an image signal generated by the image pickup unit 10112. The image processing unit 10113 provides the image signal for which the signal processes have been performed thereby as RAW data to the wireless communication unit 10114.

The wireless communication unit 10114 performs a predetermined process such as a modulation process for the image signal for which the signal processes have been performed by the image processing unit 10113 and transmits the resulting image signal to the external controlling apparatus 10200 through an antenna 10114A. Further, the wireless communication unit 10114 receives a control signal relating to driving control of the capsule type endoscope 10100 from the external controlling apparatus 10200 through the antenna 10114A. The wireless communication unit 10114 provides the control signal received from the external controlling apparatus 10200 to the control unit 10117.

The power feeding unit 10115 includes an antenna coil for power reception, a power regeneration circuit for regenerating electric power from current generated in the antenna coil, a voltage booster circuit and so forth. The power feeding unit 10115 generates electric power using the principle of non-contact charging.

The power supply unit 10116 includes a secondary battery and stores electric power generated by the power feeding unit 10115. In FIG. 38, in order to avoid complicated illustration, an arrow mark indicative of a supply destination of electric power from the power supply unit 10116 and so forth are omitted. However, electric power stored in the power supply unit 10116 is supplied to and can be used to drive the light source unit 10111, the image pickup unit 10112, the image processing unit 10113, the wireless communication unit 10114 and the control unit 10117.

The control unit 10117 includes a processor such as a CPU and suitably controls driving of the light source unit 10111, the image pickup unit 10112, the image processing unit 10113, the wireless communication unit 10114 and the power feeding unit 10115 in accordance with a control signal transmitted thereto from the external controlling apparatus 10200.

The external controlling apparatus 10200 includes a processor such as a CPU or a GPU, a microcomputer, a control board or the like in which a processor and a storage element such as a memory are mixedly incorporated. The external controlling apparatus 10200 transmits a control signal to the control unit 10117 of the capsule type endoscope 10100 through an antenna 10200A to control operation of the capsule type endoscope 10100. In the capsule type endoscope 10100, an irradiation condition of light upon an observation target of the light source unit 10111 can be changed, for example, in accordance with a control signal from the external controlling apparatus 10200. Further, an image pickup condition (for example, a frame rate, an exposure value or the like of the image pickup unit 10112) can be changed in accordance with a control signal from the external controlling apparatus 10200. Further, the substance of processing by the image processing unit 10113 or a condition for transmitting an image signal from the wireless communication unit 10114 (for example, a transmission interval, a transmission image number or the like) may be changed in accordance with a control signal from the external controlling apparatus 10200.

Further, the external controlling apparatus 10200 performs various image processes for an image signal transmitted thereto from the capsule type endoscope 10100 to generate image data for displaying a picked up in-vivo image on the display apparatus. As the image processes, various signal processes can be performed such as, for example, a development process (demosaic process), an image quality improving process (bandwidth enhancement process, a super-resolution process, a noise reduction (NR) process and/or image stabilization process) and/or an enlargement process (electronic zooming process). The external controlling apparatus 10200 controls driving of the display apparatus to cause the display apparatus to display a picked up in-vivo image on the basis of generated image data. Alternatively, the external controlling apparatus 10200 may also control a recording apparatus (not depicted) to record generated image data or control a printing apparatus (not depicted) to output generated image data by printing.

As described above, the example of the in-vivo information acquisition system to which the technology according to the present disclosure has been described. Among the configurations described above, the technology according to the present disclosure may be applied to the image pickup unit 10112. This enhances detection accuracy.

Application Example 4

4. Application Example to Endoscopic Surgery System

The technology according to the present disclosure (present technology) can be applied to various products. For example, the technology according to the present disclosure may be applied to an endoscopic surgery system.

FIG. 21 is a view depicting an example of a schematic configuration of an endoscopic surgery system to which the technology according to an embodiment of the present disclosure (present technology) can be applied.

In FIG. 21, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photoelectrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 40 is a block diagram depicting an example of a functional configuration of the camera head 11102 and the CCU 11201 depicted in FIG. 39.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

As described above, the example of the endoscopic surgery system to which the technology according to the present disclosure has been described. Among the configurations described above, the technology according to the present disclosure may be applied to the image pickup unit 11402. Applying the technology according to the present disclosure to the image pickup unit 11402 makes it possible to enhance detection accuracy.

Note that the endoscopic surgery system has been described as an example hereinabove. However, the technology according to the present disclosure may be applied to other systems, such as a microsurgery system, for example.

Application Example 5

Application Example to Mobile Body

The technology according to an embodiment of the present disclosure is applicable to various products. For example, the technology according to an embodiment of the present disclosure may be achieved in the form of an apparatus to be mounted to a mobile body of any kind. Non-limiting examples of the mobile body may include an automobile, an electric vehicle, a hybrid electric vehicle, a motorcycle, a bicycle, any personal mobility device, an airplane, an aerial vehicle, a drone, a vessel, a robot, a construction machine, and an agricultural machine (tractor).

FIG. 41 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 41, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound or an image to an output device capable of visually or auditorily notifying information to an occupant of the vehicle or the outside of the vehicle. In the example of FIG. 41, an audio speaker 12061, a display section 12062, and an instrument panel 12063 are illustrated as the output device. The display section 12062 may, for example, include at least one of an on-board display or a head-up display.

FIG. 42 is a diagram depicting an example of the installation position of the imaging section 12031.

In FIG. 42, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 42 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

Although the technology has been described with reference to the first to third embodiments, the modification examples 1 to 6, and the application examples, the content of the technology is not limited to the embodiments, etc., described above and is modifiable in a variety of ways. For example, the first embodiment includes a laminate of an organic photoelectric transducer 20 and inorganic photoelectric transducers 12B and 12R, as photoelectric transducers. The organic photoelectric transducer 20 detects green light. The inorganic photoelectric transducers 12B and 12R respectively detect blue light and red light. The content of the disclosure, however, is not limited to such a structure. That is, an organic photoelectric transducer may detect red light or blue light, and an inorganic photoelectric transducer detect green light.

Furthermore, in the above-described embodiments, etc., the configuration of a back-surface emission type solid-state imaging device 1 is described as an example. It is also possible to apply the embodiments, etc., to a front-surface emission type solid-state imaging device. Furthermore, a laminate type solid-state imaging device (one having a photoelectric conversion layer on a semiconductor substrate) may be of a vertical-direction spectroscopic type as described in the above-described embodiments, or may include imaging devices of multiple colors that are two-dimensional arranged (for example, in Bayer layout). Furthermore, for example, a substrate provided with another functional device, such as a memory device, may be stacked on the multilayer wiring side.

Furthermore, the number of the organic photoelectric transducers and inorganic photoelectric transducers and the ratio thereof are not limited. Two or more organic photoelectric transducers may be provided. Alternatively, only organic photoelectric transducers may be provided to acquire color signals of multiple colors. Furthermore, the solid-state imaging device according to the disclosure may not include all components described above in the embodiments, etc. The solid-state imaging device may further include other layers.

Furthermore, it is possible to apply the technology according to the disclosure to, for example, a photovoltaic cell, besides a solid-state imaging device.

The effects described in the specification are mere examples and are not limited, and other effects may be achieved.

Note that the disclosure may have the following configuration.

(1) A solid-state imaging device including:
a first electrode including a plurality of electrodes independent from each other;
a second electrode disposed opposite to the first electrode;
a photoelectric conversion layer disposed between the first electrode and the second electrode; and
a voltage applier that applies different voltages during a charge accumulation period and a charge non-accumulation period to at least one of the first electrode or the second electrode.

(2) The solid-state imaging device according to (1), in which the first electrode includes the plurality of electrodes including a charge readout electrode, an accumulation electrode, and a discharge electrode.

(3) The solid-state imaging device according to (2), in which the first electrode further includes a first barrier adjustment electrode disposed between the discharge electrode and the accumulation electrode, the first barrier adjustment electrode adjusting a voltage across the discharge electrode and the accumulation electrode.

(4) The solid-state imaging device according to (2) or (3), in which the first electrode further includes a second barrier adjustment electrode disposed on a side of the discharge electrode opposite to the accumulation electrode, the second barrier adjustment electrode adjusting a voltage across the discharge electrode and the accumulation electrode.

(5) The solid-state imaging device according to any one of (2) to (4), in which the voltage across the discharge electrode and the accumulation electrode is larger during the charge non-accumulation period than during the charge accumulation period.

(6) The solid-state imaging device according to any one of (2) to (5), in which a potential difference between the accumulation electrode and the second electrode is larger during the charge non-accumulation period than during the charge accumulation period.

(7) The solid-state imaging device according to any one of (2) to (6), in which the charge readout electrode also serves as the discharge electrode.

(8) The solid-state imaging device according to any one of (2) to (7), in which the accumulation electrode is divided into a plurality of segments, each segment receiving a different voltage.

(9) The solid-state imaging device according to any one of (2) to (8), further including:
an insulating layer disposed between the first electrode and the photoelectric conversion layer, in which the charge readout electrode and the discharge electrode are electrically coupled with the photoelectric conversion layer via an opening provided in the insulating layer.

(10) The solid-state imaging device according to (9), further including:

a semiconductor layer disposed between the photoelectric conversion layer and the insulating layer, in which the charge readout electrode is electrically coupled with the photoelectric conversion layer via the semiconductor layer.

(11) The solid-state imaging device according to any one of (1) to (10), in which the plurality of electrodes each receive a separate voltage.

(12) The solid-state imaging device according to any one of (1) to (11), in which an organic photoelectric transducer and at least one inorganic photoelectric transducer are stacked on each other, the organic photoelectric transducer including at least one photoelectric conversion layer, the inorganic photoelectric transducer performing photoelectric conversion in a different wavelength band from the organic photoelectric transducer.

(13) The solid-state imaging device according to (12), in which, the inorganic photoelectric transducer is buried in the semiconductor substrate, and the organic photoelectric transducer is formed on a first surface side of the semiconductor substrate.

(14) The solid-state imaging device according to (13), in which a multilayer wiring layer is formed on a second surface side of the semiconductor substrate.

(15) A method of controlling a solid-state imaging device, including:

applying different voltages to at least one of a first electrode or a second electrode during a charge accumulation period and a charge non-accumulation period, the first electrode including a plurality of electrodes independent from each other, the second electrode disposed opposite to the first electrode with a photoelectric conversion layer disposed between the first electrode and the second electrode.

(16) The method of controlling a solid-state imaging device according to (15), in which the first electrode includes a charge readout electrode, an accumulation electrode, a discharge electrode, and a first barrier adjustment electrode, the first barrier adjustment electrode being disposed between the discharge electrode and the accumulation electrode, and a voltage is applied to the first barrier adjustment electrode during the charge non-accumulation period to cause a voltage across the discharge electrode and the accumulation electrode to be larger during the charge non-accumulation period than during the charge accumulation period.

(17) The method of controlling the solid-state imaging device according to (16), in which a reset voltage applied at a shutter timing after the charge accumulation period is larger than the reset voltage applied at a shutter timing before the charge accumulation period.

(18) The method of controlling the solid-state imaging device according to (16) or (17), in which:

a voltage is applied to the second electrode during the charge non-accumulation period, and a potential difference between the accumulation electrode and the second electrode is larger during the charge non-accumulation period than during the charge accumulation period.

(19) The method of controlling a solid-state imaging device according to any one of (16) to (18), in which charges accumulated on the accumulation electrode are discharged from the discharge electrode in several batches during the charge non-accumulation period.

(20) The method of controlling a solid-state imaging device according to any one of (15) to (19), in which a gate of a reset transistor is always turned on during the charge non-accumulation period.

This application claims priority on the basis of Japanese Patent Application No. 2017-167852 filed with the Japan Patent Office on Aug. 31, 2017, the entire content of which is hereby incorporated by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A solid-state imaging device, comprising:
a first electrode including a plurality of electrodes, wherein the plurality of electrodes includes a charge readout electrode, an accumulation electrode, and a discharge electrode;
a second electrode opposite to the first electrode;
a photoelectric conversion layer between the first electrode and the second electrode; and
a voltage applier configured to apply, to at least one of the first electrode or the second electrode, a first voltage during a charge accumulation period and a second voltage during a charge non-accumulation period, wherein the first voltage is different from the second voltage.

2. The solid-state imaging device according to claim 1, wherein
the first electrode further includes a first barrier adjustment electrode between the discharge electrode and the accumulation electrode, and
the first barrier adjustment electrode is configured to adjust a voltage across the discharge electrode and the accumulation electrode.

3. The solid-state imaging device according to claim 1, wherein
the first electrode further includes a second barrier adjustment electrode on a side of the discharge electrode opposite to the accumulation electrode, and
the second barrier adjustment electrode is configured to adjust a voltage across the discharge electrode and the accumulation electrode.

4. The solid-state imaging device according to claim 1, wherein a voltage across the discharge electrode and the accumulation electrode is larger during the charge non-accumulation period than during the charge accumulation period.

5. The solid-state imaging device according to claim 1, wherein a potential difference between the accumulation electrode and the second electrode is larger during the charge non-accumulation period than during the charge accumulation period.

6. The solid-state imaging device according to claim 1, wherein the charge readout electrode also serves as the discharge electrode.

7. The solid-state imaging device according to claim 1, wherein
the accumulation electrode includes a plurality of segments,
a first segment of the plurality of segments is configured to receive a third voltage, and a second segment of the plurality of segments is configured to receive a fourth voltage different from the third voltage.

8. The solid-state imaging device according to claim 1, further comprising an insulating layer between the first electrode and the photoelectric conversion layer, wherein the charge readout electrode and the discharge electrode are electrically coupled with the photoelectric conversion layer via an opening in the insulating layer.

9. The solid-state imaging device according to claim 8, further comprising a semiconductor layer between the photoelectric conversion layer and the insulating layer, wherein the charge readout electrode is electrically coupled with the photoelectric conversion layer via the semiconductor layer.

10. The solid-state imaging device according to claim 1, wherein each of the plurality of electrodes is configured to receive a separate voltage.

11. The solid-state imaging device according to claim 1, further comprising:
an inorganic photoelectric transducer; and
an organic photoelectric transducer on the inorganic photoelectric transducer, wherein
the organic photoelectric transducer includes the photoelectric conversion layer, and
the inorganic photoelectric transducer is configured to perform photoelectric conversion in a different wavelength band from the organic photoelectric transducer.

12. The solid-state imaging device according to claim 11, further comprising a semiconductor substrate, wherein
the inorganic photoelectric transducer is in the semiconductor substrate, and
the organic photoelectric transducer is on a first surface side of the semiconductor substrate.

13. The solid-state imaging device according to claim 12, wherein a multilayer wiring layer is on a second surface side of the semiconductor substrate.

14. A method of controlling a solid-state imaging device, the method comprising:
applying, to at least one of a first electrode of the solid-state imaging device or a second electrode of the solid-state imaging device, a first voltage during a charge accumulation period and a second voltage during a charge non-accumulation period, wherein
the first voltage is different from the second voltage,
the first electrode includes a plurality of electrodes,
the plurality of electrodes includes a charge readout electrode, an accumulation electrode, and a discharge electrode,
the second electrode is opposite to the first electrode, and
a photoelectric conversion layer is between the first electrode and the second electrode.

15. The method of controlling the solid-state imaging device according to claim 14, wherein
the first electrode further includes a first barrier adjustment electrode between the discharge electrode and the accumulation electrode, and
a voltage is applied to the first barrier adjustment electrode during the charge non-accumulation period to cause a voltage across the discharge electrode and the accumulation electrode to be larger during the charge non-accumulation period than during the charge accumulation period.

16. The method of controlling the solid-state imaging device according to claim 15, wherein a first reset voltage applied at a first shutter timing after the charge accumulation period is larger than a second reset voltage applied at a second shutter timing before the charge accumulation period.

17. The method of controlling the solid-state imaging device according to claim 15, wherein
the second voltage is applied to the second electrode during the charge non-accumulation period, and
a potential difference between the accumulation electrode and the second electrode is larger during the charge non-accumulation period than during the charge accumulation period.

18. The method of controlling the solid-state imaging device according to claim 15, wherein charges accumulated on the accumulation electrode are discharged from the discharge electrode in several batches during the charge non-accumulation period.

19. The method of controlling the solid-state imaging device according to claim 14, wherein a gate of a reset transistor of the solid-state imaging device is always turned on during the charge non-accumulation period.

20. A solid-state imaging device, comprising:
a first electrode including a plurality of electrodes;
a second electrode opposite to the first electrode;
a photoelectric conversion layer between the first electrode and the second electrode;
a voltage applier configured to apply, to at least one of the first electrode or the second electrode, a first voltage during a charge accumulation period and a second voltage during a charge non-accumulation period, wherein the first voltage is different from the second voltage;
a semiconductor substrate;
an inorganic photoelectric transducer in the semiconductor substrate; and
an organic photoelectric transducer on the inorganic photoelectric transducer and a surface side of the semiconductor substrate, wherein
the organic photoelectric transducer includes the photoelectric conversion layer, and
the inorganic photoelectric transducer is configured to perform photoelectric conversion in a different wavelength band from the organic photoelectric transducer.

* * * * *